US012713866B2

(12) United States Patent
Sreenivasan et al.

(10) Patent No.: US 12,713,866 B2
(45) Date of Patent: Aug. 18, 2026

(54) EQUIPMENT AND PROCESS TECHNOLOGIES FOR CATALYST INFLUENCED CHEMICAL ETCHING

(71) Applicant: Board of Regents, The University of Texas System, Austin, TX (US)

(72) Inventors: Sidlgata V. Sreenivasan, Austin, TX (US); Akhila Mallavarapu, Philadelphia, PA (US); Paras Ajay, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 314 days.

(21) Appl. No.: 18/034,611

(22) PCT Filed: Oct. 29, 2021

(86) PCT No.: PCT/US2021/057461
§ 371 (c)(1),
(2) Date: Apr. 28, 2023

(87) PCT Pub. No.: WO2022/094350
PCT Pub. Date: May 5, 2022

(65) Prior Publication Data

US 2023/0411178 A1 Dec. 21, 2023

Related U.S. Application Data

(60) Provisional application No. 63/107,354, filed on Oct. 29, 2020.

(51) Int. Cl.
*H10P 72/00* (2026.01)
*H10P 50/64* (2026.01)
(Continued)

(52) U.S. Cl.
CPC ........ *H10P 72/0424* (2026.01); *H10P 50/642* (2026.01); *H10P 50/644* (2026.01);
(Continued)

(58) Field of Classification Search
None
See application file for complete search history.

(56) References Cited

U.S. PATENT DOCUMENTS 5,926,690 A 7/1999 Toprac et al.
10,354,883 B2 * 7/2019 Yang ................ H01L 21/76826
(Continued)

FOREIGN PATENT DOCUMENTS

JP H 10-308381 A 11/1998
JP 2000-164564 A 6/2000
(Continued)

OTHER PUBLICATIONS

Notice of Reasons for Refusal for Japanese Patent Application No. 2023-526380 dated Jun. 19, 2025, pp. 1-3.
(Continued)

*Primary Examiner* — Shamim Ahmed
(74) *Attorney, Agent, or Firm* — Robert A. Voigt, Jr.; Shackelford, Mckinley & Norton, LLP

(57) ABSTRACT

A method and system for etching a semiconductor substrate using catalyst influenced chemical etching. A group of independently controlled discrete actuators are configured to control a depth of an etch of a material on a substrate, where at least two of the group of independently controlled discrete actuators has distinct actuation values. Furthermore, the etch depth has a variation of less than 10% of a feature height across the substrate.

4 Claims, 54 Drawing Sheets

(51) Int. Cl.
*H10B 12/00* (2023.01)
*H10D 84/01* (2025.01)
*H10D 84/03* (2025.01)

(52) U.S. Cl.
CPC .......... *H10P 72/0421* (2026.01); *H10B 12/00* (2023.02); *H10D 84/0158* (2025.01); *H10D 84/038* (2025.01)

(56) References Cited

U.S. PATENT DOCUMENTS

| | | | |
|---|---|---|---|
| 10,403,491 B2* | 9/2019 | Mizutani | H01L 21/02071 |
| 10,497,559 B2* | 12/2019 | Lee | B08B 3/10 |
| 2008/0020573 A1 | 1/2008 | Birkmeyer et al. | |
| 2011/0186545 A1 | 8/2011 | Mahadeswaraswamy et al. | |
| 2015/0214474 A1 | 7/2015 | Nishimura et al. | |
| 2017/0243751 A1* | 8/2017 | Li | H01L 21/0475 |
| 2020/0319556 A1* | 10/2020 | Wang | G03F 7/2006 |

FOREIGN PATENT DOCUMENTS

| | | | |
|---|---|---|---|
| JP | 2003-524898 | A | 8/2003 |
| JP | 2012-195325 | A | 10/2012 |
| JP | 2013-519192 | A | 5/2013 |
| JP | 2013-211580 | A | 10/2013 |
| KR | 10-2012-0130175 | A | 11/2012 |
| KR | 10-2020-0090237 | A | 7/2020 |
| WO | 2019108366 | A1 | 6/2019 |
| WO | 2020044927 | A1 | 3/2020 |
| WO | 2020176425 | A1 | 9/2020 |

OTHER PUBLICATIONS

Extended European Search Report for European Patent Application No. 21 887 681.1 dated Aug. 20, 2024, pp. 1-8.
Rao et al., "Mechanical Design Optimization Using Advanced Optimization Techniques," Springer Science & Business Media, See Chapters 3 and 7, 2012, pp. 35-67 and 195-229.
Vijay K. Stokes, "Joining Methods for Plastics and Plastic Composites: An Overview," Polymer Engineering and Science, Mid-Oct. 1989, vol. 29, No. 19, pp. 1310-1324.
Ohn F. Wendt (Editor), "Computational Fluid Dynamics: An Introduction," Springer Science & Business Media, 2008, See Chapters 10 and 11, pp. 235-301.
Erik Dick, "Fundamentals of Turbomachines," Springer, vol. 109, 2015, pp. 1-564.
Backes et al., "Temperature Dependent Pore Formation in Metal Assisted Chemical Etching of Silicon," ECS Journal of Solid State Science and Technology, vol. 5, No. 12, 2016, pp. 653-656.
Gawlik et al., "Hyperspectral Imaging for High-Throughput, Spatially Resolved Spectroscopic Scatterometry of Silicon Nanopillar Arrays," Optics Express, vol. 28, No. 10, 2020, pp. 14209-14221.
Choi et al., "Note: Near Infrared Interferometric Silicon Wafer Metrology," Review of Scientific Instruments, vol. 87, 2016, pp. 1-3.
Francis J. Disalvo, "Thermoelectric Cooling and Power Generation," Science, vol. 285, Jul. 30, 1999, pp. 703-706.
Hiura et al., "Overlay Improvements Using a Novel High Order Distortion Correction System for NIL High Volume Manufacturing," Novel Patterning Technologies, vol. 10584, International Society for Optics and Photonics, 2018, pp. 1-8.
Li et al., "Bubble-Regulated Silicon Nanowire Synthesis on Micro-Structured Surfaces by Metal-Assisted Chemical Etching," Langmuir, vol. 31, No. 44, Nov. 10, 2015, pp. 12291-12299.
Lianto et al., "Vertical Etching with Isolated Catalysts in Metal-Assisted Chemical Etching of Silicon," Nanoscale, vol. 4, No. 23, Dec. 7, 2012, pp. 7532-7539.
Weisse et al., "Electroassited Transfer of Vertical Silicon Wire Arrays Using a Sacrificial Porous Silicon Layer," Nano Letters, No. 9, Sep. 11, 2013, pp. 4362-4368.
Volker Lehmann, "Electrochemistry of Silicon: Instrumentation, Science, Materials and Applications," 2002, See Chapters 4 and 7, pp. 51-75 and 127-166.
Tendero et al. "Atmospheric Pressure Plasmas: A Review," Spectrochimica Acta Part B: Atomic Spectroscopy, vol. 61, No. 1, 2006, pp. 2-30.
Mallavarapu et al., "Ruthenium-Assisted Chemical Etching of Silicon: Enabling CMOS-Compatible 3D Semiconductor Device Nanofabrication," ACS Applied Materials & Interfaces, vol. 13, No. 1, 2021, pp. 1169-1177.
Romano et al., "Metal Assisted Chemical Etching of Silicon in the Gas Phase: A Nanofabrication Platform for X-Ray Optics," Nanoscale Horizons, vol. 5, No. 5, 200, pp. 869-879.
Mallavarapu et al., "Enabling Ultra-High Aspect Ratio Silicon Nanowires Using Precise Experiments for Detecting Onset of Collapse," Nano Letters, vol. 20, No. 11, 2020, pp. 7896-7905.
Khorasaninejad et al., "Bunching Characteristics of Silicon Nanowire Arrays," Journal of Applied Physics, vol. 111, No. 4, 2012, pp. 1-5.
Glassmaker et al., "Design of Biomimetic Fibrillar Interfaces: 1. Making Contact," Journal of the Royal Society Interface, vol. 1, 2004, pp. 23-33.
Wong et al., "Wafer Temperature Dependence of the Vapor-Phase HF Oxide Etch." Journal of the Electrochemical Society, vol. 140, No. 1, 1993, pp. 205-208.
Kim et al., "Scaling the Aspect Ratio of Nanoscale Closely Packed Silicon Vias by MacEtch: Kinetics of Carrier Generation and Mass Transport." Advanced Functional Materials, vol. 27, 2017, pp. 1-8.
International Search Report for International Application No. PCT/US2021/057461 dated Mar. 8, 2022, pp. 1-5.
Written Opinion of the International Searching Authority for International Application No. PCT/US2021/057461 dated Mar. 8, 2022, pp. 1-6.
International Preliminary Report on Patentability for International Application No. PCT/US2021/057461 dated May 11, 2023, pp. 1-8.
Notice of Preliminary Rejection for South Korean Patent Application No. 10-2023-7017084 dated Nov. 20, 2025, pp. 1-6.
Search Report issued by Intellectual Property Office of Singapore for Singapore Patent Application No. 11202303303V dated Jan. 23, 2026, pp. 1-2.
Written Opinion issued by Intellectual Property Office of Singapore for Singapore Patent Application No. 11202303303V dated Jan. 27, 2026, pp. 1-6.

* cited by examiner

5503
$h_c$
$h_0$

5503
NO CATALYST NEAR THE TRANSITION ZONE 5503
5501
CATALYST
5502
BULK SILICON
5504

W
REGION A
REGION B
H
55A to 55C
REGION C
REGION D

5600

EQUIPMENT AND PROCESS TECHNOLOGIES FOR CATALYST INFLUENCED CHEMICAL ETCHING

TECHNICAL FIELD

The present invention relates generally to etching, and more particularly to equipment and process technologies for catalyst influenced chemical etching.

BACKGROUND

In semiconductor device fabrication, etching refers to any technology that will selectively remove material from a thin film on a substrate (with or without prior structures on its surface) and by this removal create a pattern of that material on the substrate. The pattern may be defined by a mask that is resistant to the etching process. Once the mask is in place, etching of the material that is not protected by the mask can occur, by either wet chemical or by "dry" physical methods.

One type of etching is Catalyst Influenced Chemical Etching (CICE), which is a catalyst-based etching method that can be used to fabricate features in semiconductors, such as silicon, germanium, etc., where such features have high aspect ratios, low sidewall taper, low sidewall roughness, and/or controllable porosity. This method is used to create higher density and higher performance Static Random-Access Memory (SRAM) as well as low-loss waveguides.

Unfortunately, there are currently limitations in fabricating features in semiconductors using CICE.

SUMMARY

In one embodiment of the present invention, a system for etching a semiconductor substrate using catalyst influenced chemical etching comprises a group of independently controlled discrete actuators configured to control a depth of an etch of a material on a substrate, where at least two of the group of independently controlled discrete actuators has distinct actuation values, and where the etch depth has a variation of less than 10% of a feature height across the substrate.

In another embodiment of the present invention, a system for etching a semiconducting substrate using catalyst influenced chemical etching comprises a group of discrete actuators configured to control a depth of an etch of a material on a substrate, where the etch is initiated and stopped while resulting in an etch depth variation of less than 10% of a feature height across an entirety of the substrate, and where the substrate has device patterns of type A next to device patterns of type B.

In a further embodiment of the present invention, a method for etching semiconducting material using catalyst influenced chemical etching (CICE) comprises providing semiconducting material and one or more layers of other materials on the semiconducting material, where a catalyst layer is one of the one or more layers of other materials. The method further comprises exposing one or more of the one or more layers of other materials to a process that modifies catalytic activity of the catalyst layer. The method additionally comprises exposing the one or more layers of other materials, including the catalyst layer with the modified catalytic activity, and the semiconducting material to a CICE etchant.

In another embodiment of the present invention, a method for etching semiconducting material using catalyst influenced chemical etching comprises providing a semiconducting material. The method further comprises providing a catalyst layer on a surface of the semiconducting material. The method additionally comprises exposing the catalyst layer and the semiconducting material to an etchant, where a surface area of the catalyst layer exposed to the etchant is optimized to reduce porosity during the catalyst influenced chemical etching.

In a further embodiment of the present invention, a method for preventing substantial collapse of high aspect ratio semiconducting structures by catalyst influenced chemical etching, comprises providing a semiconducting material. The method further comprises patterning a catalyst layer on a surface of the semiconducting material, where the catalyst layer comprises a plurality of features, and where unetched regions of a pattern adjacent to the plurality of features comprises collapse-avoiding features. The method additionally comprises exposing the patterned catalyst layer and the collapse-avoiding features to an etchant, where the patterned catalyst layer and the etchant cause etching of the semiconducting material to form fabricated structures corresponding to the plurality of features, and where the collapse-avoiding features prevent substantial collapse of etched semiconducting material.

In another embodiment of the present invention, a method for preventing substantial collapse of high aspect ratio nanostructures comprises providing a substrate with material to be etched. The method further comprises providing a patterned etch mask on the substrate. The method additionally comprise etching the material to be etched using the patterned etch mask, where a portion of the patterned etch mask prevents substantial collapse of the etched material.

In a further embodiment of the present invention, a method for preventing substantial collapse of high aspect ratio nanostructures comprises providing high aspect ratio nanostructures with collapse-avoiding caps. The method further comprises depositing stabilizing material around a portion of the high aspect ratio nanostructures forming stabilizing material regions. The method additionally comprises removing the collapse-avoiding caps from regions other than the stabilizing material regions.

In another embodiment of the present invention, a method for preventing substantial collapse of high aspect ratio nanostructures comprises providing high aspect ratio nanostructures with collapse-avoiding caps. The method further comprises bonding a material to the collapse-avoiding caps to create a ceiling.

In a further embodiment of the present invention, a method of using catalyst influenced chemical etching (CICE) to form micro- or nanostructures with a tunable etch depth to create structures that are of a pre-determined etch depth in different regions of a semiconductor wafer comprises creating a pre-determined pattern in a material that is resistant to CICE etchant chemistries, where the pre-determined pattern has been created on top of a patterned catalyst.

In another embodiment of the present invention, a method of using catalyst influenced chemical etching (CICE) to form nanostructures with a tunable etch depth to create structures that are of a pre-determined etch depth in different regions of a semiconductor wafer comprises creating a pre-determined temperature-controlled profile on a surface of the semiconductor wafer such that the pre-determined temperature-controlled profile leads to the pre-determined etch depth in different regions of the semiconductor wafer.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
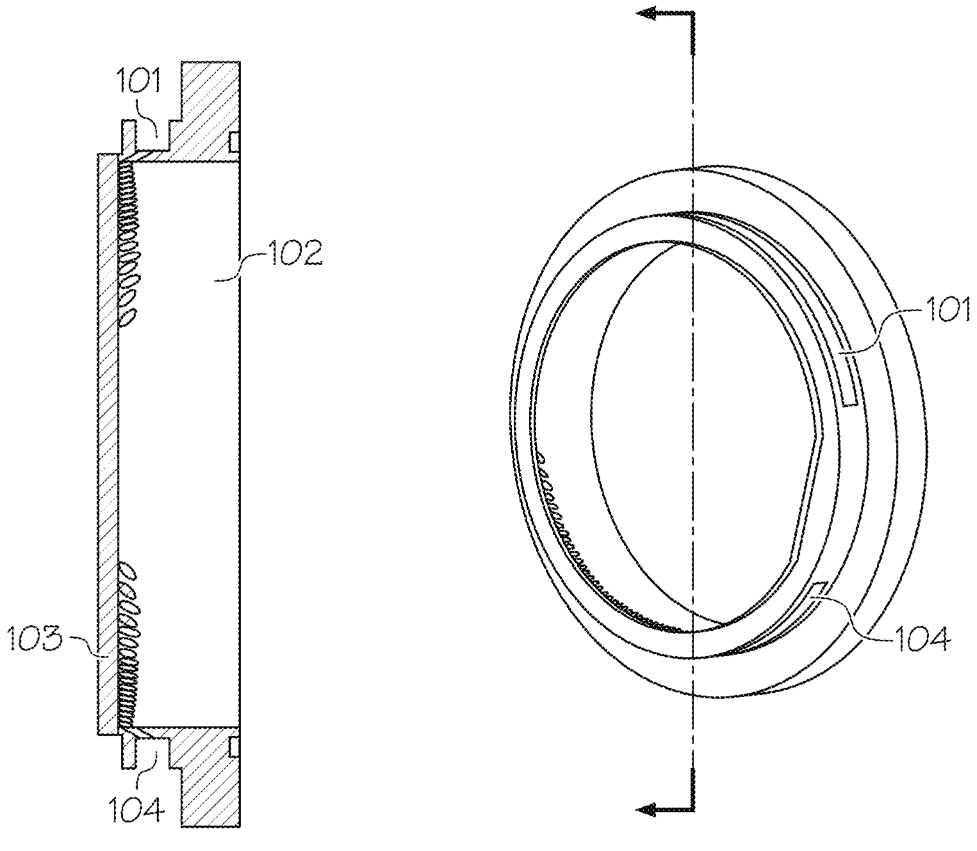
FIG. 1 illustrates an exemplar design for side-to-side etchant flow in accordance with an embodiment of the present invention.

As stated in the Background section, in semiconductor device fabrication, etching refers to any technology that will selectively remove material from a thin film on a substrate (with or without prior structures on its surface) and by this removal create a pattern of that material on the substrate. The pattern may be defined by a mask that is resistant to the etching process. Once the mask is in place, etching of the material that is not protected by the mask can occur, by either wet chemical or by dry physical methods.

One type of etching is Catalyst Influenced Chemical Etching (CICE), which is a catalyst-based etching method that can be used to fabricate features in semiconductors, such as silicon, germanium, etc., where such features have high aspect ratios, low sidewall taper, low sidewall roughness, and/or controllable porosity. This method is used to create higher density and higher performance Static Random-Access Memory (SRAM) as well as low-loss waveguides.

Unfortunately, there are currently limitations in fabricating features in semiconductors using CICE.

The principles of the present invention provide a means for utilizing the CICE process to effectively fabricate features in semiconductors using the equipment and process technologies for catalyst influenced chemical etching of the present invention.

A tool for Catalyst Influenced Chemical Etching (CICE) has the following objective—etching nanoscale features using the CICE process at (or above) a target yield and at (or above) a target throughput. Achieving a target yield further requires the etch height variation to be below a certain fraction of the etch height (for instance, 30% in one embodiment, 20%, 10%, 5%, or lower in other embodiments). Achieving this objective requires several sub-systems and capabilities, including but not limited to, the ability to handle corrosive CICE etchants, while not leaching contaminants (metal or otherwise). Inert polymers, such as PTFE, PFA, HDPE, etc. satisfy this requirement.

Furthermore, the objective requires the ability to handle 300 mm, or larger wafer sizes. This requires automated loading and unloading of 300 mm wafers between internal chambers of the tool and between internal chambers and input/output ports of the tool. Additionally, this also requires tool chambers that are sized to handle 300 mm wafers. Automated wafer handling and tool machining solutions that satisfy these requirements are available. In one embodiment, the process wafer is processed in a vertical configuration, but once the etch is performed, the wafer is swiveled to a horizontal configuration to be handled using, for instance, a SCARA-type robot arm.

Additionally, the objective requires frontside etchant flow control. On the front of the process wafer, where the CICE process takes place, reactants for the CICE process need to be maintained at a uniform concentration throughout the extent of the process wafer, while also ensuring products of the CICE process are continuously removed from the reaction site. Uniform reactant concentration can be maintained by continuous or intermittent etchant circulation, using design features that improve etchant uniformity, and using in-chamber etchant agitation methods that prevent regions of etchant stagnation.

Etchant circulation can be achieved by several methods. For example, in one embodiment, if a peripheral contact is used in the frontside chamber for etchant containment, groups of one or more inlet ports (which could be in the form of nozzles) could be used to introduce etchant into the chamber, and a group of one or more outlet ports could be used to take etchant out of the chamber. In one embodiment, the group of inlet ports and outlet ports are integrally fabricated with the frontside chamber. Computational Fluid Dynamics (CFD) based fluidic simulations, such as discussed in Wendt, John F., ed. Computational Fluid Dynamics: An Introduction. Springer Science & Business Media, 2008, which is incorporated by reference herein in its entirety, along with design optimization techniques, such as discussed in Rao, R. Venkata, and Vimal J. Savsani. Mechanical Design Optimization Using Advanced Optimization Techniques. Springer Science & Business Media, 2012, which is incorporated by reference herein in its entirety, could be used to ensure minimization of flow non-uniformities and stagnation.

Figure 2:
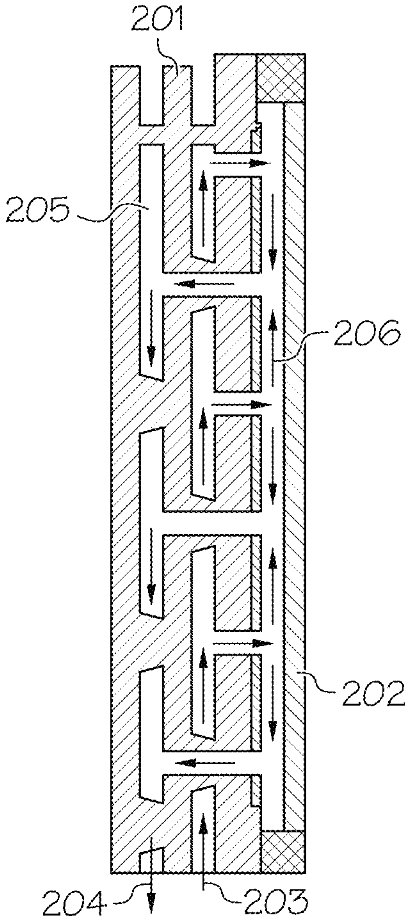
FIG. 2 illustrates an exemplar design for etchant introduction and exit over an entire area of the process wafer in accordance with an embodiment of the present invention.

Referring now to the Figures, FIG. 1 illustrates an exemplar design for side-to-side etchant flow in accordance with an embodiment of the present invention. FIG. 2 illustrates an exemplar design for etchant introduction and exit over an entire area of the process wafer in accordance with an embodiment of the present invention.

As shown in FIG. 1, such a design includes an inlet manifold 101, a process chamber filled with etchant 102, a process wafer 103, and an outlet manifold 104. As shown in FIG. 2, such a design includes a multilayer frontside cover 201, a process wafer 202, an etchant inlet 203, an etchant outlet 204, etch products 205 and local etchant flow direction 206.

Furthermore, as shown in FIG. 1, fluid is introduced and exited from the sides of chamber 102. In FIG. 2, fluid is introduced and exited using inlet and outlet ports 203, 204 placed over the entire extent of the chamber walls. Manufacturing of these designs is possible using standard Computer Numerical Control (CNC) machines. In one embodiment, the multilayer frontside cover (shown in FIG. 2) could be manufactured by bonding of multiple 2-dimensional machined pieces, for instance, using polymer welding of machined PTFE pieces, such as discussed in Stokes, Vijay K. "Joining methods for plastics and plastic composites: an overview," Polymer Engineering & Science, Vol. 29 No. 19, 1989, pp. 1310-1324, which is incorporated by reference herein in its entirety.

Figure 3A:
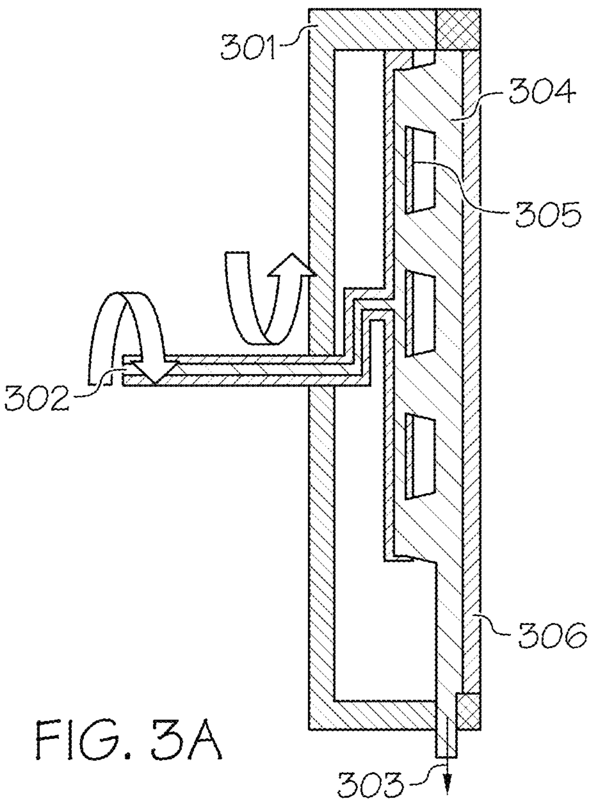
FIGS. 3A-3B illustrate an exemplar spin-spray type etchant flow system with an eccentrically rotating etching spray arm and passive gravity-driven etchant outflow in accordance with an embodiment of the present invention.
Figure 3B:
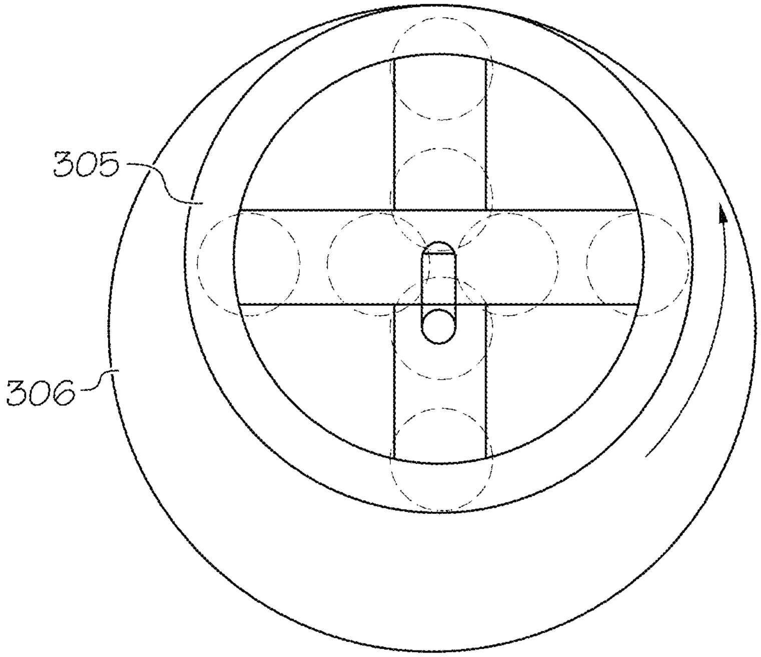

In one embodiment, a spin-spray-type system could be used for frontside etchant delivery and circulation. In one embodiment of the system, a rotating arm is used to dispense the new etchant onto the process wafer, where the process wafer is kept stationary. To remove used etchant from the wafer surface, an active strategy could be used, where a second arm, integrated with the first arm or otherwise, could be used to centrifugally move used etchant out. Alternatively, a passive strategy could be used, where the wafer is kept in a vertical orientation, and the force of gravity is used to draw the used etchant down into a collection chamber. The axes of rotation of the arms could either be fixed or movable, coaxial with the process wafer or eccentric. In a second embodiment, the etchant dispense arm could be fixed, while the process wafer itself is rotated. In all embodiments of spin-spray-type systems, a CICE compatible chamber would enclose the entire frontside of the process wafer, and be used to contain any etchant that is thrown in various directions by the rotating process wafer and/or etchant dispense arms. FIGS. 3A-3B illustrate one of the embodiments described above. Specifically, FIGS. 3A-3B illustrate an exemplar spin-spray type etchant flow system 300 with an eccentrically rotating etching spray arm and passive gravity-driven etchant outflow in accordance with an embodiment of the present invention.

Referring to FIG. 3A, which depicts the side view (cross-section), system 300 includes a frontside cover 301, an etchant inlet 302, an etchant outlet 303, which is gravity driven, etchant 304, an eccentrically rotating etchant spray arm 305 and process wafer 306, which is fixed and vertical. Furthermore, FIG. 3B illustrates the top view, in one embodiment, which depicts the direction of rotation of spray arm 305.

Figure 4:
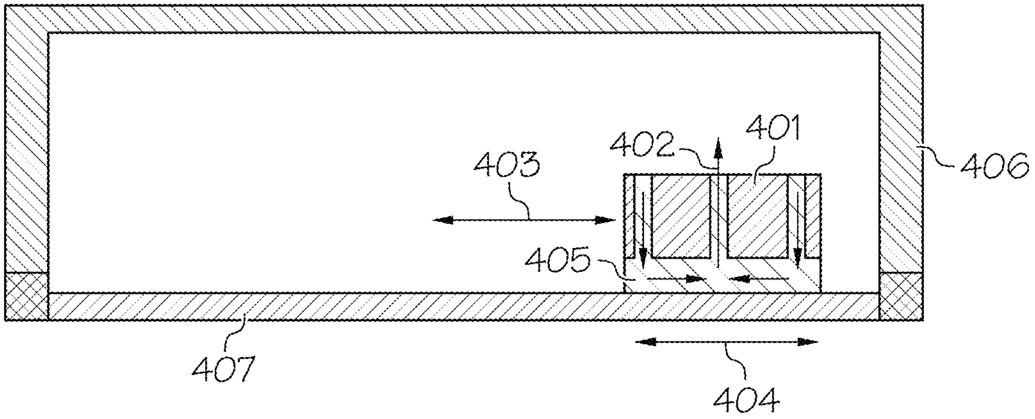
FIG. 4 illustrates an exemplar design with a sliding etch zone in accordance with an embodiment of the present invention.

In one embodiment, a system with a sliding etch zone could be used. A group of inlet and outlet nozzles, placed in close proximity to each other, could be used to create a locally circulating etchant zone. The group of nozzles could be scanned across the wafer to etch the entire wafer as shown in FIG. 4. FIG. 4 illustrates an exemplar design with a sliding etch zone in accordance with an embodiment of the present invention.

Referring to FIG. 4, FIG. 4 illustrates a scannable group of inlets and outlets 401, an etchant outlet 402, an etchant inlet 403, a sliding etch zone 404, etchant 405, a frontside cover 406 and a process wafer 407, which is fixed and horizontal.

In one embodiment, geometrical elements, such as baffles and fins, could be placed inside the etchant chamber to ensure a desired fluid flow. In one embodiment, these could be integrally fabricated with the frontside chamber. Computational Fluid Dynamics (CFD) based fluidic simulations along with design optimization techniques could be used to design these geometrical elements.

With respect to active etchant agitation, in-chamber moving assemblies could be used to agitate the etchant and prevent stagnation zones. In one embodiment, these assemblies could be in the form of a group of crossed arms. In another embodiment, these assemblies could be a group of arms with distinct centers-of-rotation. In another embodiment, the moving assemblies could have etchant inlet and outlet ports. In another embodiment, the moving assemblies could have geometrical elements, such as baffles and fins. The actuation mechanism for these assemblies could be indirect (such as actuation of assemblies with integral magnets using a rotating external magnetic field), or direct (such as using a direct drive motor), or using fluidic reaction and impulsive forces (in a manner similar to reaction and impulse turbine as discussed in Dick, Erik. Fundamentals of turbomachines. Vol. 109. Springer, 2015, which is incorporated by reference herein in its entirety). An exemplar double-axis, double-arm assembly with fluidic actuation is shown in FIGS. 5A-5B.

Figure 5A:
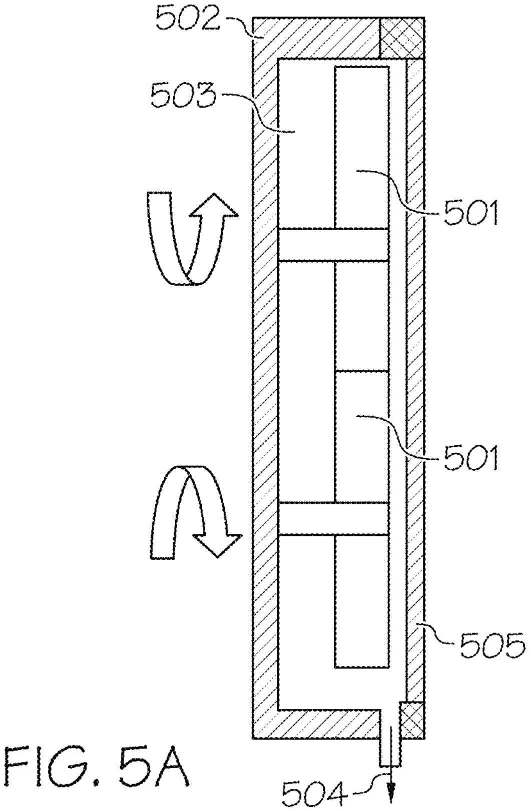
FIGS. 5A-5B illustrates an exemplar design for etchant agitation in accordance with an embodiment of the present invention.
Figure 5B:
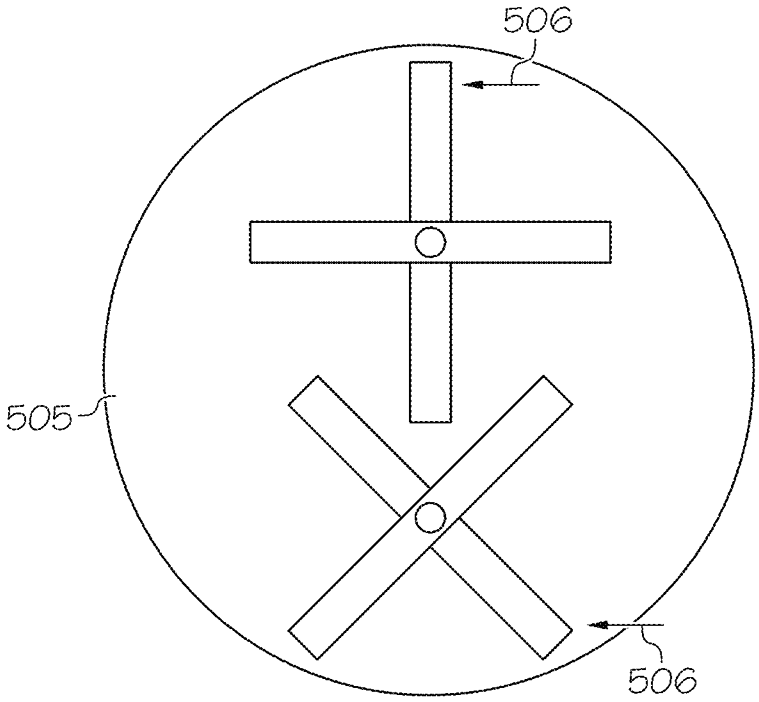

FIGS. 5A-5B illustrates an exemplar design for etchant agitation in accordance with an embodiment of the present invention.

Referring to FIGS. 5A, which illustrates the side view (cross-section), such a design includes a counter rotating etchant agitation arms 501, a frontside cover 502, etchant 503, an etchant outlet 504 and a process wafer 505. FIG. 5B illustrates the top view in which the etchant inlet jets 506 are depicted.

The etchant being circulated in the etch chamber could be mixed and stored in a mixing chamber. In one embodiment, the mixing chamber is placed at a distance from the etch chamber and connected to the etch chamber using CICE-compatible tubing. The mixing chamber could have various monitors of the etchant state, such as concentration monitors, flow monitors, temperature monitors, impurity/precipitant/particle monitors, and pressure monitors. The mixing chamber could also have various actuation mechanisms to change the etchant state, such as etchant inlets for etchant precursors to dynamically modify etchant concentration, and heating assemblies to modify the etchant temperature. The flow of the etchant between the mixing chamber and the process chamber, and between the mixing chamber and the precursor storage, could be handled using CICE-compatible pumps.

In one embodiment, etchant precursors could be stored in containers, such as the mixing chamber, where the precursor storage containers could have precursor state monitors, such as concentration monitors, temperature monitors, impurity/precipitant monitors, pressure monitors, as well as precursor state actuation mechanisms, such as inlets to dynamically modify precursor concentration, and heating assemblies to modify the precursor temperature.

Figure 6:
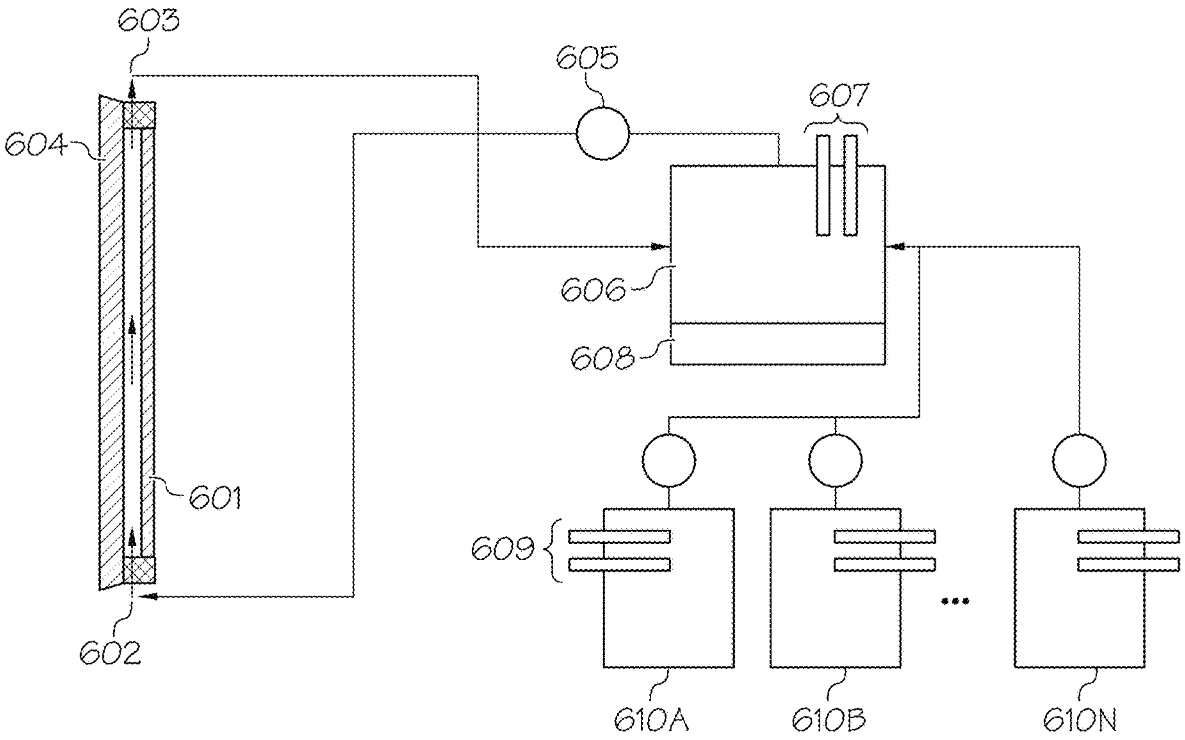
FIG. 6 illustrates an exemplar etchant flow path showing the mixing chamber and precursor storage in accordance with an embodiment of the present invention.

FIG. 6 illustrates an exemplar etchant flow path showing the mixing chamber and precursor storage in accordance with an embodiment of the present invention. In particular, FIG. 6 shows an entire etchant flow assembly, with the process chamber, mixing chamber, precursor storage, pump assemblies, and etchant and precursor state sensing and actuation mechanisms.

Referring to FIG. 6, FIG. 6 illustrates a process wafer 601, an etchant inlet 602, an etchant outlet 603, a frontside cover 604, a CICE-compatible etchant pump 605, a mixing chamber 606, etchant state sensors 607, thermal actuation of mixing chamber etchant 608, precursor state sensors 609 in precursor stage units 610A-610N, where N is a positive integer number (identified as "Precursor 1 Storage," "Precursor 2 Storage," and "Precursor N Storage," respectively in FIG. 6). Precursor storage units 610A-610N may collectively or individually be referred to as precursor storage units 610 or precursor storage unit 610, respectively.

With respect to degassing, one of the products of the CICE process is the gas $H_2$. Aggressive production of $H_2$ during CICE can lead to bubble formation in the etchant in the vicinity of the reaction site, which can introduce non-uniformity in the etchant concentration, diminish visibility through the etchant for in-situ metrology for instance, and potentially clog or reduce the efficiency of the etchant flow systems. It is noted that the bubbles do not need to be eliminated altogether but need to be controlled to an extent that they do not hinder in-situ metrology, etchant flow and reaction uniformity. Several methods could be used to reduce bubble formation in the CICE process.

For example, certain CICE regimes lead to higher bubble production, such as discussed in Li, Yinxiao, and Chuanhua Duan. "Bubble-Regulated Silicon Nanowire Synthesis on Micro-Structured Surfaces by Metal-Assisted Chemical Etching" Langmuir 31, No. 44, Nov. 10, 2015, pp. 12291-1299, which is incorporated by reference herein in its entirety. Thus, operating in regimes that lead to lesser evolution of $H_2$ can reduce the bubble problem.

In another example, lower etch rate can reduce the rate of bubble production as well. This can be achieved, for instance, by lowering the etchant concentration, or the concentration of the rate-limiting etchant precursors. It can also be achieved by lowering the temperature of the etchant, such as discussed in Backes, Andreas, Markus Leitgeb, Achim Bittner, and Ulrich Schmid, "Temperature Dependent Pore Formation in Metal Assisted Chemical Etching of Silicon," ECS Journal of Solid State Science and Technology, Vol. 5, No. 12, Jan. 1, 2016, pp. 653-656, which is incorporated by reference herein in its entirety.

In a further example, increasing the etchant pressure can increase the solubility of gasses in the etchant and thus reduce bubble formation.

In another example, decreasing the temperature of the etchant increases the solubility of gasses in the etchant and could thus be used to reduce bubble formation.

In a further example, concerning membrane degasification, PTFE-based CICE-compatible gas-liquid separation membranes, on the process chamber walls, or elsewhere in the etchant path, could be used to selectively extract gasses from the etchant and reduce bubble formation.

In another example, sonication could be used to detach bubbles attached to the process wafer surface and drive them into the bulk etchant. The sonication could be achieved using, for instance, piezoelectric elements that are integrated in the front and/or back covers.

In a further example, a vacuum-based degassing chamber could be used, as part of the mixing chamber, or separately, to reduce the amount of dissolved gasses in the etchant solution.

In another example, the tool could be operated such that the process wafer is vertical during the CICE process, so that bubbles travel up against gravity to the top of the tool instead of travelling to the front of the tool in a horizontal configuration, and obstructing the view for potential in-situ metrology.

In a further example, bubbles stuck to the surface of the process wafer could be released using a movable arm with a knife edge that moves across the surface of the process wafer while maintaining a small gap between the wafer and the knife edge (millimeter-scale or lower).

Figure 7:
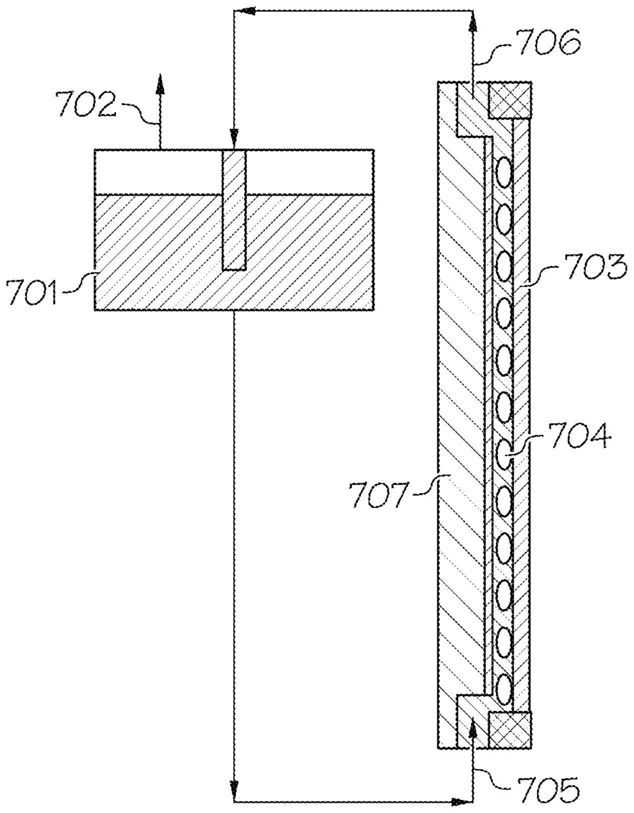
FIG. 7 illustrates an exemplar vacuum-based degassing strategy in accordance with an embodiment of the present invention.

Referring now to FIG. 7, FIG. 7 illustrates an exemplar vacuum-based degassing strategy in accordance with an embodiment of the present invention.

As shown in FIG. 7, the strategy includes a degassing chamber 701, where there is a vacuum or a partial vacuum for $H_2$ 702, a process wafer 703, H2 bubbles 704, an etchant inlet 705, an etchant outlet 706 (e.g., $H_2$ saturated) and a frontside cover 707.

With respect to reaction quenching and reaction starting, for a uniform etch across the whole wafer, it is important to carefully manage the spatial variation in the start and stop of the CICE process. For instance, for a wet process, if the reaction quenching fluid (water, for instance) is injected at one end of process wafer 703 and it takes 5 seconds for the quenching front to cover the entire wafer, at a sample etch rate of 1 μm/min this would result in an etch height variation of ~80 nm across the entire wafer. Similarly, if the etchant at the start of the CICE process is injected at one end of process wafer 703 and it takes 5 seconds for the etchant front to cover the entire wafer, at a sample etch rate of 1 μm/min this would result in an etch height variation of ~80 nm across the entire wafer. Several methods could be used to reduce the etch height variation during reaction quenching and starting.

For example, reducing the etch rate, prior to reaction quenching or over the entire etch, can reduce the etch height variation. The etch rate reduction could be achieved by changing the relative concentrations of the etchant precursors (in the mixing chamber), or by reducing the temperature of the wafer (which would lead to a corresponding drop in the etch rate, such as discussed in Backes, Andreas, Markus Leitgeb, Achim Bittner, and Ulrich Schmid, "Temperature Dependent Pore Formation in Metal Assisted Chemical Etching of Silicon," ECS Journal of Solid State Science and Technology, Vol. 5, No. 12, Jan. 1, 2016, pp. 653-656, which is incorporated by reference herein in its entirety.

In another example, concerning etchant and quenching fluid injection from the front of the wafer, the flow path of the etchant could be reduced by introducing the etchant and the quenching fluids from the front of the wafer. This would reduce the time stray etchant remains in the process chamber, thus reducing the reaction quenching time and the corresponding etch non-uniformity. Similarly, it would reduce the amount of time it takes for etchant to be introduced during etch initiation. Many of the methods described in the etch circulation section above could be used for frontside introduction of etchants and the quenching fluid. For instance, the design shown in FIG. 2 could be used in such a case.

In a further example, regarding etchant freezing, the process wafer could be cooled, using peltier elements, for instance, such that a thin layer of etchant right next to the wafer freezes (which would also stop the CICE reaction). The bulk unfrozen etchant could then be replaced with a reaction quenching fluid, such as water, while the etchant right next to the wafer is still frozen. The thin layer of frozen etchant could then be heated so that it melts and rapidly dissipates into the bulk quenching fluid which is present right next to it. An illustration of such quenching is shown in FIGS. 8A-8D.

Referring to FIGS. 8A-8D, FIGS. 8A-8D illustrate an exemplar etchant freezing-based reaction quenching in accordance with an embodiment of the present invention.

Figure 8A:
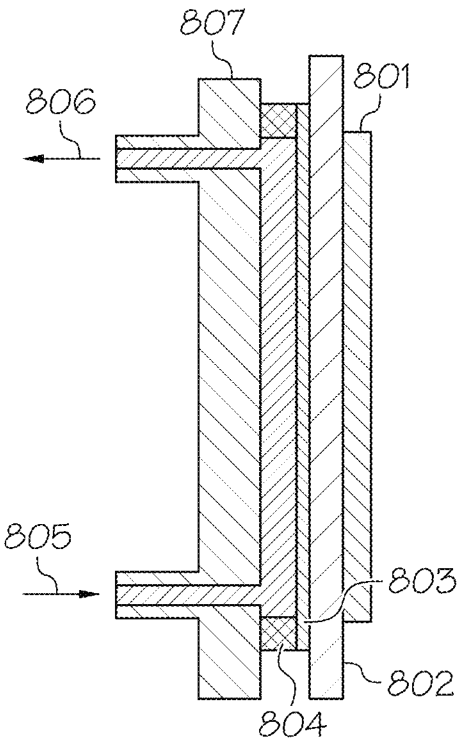
FIGS. 8A-8D illustrate an exemplar etchant freezing-based reaction quenching in accordance with an embodiment of the present invention.

FIG. 8A illustrates a thermoelectric cooler (TEC) 801 at sub-freezing temperature, a wafer chuck 802, a process wafer 803, a seal 804, an etchant inlet 805, an etchant outlet 806 and a frontside cover 807.

Figure 8B:
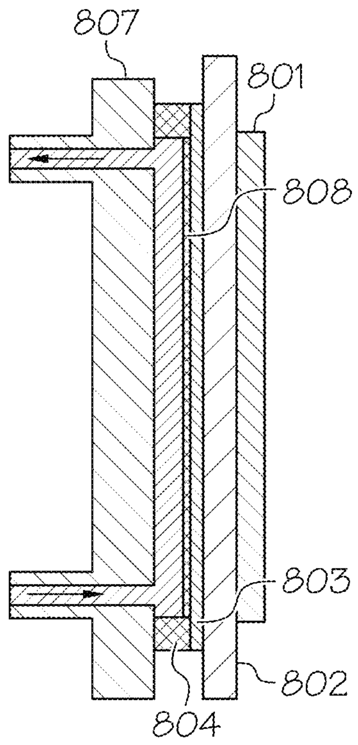

FIG. 8B illustrates a thin layer of frozen etchant 808.

Figure 8C:
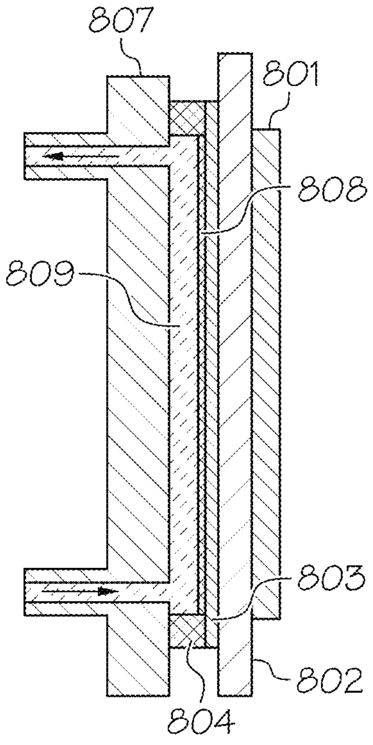

Furthermore, FIG. 8C illustrates the replacement of the bulk etchant solution with quenching liquid 809.

Figure 8D:
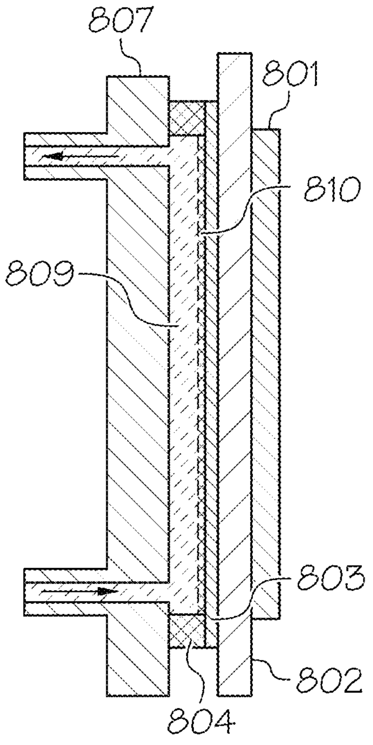

Additionally, FIG. 8D illustrates a thin layer of etchant melting off 810 and having TEC 801 being set to heat.

Alternatively, after the freezing process, the bulk fluid could be replaced with air, which is subsequently evacuated, such that the thin frozen layer of etchant sublimates. The evacuation could be achieved by placing the entire etch chamber in a larger CICE-compatible vacuum chamber, or alternatively connecting a CICE-compatible vacuum pump, such as a bellow pump to the reaction chamber itself and drawing out the filled air. An illustration of such quenching is shown in FIGS. 9A-9D.

FIGS. 9A-9D illustrates an exemplar etchant freezing-and-sublimation-based reaction quenching in accordance with an embodiment of the present invention.

Figure 9A:
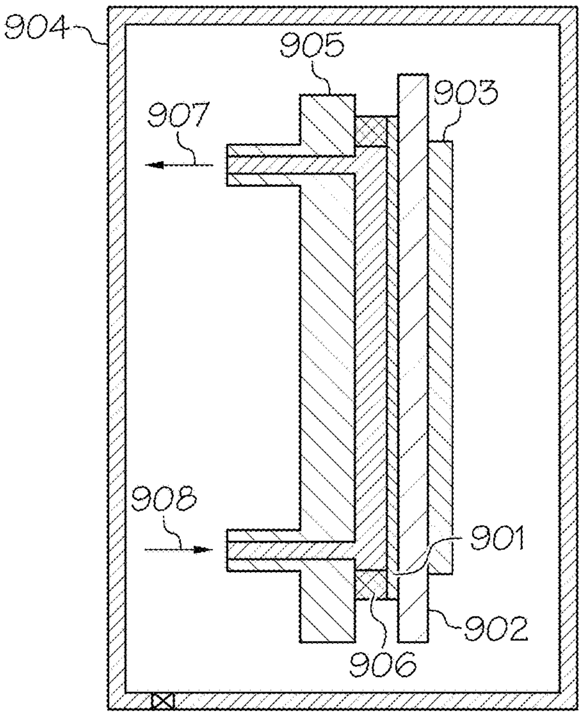
FIGS. 9A-9D illustrates an exemplar etchant freezing-and-sublimation-based reaction quenching in accordance with an embodiment of the present invention.

FIG. 9A illustrates a process wafer 901, a waver chuck 902, a thermoelectric cooler (TEC) 903 at sub-freezing temperature, a large vacuum chamber 904, a frontside cover 905, a seal 906, an etchant outlet 907 and an etchant inlet 908.

Figure 9B:
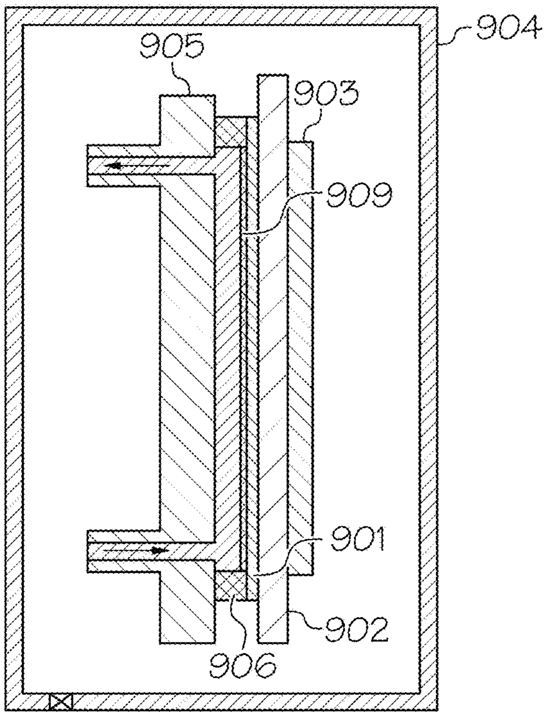

FIG. 9B illustrates a thin layer of frozen etchant 909.

Figure 9C:
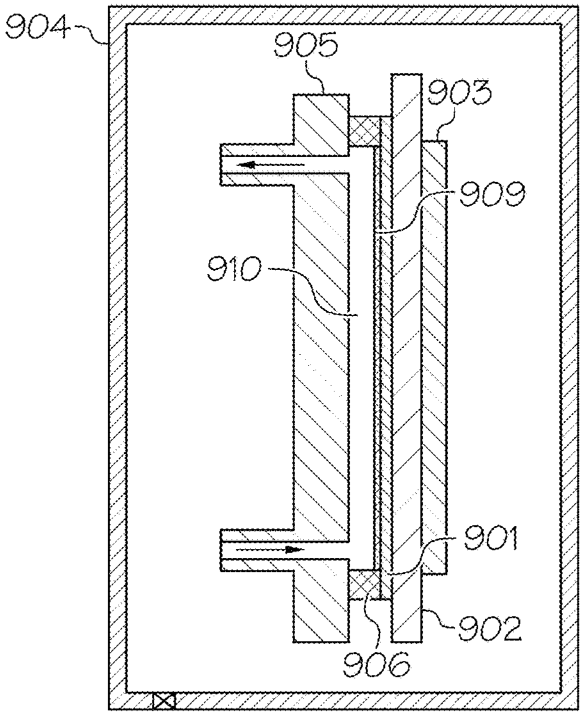

FIG. 9C illustrates the replacement of the bulk etchant solution with air 910.

Figure 9D:
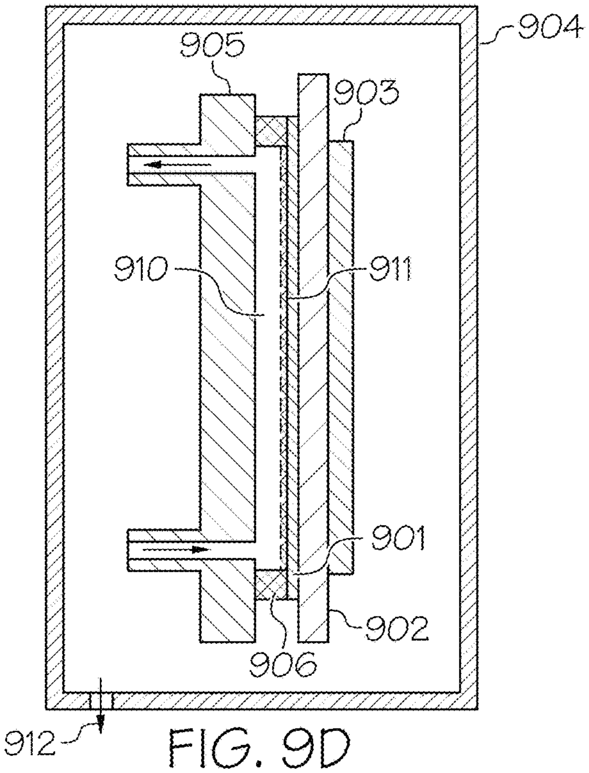

FIG. 9D illustrates the thin layer of etchant sublimating off 911 and the vacuum being turned on 912.

Figure 10:
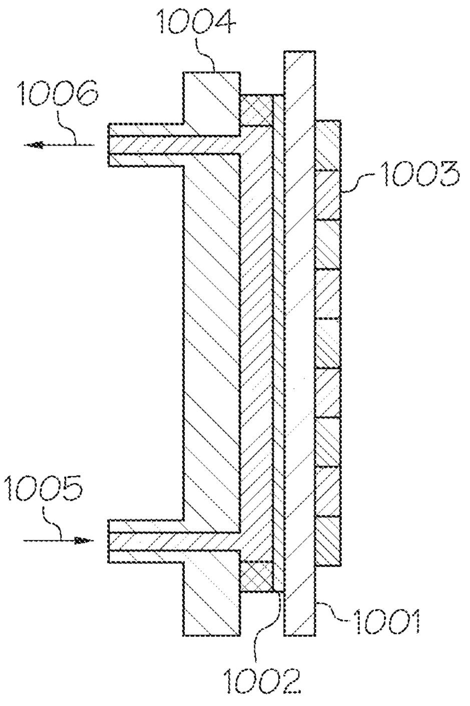
FIG. 10 illustrates an exemplar design for thermal compensation during reaction quenching and starting in accordance with an embodiment of the present invention.

With respect to thermal compensation, an array of thermal actuators could be used to actively compensate for any etch rate variation that are caused during etch initiation and quenching. Several methods could be used to achieve the thermal actuation, such as discussed below regarding the process variation control. FIG. 10 illustrates an exemplar design for thermal compensation during reaction quenching and starting in accordance with an embodiment of the present invention.

As shown in FIG. 10, such a design includes a wafer chuck 1001, a process wafer 1002, a grid of independently controllable thermoelectric coolers 1003, a frontside cover 1004, an etchant inlet 1005 and an etchant outlet 1006.

In one embodiment, the entire etchant in the reaction chamber, for instance when a thin sheet of reactant is used, could be rapidly evaporated using vacuum. The evacuation could be achieved by placing the entire etch chamber in a larger CICE-compatible vacuum chamber, or alternatively connecting a CICE-compatible vacuum pump, such as a bellow pump to the reaction chamber itself and drawing out the filled air.

With respect to process variation control, spatial variation in the concentration of the etchant and etch products, local etchant flow rate, etchant temperature, pattern density variation, and wafer edge effects can lead to variation in the quality of the etch (e.g., degree of porosity, wall surface roughness, wall angle), as well as variation in the etch rate. In one embodiment, a feedback-based system is used to control process variation. In another embodiment, a purely feedforward approach could be used, where the likely process variation is known ahead of time, and local actuation methods (such as thermal actuation) are used in an open-loop manner to correct the known process variation. In another embodiment, a hybrid approach could be used where known process variation trends are combined with real-time process variation measurements for controlling the process actuators.

Figure 11A:
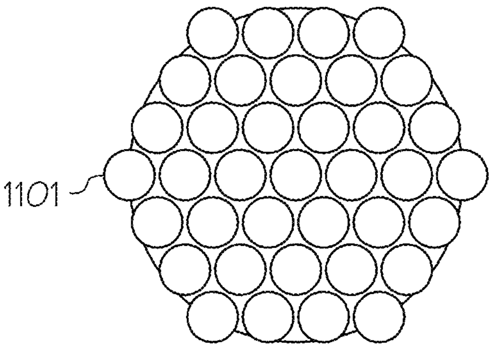
FIGS. 11A-11B illustrate an exemplar in-situ metrology system with total wafer coverage in accordance with an embodiment of the present invention.
Figure 11B:
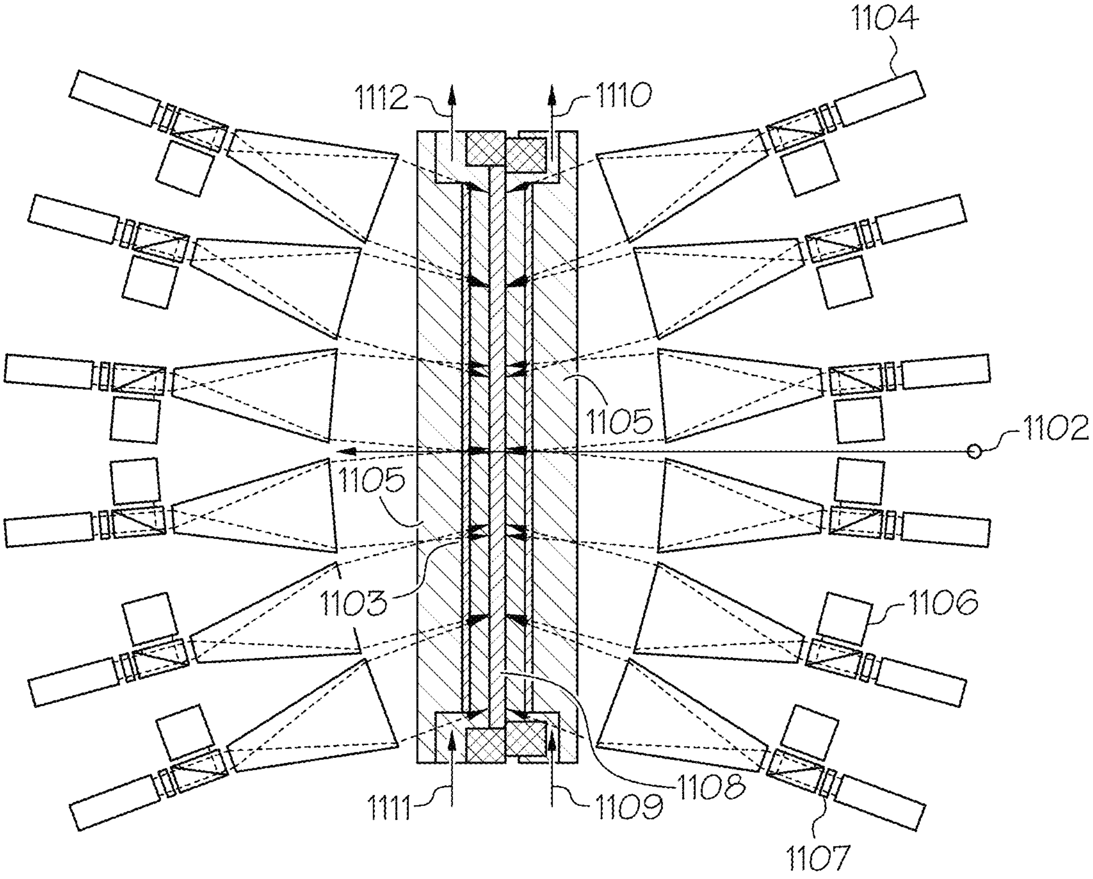
Figure 12:
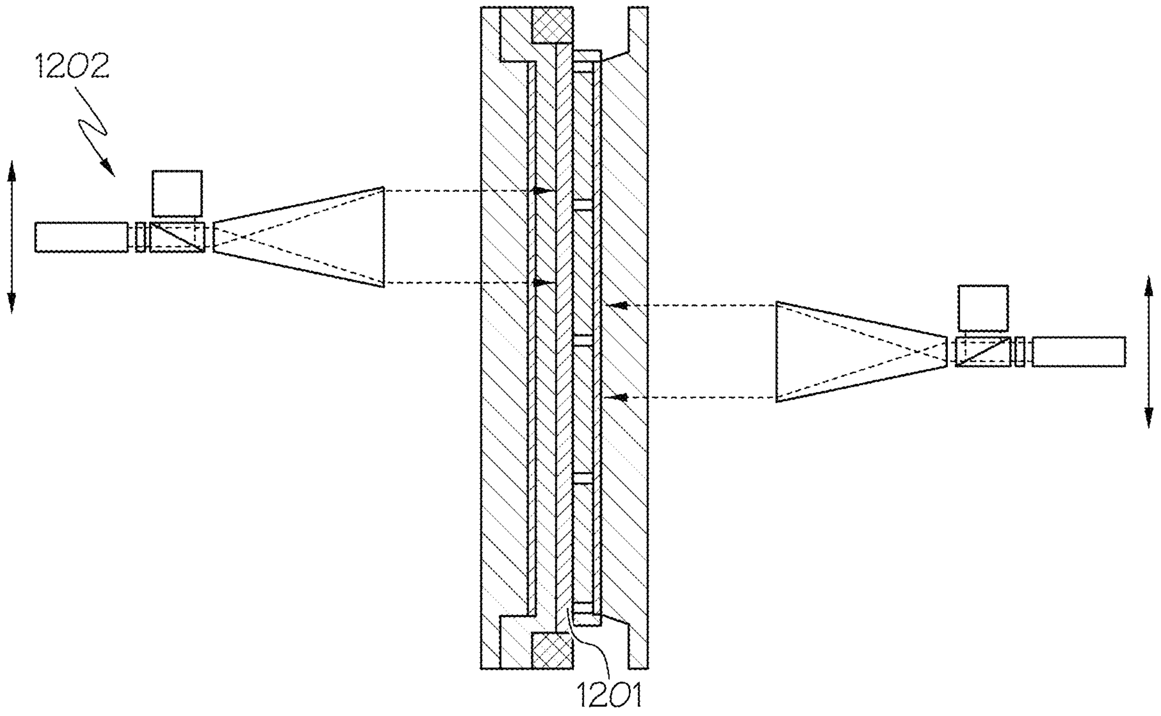
FIG. 12 illustrates an exemplary metrology system with scannable optics in accordance with an embodiment of the present invention.

With respect to metrology, there is in-situ metrology, in which the spatial variation in etch rate, or a proxy thereof (such as the unique spectral signature corresponding to a given etch feature height), could be monitored in-situ. This could, for instance, be achieved using in-situ spectrophotometry, such as discussed in Gawlik, Brian, et al. "Hyperspectral imaging for high-throughput, spatially resolved spectroscopic scatterometry of silicon nanopillar arrays," Optics Express, Vol. 28, No. 10, 2020, pp. 14209-14221, which is incorporated by reference herein in its entirety, of the process wafer. The metrology could either be reflective, or transmissive. IR wavelengths would be used in case transmissive metrology is required, such as discussed in Choi, M. S., H. M. Park, and K. N. Joo. "Note: Near infrared interferometric silicon wafer metrology." Review of Scientific Instruments 87.4 (2016): 046106, which is incorporated by reference herein in its entirety. The metrology could either be done in real-time (synchronously), or asynchronously with the CICE process. Depending on whether the metrology is reflective or transmissive, the frontside and/or the backside covers would have to be fabricated using CICE-compatible transparent materials. Crystalline sapphire is one such material, and this is available in wafer form. The thickness of the etchant sheet could be maintained such that a large portion of the incident irradiance passes through the etchant (for instance, 90% transmittance, 80%, 70%, 60%, etc.). FIGS. 11A-11B and 12 shows two exemplar systems.

FIGS. 11A-11B illustrate an exemplar in-situ metrology system with total wafer coverage in accordance with an embodiment of the present invention. FIG. 12 illustrates an exemplary metrology system with scannable optics in accordance with an embodiment of the present invention.

Referring to FIG. 11A, FIG. 11A illustrates the top view showing coverage of metrology system 1101. FIG. 11B illustrates the side-to-side view, in which a finite radius of curvature $R_{optics}$ 1102 and overlapping fields-of-view 1103 enable gap-free metrology and actuation. FIG. 11B further illustrates imagers 1104, sapphire frontside and backside covers 1105, a light source 1106, optical filters 1107, a process wafer 1108, a backside fluid inlet 1109, a backside fluid outlet 1110, an etchant inlet 1111, and an etchant outlet 1112.

FIG. 12 illustrates the process wafer 1201 along with an imager assembly 1202 on an XY stage.

With respect to ex-situ metrology, the spatial variation in the CICE etch, or a proxy thereof (such as the unique spectral signature corresponding to a given etch feature height), could be measured ex-situ. The metrology could either be reflective, or transmissive. IR wavelengths would be used in case transmissive metrology is required. The ex-situ metrology chamber could be placed in close proximity to the etch chamber to enable quick transfer of a processed wafer. In one embodiment, the metrology system itself is not made of CICE compatible materials but is enclosed in a larger CICE compatible chamber.

Figure 13:
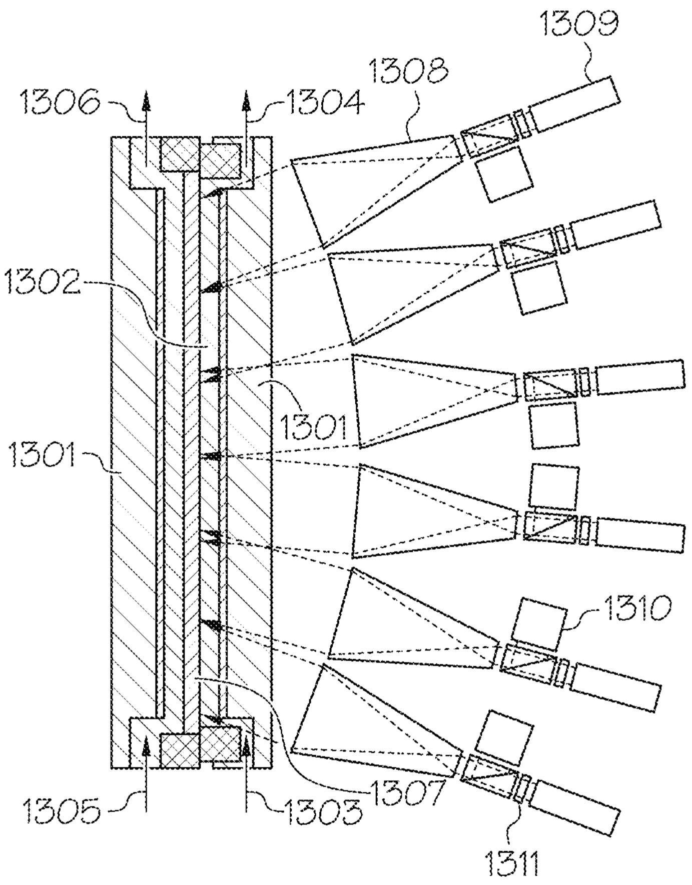
FIG. 13 illustrates an exemplar system for digital micro-mirror device (DMD)-modulated wafer thermal control in accordance with an embodiment of the present invention.

With respect to thermal actuation, controlled variation in local temperature can be used to produce corresponding variations in the process wafer etch rate, such as discussed in Backes, Andreas, Markus Leitgeb, Achim Bittner, and Ulrich Schmid. "Temperature Dependent Pore Formation in Metal Assisted Chemical Etching of Silicon." ECS Journal of Solid State Science and Technology 5, No. 12, Jan. 1, 2016, pp. 653-656, which is incorporated by reference herein in its entirety. This thermal actuation of the etch rate could be used to actively control spatial variations in etch rate. Thermal actuation could be achieved using contact-based solutions, such as thermoelectric cooling, such as discussed in DiSalvo, Francis J. "Thermoelectric cooling and power generation." Science 285.5428 (1999): 703-706, which is incorporated by reference herein in its entirety, or using non-contact solutions, such as heating using DMD-modulated light at visible or IR wavelengths, such as discussed in Hiura, Mitsuru, et al. "Overlay improvements using a novel high-order distortion correction system for NIL high-volume manufacturing," Novel Patterning Technologies, Vol. 10584. International Society for Optics and Photonics, 2018, which is incorporated by reference herein in its entirety. The thermal actuators could be distributed over the entire extent of the process wafer or cover a portion of the process wafer and could optionally be scanned across the process wafer. Thermal actuation could be implemented from the frontside of the process wafer, the backside, or from both sides. FIGS. 10 and 13 show exemplar systems.

FIG. 13 illustrates an exemplar system for digital micromirror device (DMD)-modulated wafer thermal control in accordance with an embodiment of the present invention.

Referring to FIG. 13, such an exemplar system includes sapphire frontside and backside covers 1301, backside fluid 1302, which can be used to set wafer global temperature, a backside fluid inlet 1303, a backside fluid outlet 1304, an etchant inlet 1305, an etchant outlet 1306, a process wafer 1307, focusing optics 1308, imagers 1309, light source along with a digital micromirror device (DMD) assembly 1310, and optical filters 1311.

Figure 14:
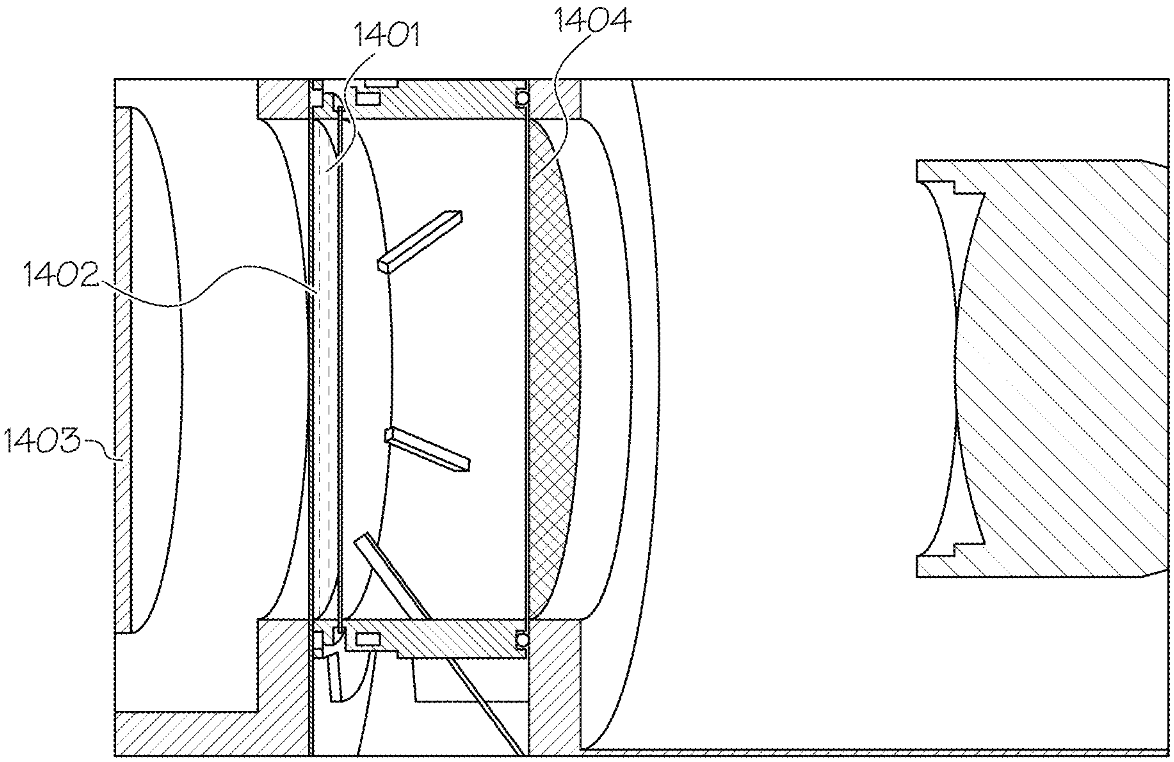
FIG. 14 illustrates an exemplar system for electric filed control in the CICE tool (only the cross-section of the CICE tools is shown) in accordance with an embodiment of the present invention.

With respect to electric field control, electric fields can be used to modulate the level of porosity during the CICE process, such as discussed in Lianto, Prayudi, Sihang Yu, Jiaxin Wu, C V Thompson, and W K Choi, "Vertical Etching with Isolated Catalysts in Metal-Assisted Chemical Etching of Silicon," Nanoscale 4, No. 23, Dec. 7, 2012, pp. 7532-7539, which is incorporated by reference herein in its entirety. In one embodiment, an array of electrodes patterned on the front and back covers are used to produce local electric fields to control the local porosity in the process wafers. FIG. 14 illustrates an exemplar system for electric filed control in the CICE tool (only the cross-section of the CICE tools is shown) in accordance with an embodiment of the present invention.

As shown in FIG. 14, FIG. 14 illustrates the process wafer 1401 along with the backside transparent electrode 1402, the backside illumination 1403 and the frontside of the transparent electrode 1404.

With respect to adjusting for pattern density variations, pattern density variations, and their potential effects on etch rate and quality, could be addressed using a variety of the methods described above. In one embodiment, a denser array of process actuators could be used in regions of higher pattern density. In another embodiment, sliding etch zones, with the ability to locally change the etchant concentration could be used to account for variation in pattern density.

Furthermore, with respect to wafer edge effects, abrupt changes in the fluid meniscus, etchant concentration, electric fields, etc. near the process wafer edges could lead to large variation in etch characteristics near the edges. This could be addressed by careful design of the wafer edge exclusion zone, such that a large portion of the etch variation is present outside the exclusion zone. In one embodiment, front cover seals could be contacted on the outside of the wafer periphery (see FIG. 15). In another embodiment, a spin-spray type system could be used with no peripheral seals on the wafer frontside.

Figure 15:
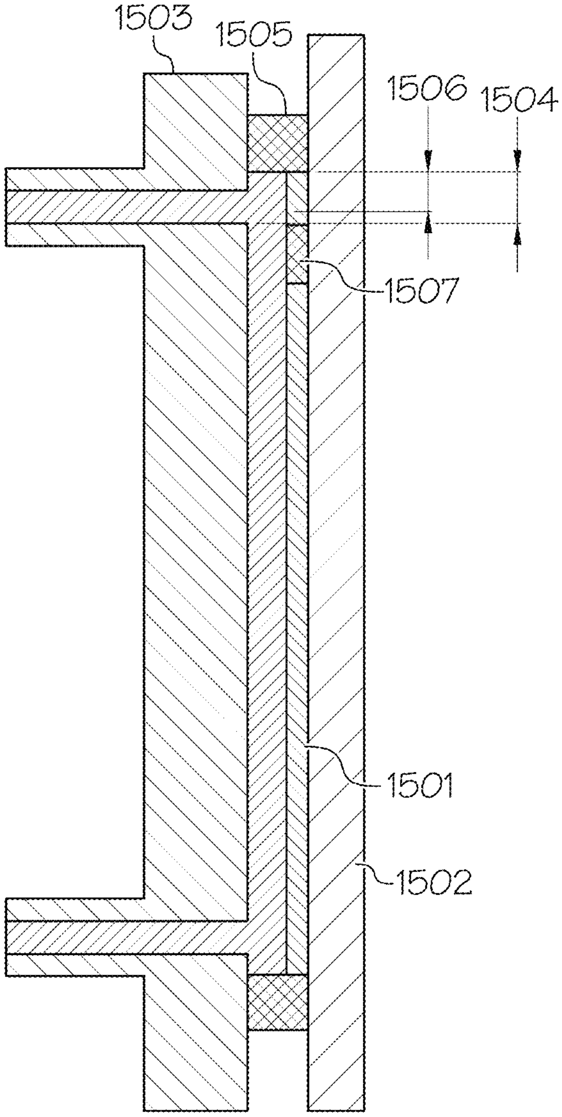
FIG. 15 illustrates an exemplar edge contact design showing frontside seals that make contact on the outside edge of the process wafer in accordance with an embodiment of the present invention.

Referring now to FIG. 15, FIG. 15 illustrates an exemplar edge contact design showing frontside seals that make contact on the outside edge of the process wafer in accordance with an embodiment of the present invention.

As shown in FIG. 15, FIG. 15 illustrates a process wafer 1501, a wafer chuck 1502, a frontside cover 1503, an edge exclusion zone 1504, frontside seal contracts 1505 on the outer edge of process wafer 1501, a region of high variation 1506 in the etch and a device region 1507 on process wafer 1501.

Figure 16:
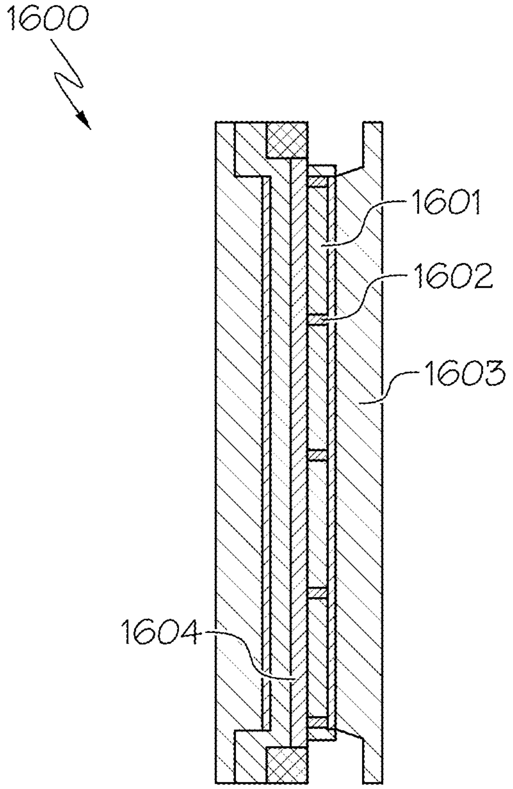
FIG. 16 illustrates an exemplar backside contact with backside fluid in accordance with an embodiment of the present invention.
Figure 17:
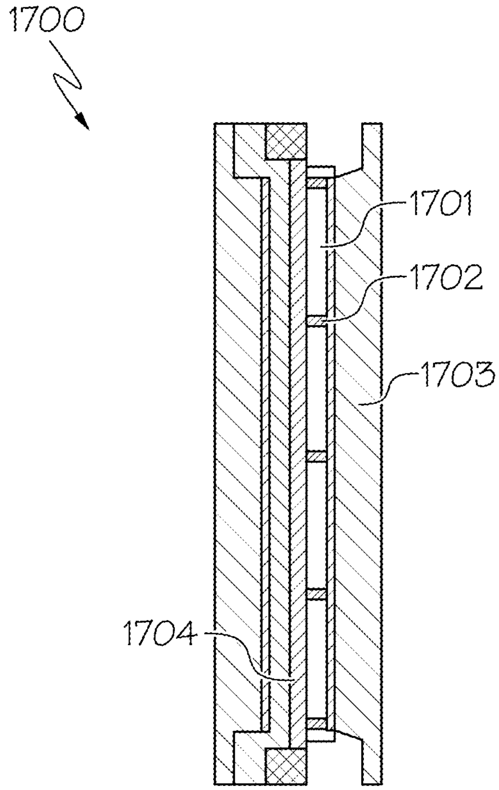
FIG. 17 illustrates an exemplar backside contact using a vacuum chuck in accordance with an embodiment of the present invention.

In one embodiment, the backside contact could be established using chucks made of CICE-compatible materials, such as fluoropolymers or sapphire. In one embodiment, the chuck could have a pin-type contact with the wafer backside, ring type contact, or a flat areal contact. In one embodiment, the wafer could be held against the backside chuck using clamps that attach to the wafer edge, using vacuum, or using electrostatics. The space between the process wafer and the backside chuck (if present), could be filled with a fluid, which could be the etchant or a generic electrolyte. The backside fluid could be used to facilitate electric field control during the CICE process. The backside fluid could either be stationary or circulating. Frontside etchant flow strategies (described above) could be used for backside fluid flow as well. FIGS. 16 and 17 show some exemplar designs for the backside contact.

FIG. 16 illustrates an exemplar backside contact with backside fluid in accordance with an embodiment of the present invention. In one embodiment, the backside fluid can be used to enable electric filed control and global temperature control for the process wafer. As shown in FIG. 16, such a backside contact 1600 includes backside contract fluid 1601, chuck pins 1602, wafer chuck 1603 (pin-type) and a process wafer 1604.

FIG. 17 illustrates an exemplar backside contact using a vacuum chuck in accordance with an embodiment of the present invention. As shown in FIG. 17, such a backside contract 1700 includes a vacuum 1701, chuck pins 1702, wafer chuck 1703 (pin-type) and a process wafer 1704.

In one embodiment, electric fields can be used to modulate the level of porosity during the CICE process, such as discussed in Weisse, Jeffrey M, Chi Hwan Lee, Dong Rip Kim, Lili Cai, Pratap M Rao, and Xiaolin Zheng, "Electroassisted Transfer of Vertical Silicon Wire Arrays Using a Sacrificial Porous Silicon Layer," Nano Lett. 13, No. 9, Sep. 11, 2013, pp. 4362-4368, which is incorporated by reference herein in its entirety. In one embodiment, electrodes patterned on the front and back covers are used to produce electric fields to control the porosity in the process wafer. It is noted that the patterning of a CICE-compatible thin electrode layer on flat substrates is available. It is further noted that to create an ohmic contact for establishing a current through the process wafer, backside illumination can be used, as discussed in Lehmann, Volker. Electrochemistry of Silicon: Instrumentation, Science, Materials and Applications. Wiley, 2002, which is incorporated by reference herein in its entirety. FIG. 14 illustrates such an exemplar system.

With respect to safety features, in one embodiment, the seals between the frontside process chamber, the process wafer, and the backside wafer cover are CICE-compatible. The seals could also be CMOS-compatible. In one embodiment, the seal could also be integrally fabricated in the front and backside process covers. To seal rotating assemblies, rotary seals (integrally fabricated or otherwise) could be used.

With respect to tool maintenance and cleaning, intermittent cleaning of the process chamber with a metal contaminant cleaning solution, such as nitric acid, could be used to remove metal impurities that might accumulate on the process chamber. The tool maintenance schedule could be divided up into high frequency intermittent metal cleans, and lower frequency maintenance involving full tool disassembly and clean.

It is noted that the phase of the etchant could be either vapor or liquid. Both vapor-phase CICE and liquid-phase CICE have been demonstrated before. For vapor-phase CICE, electric field creation and control could be achieved using atmospheric pressure plasmas, as discussed in Tendero, Claire, et al. "Atmospheric pressure plasmas: A review," Spectrochimica Acta Part B: Atomic Spectroscopy, Vol. 61, No. 1, 2006, pp. 2-30, which is incorporated by reference herein in its entirety.

In one embodiment, the CICE tool consists of a spin-spray type system for frontside etchant delivery, a vacuum chuck on the backside, global (single setpoint) temperature control of the frontside etchant, local contact or contactless temperature control on the wafer backside, flow or freezing-based reaction quenching, ex-situ reflective scatterometry, and an optional in-situ IR-based transmissive scatterometry.

In another embodiment, the CICE tool consists of a thick fluid sheet (defined as the thickness of the fluid sheet which has a light transmission (at the relevant metrology spectrum) of 50% or lower) for frontside etchant, a thick fluid sheet on the backside, global (single setpoint) temperature control of the frontside etchant, global (single setpoint) temperature control on the wafer backside, flow-based reaction quenching, ex-situ reflective scatterometry, and a diamond-like coating (DLC) based electric field creation.

In another embodiment, the CICE tool consists of a thick fluid sheet for frontside etchant, a thin fluid sheet (defined as the thickness of the fluid sheet which has a light transmission (at the relevant metrology spectrum) of 50% or higher) on the backside, global (single setpoint) temperature control of the frontside etchant, global (single setpoint) or local temperature control on the wafer backside, flow-based reaction quenching, ex-situ reflective scatterometry, an optional in-situ IR-based transmissive scatterometry, and a diamond-like coating (DLC) based electric field creation.

In another embodiment, the CICE tool consists of a thick fluid sheet for frontside etchant, a vacuum chuck on the backside, global (single setpoint) temperature control of the frontside etchant, global (single setpoint) or local temperature control on the wafer backside, flow-based reaction quenching, ex-situ reflective scatterometry, and an optional in-situ IR-based transmissive scatterometry.

In another embodiment, the CICE tool consists of a thin fluid sheet for frontside etchant, a thick fluid sheet on the backside, global (single setpoint) or local temperature control on the frontside, global (single setpoint) temperature control on the wafer backside, flow-based reaction quenching, in-situ reflective scatterometry, optional ex-situ reflective scatterometry, and diamond-like carbon (DLC)-based electric field creation.

In another embodiment, the CICE tool consists of a thin fluid sheet for frontside etchant, a thin fluid sheet on the backside, global (single setpoint) or local temperature control on the frontside, global (single setpoint) or local temperature control on the wafer backside, flow-based reaction quenching, in-situ reflective scatterometry, optional in-situ IR-based transmissive scatterometry, optional ex-situ reflective scatterometry, and DLC-based electric field creation.

In another embodiment, the CICE tool consists of a thin fluid sheet for frontside etchant, a vacuum chuck on the backside, global (single setpoint) or local temperature control on the frontside, global (single setpoint) or local temperature control on the wafer backside, flow or freezing-based reaction quenching, in-situ reflective scatterometry, optional in-situ IR-based transmissive scatterometry, optional ex-situ reflective scatterometry, and DLC-based electric field creation.

In another embodiment, the CICE tool consists of a vapor etchant on the frontside, a thick fluid sheet on the backside, global (single setpoint) or local temperature control on the frontside, global (single setpoint) temperature control on the wafer backside, in-situ reflective scatterometry, optional ex-situ reflective scatterometry, optional plasma and DLC-based electric field creation.

In another embodiment, the CICE tool consists of a vapor etchant on the frontside, a thin fluid sheet on the backside, global (single setpoint) or local temperature control on the frontside, global (single setpoint) or local temperature control on the wafer backside, in-situ reflective scatterometry, optional in-situ IR-based transmissive scatterometry, optional ex-situ reflective scatterometry, optional plasma and DLC-based electric field creation.

In another embodiment, the CICE tool consists of a vapor etchant on the frontside, a vacuum chuck on the backside, global (single setpoint) or local temperature control on the frontside, global (single setpoint) or local temperature control on the wafer backside, in-situ reflective scatterometry, optional in-situ IR-based transmissive scatterometry, and optional ex-situ reflective scatterometry.

In another embodiment, the CICE tool consists of a variable thickness fluid sheet for the frontside etchant. In another embodiment, the CICE tool consists of a variable thickness fluid sheet on the backside. The variable thickness fluid sheet designs could be implements using deformable frontside and backside cover assemblies, for instance, using deformable polymer bellows and/or diaphragms.

A discussion regarding porosity control during CICE is now deemed appropriate.

Details regarding porosity control during CICE is discussed in A. Mallavarapu, P. Ajay, C. Barrera, S. V. Sreenivasan, "Ruthenium Assisted Chemical Etching of Silicon—Enabling CMOS-Compatible 3D Semiconductor Device Nanofabrication," ACS Applied Materials & Interfaces 2021, Vol. 13, No. 1, pp. 1169-1177, which is incorporated herewith in its entirety.

Gold is the catalyst of choice in CICE literature due to its ability to robustly create non-porous, high aspect ratio, vertical silicon nanostructures. However, Au is not CMOS-compatible and cannot be used in semiconductor fabs as it is known to cause undesirable deep-level defects in silicon circuits. CICE has superior etch anisotropy and sidewall profile, and can improve performance of these devices, but the use of gold prohibits its process integration in manufacturing of these devices.

The CICE mechanism suggests that an open circuit local redox reaction occurs at the site of the catalyst, with cathodic and anodic reactions: (where n depends on the oxidation state of silicon.)

(i) cathodic reaction:

$$H_2O_2 + 2H^+ \xrightarrow{catalyst} 2H_2O + 2h^+$$

(ii) anodic reaction:

$$Si + 6HF + nh^+ \rightarrow H_2SiF_6 + nH^+ + \frac{4-n}{2}H_2\uparrow$$

Catalysts that comprise one or more of: Au, Pt, Pd, Ag, Ru, W, Cu, TiN, Ti, Graphene, Carbon, etc. catalyze the reduction of $H_2O_2$ and injects the resulting electronic holes into silicon, thereby changing the oxidation state of silicon. HF selectively etches this silicon, and the catalyst sinks into the etched region to continue the local redox reaction, thereby producing silicon nanostructures in areas without the catalyst. The characteristics of the resulting silicon nanostructures are highly dependent on the balance of reaction rates, charge transfer, etchant mass transfer and movement of the catalyst.

High aspect ratio, porosity-free, taper-free silicon nanostructures using CICE have been limited to low doped Si etch with Au as a catalyst. Other catalysts (such as Ru, Pd, Pt, and TiN) and semiconductors (such as Ge, GaAs, InP, GaN, SiGe, SiC) in literature suffer from undesirable, extraneous porosity during CICE.

The following variables are controlled locally and/or globally to control porosity:

Etchant concentration: In one embodiment, porosity is reduced by modifying the etchant concentrations to reduce concentration of the oxidant in the etchant solution.

Etchant temperature: Porosity is reduced by decreasing the temperature of the etchant during CICE.

Electric fields during CICE: Porosity is reduced by applying a negative electric field bias to the back of the substrate during CICE. In another embodiment, porosity is reduced by supplying electronic holes using electric current, in a CICE etchant solution that does not have an oxidant.

Substrate preparation step: Porosity is reduced by providing an interfacial material between the catalyst and substrate before CICE. In one embodiment, the interfacial material is one or more of the following: silicon oxide, aluminum oxide, titanium oxide, titanium. In one embodiment, the interfacial material thickness is optimized to reduce porosity. In another embodiment, the interfacial material thickness is optimized to improve etch uniformity. Further, the interfacial material is etched away in the CICE etchant during CICE.

Pattern topology optimization to reduce excess hole production: Catalyst surface area affects the concentration of holes generated during CICE, and thereby the porosity. In one embodiment, the catalyst surface area is reduced by optimizing the catalyst geometry to reduce surface area while maintaining required etch feature constraints.

Catalyst surface area: In one embodiment, local areas of the catalyst are exposed to the CICE etchant to reduce concentration of holes generated. In one embodiment, patterned catalyst islands or "mini-meshes" are used to reduce surface area, as shown and discussed in connection with FIGS. 18, 19A-19D and 20A-20C, where the catalyst is patterned using nanoimprint lithography.

Figure 18:
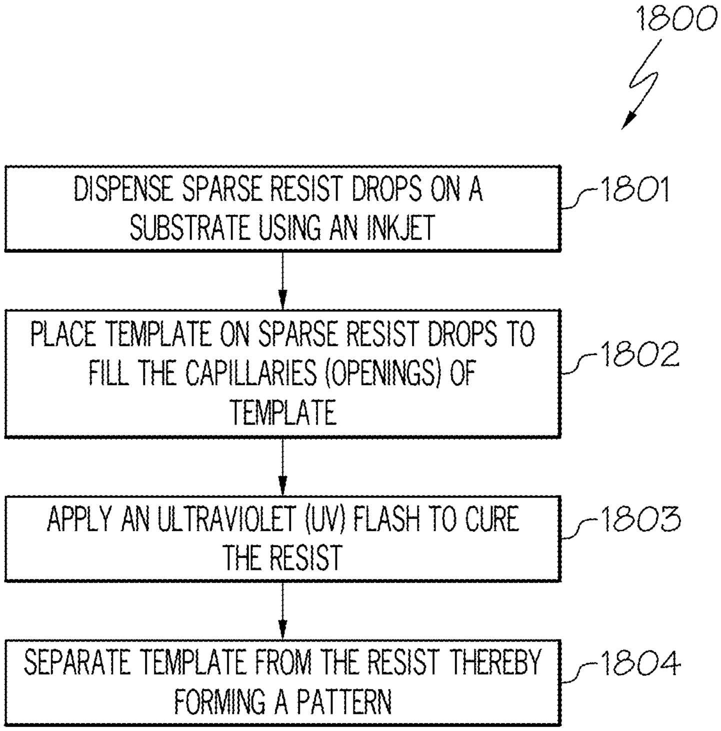
FIG. 18 is a flowchart of a method for the Ru mini-mesh patterning process using the modified Jet and Flash imprint lithography with sparse inkjet drops in accordance with an embodiment of the present invention.

Referring now to FIG. 18, FIG. 18 is a flowchart of a method 1800 for the Ru mini-mesh patterning process using the modified Jet and Flash imprint lithography with sparse inkjet drops in accordance with an embodiment of the present invention. FIGS. 19A-19D depict cross-sectional views for the Ru mini-mesh patterning process using the modified Jet and Flash imprint lithography with sparse inkjet drops using the steps described in FIG. 18. FIGS. 20A-20C illustrate the tilted cross-section SEM and top-down optical microscope images of the resist pattern after the sparse drops imprint in accordance with an embodiment of the present invention.

Figure 19A:
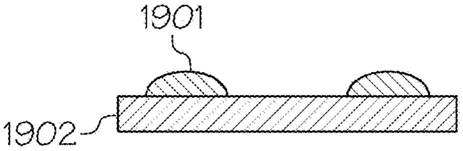
FIGS. 19A-19D depict cross-sectional views for the Ru mini-mesh patterning process using the modified Jet and Flash imprint lithography with sparse inkjet drops using the steps described in FIG. 18.

Referring to FIG. 18, in conjunction with FIGS. 19A-19D, in step 1801, the sparse resist drops 1901 are dispensed on a substrate 1902 using an inkjet as shown in FIG. 19A.

Figure 19B:
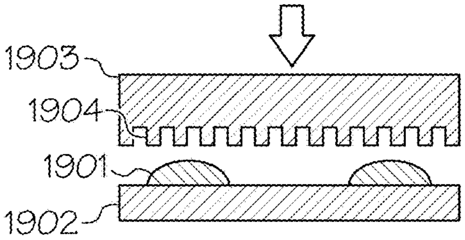
Figure 20A:
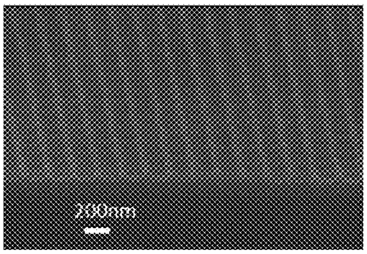
FIGS. 20A-20C illustrate the tilted cross-section SEM and top-down optical microscope images of the resist pattern after the sparse drops imprint in accordance with an embodiment of the present invention.
Figure 20B:
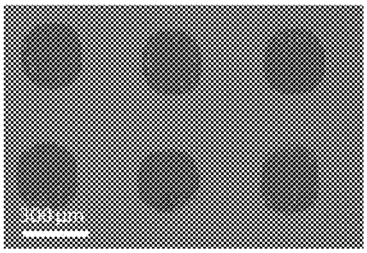
Figure 20C:
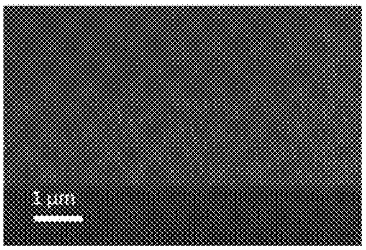

In step 1802, a template 1903 is placed on sparse resist drops 1901 to fill the capillaries (openings) 1904 of template 1903 as shown in FIG. 19B.

Figure 19C:
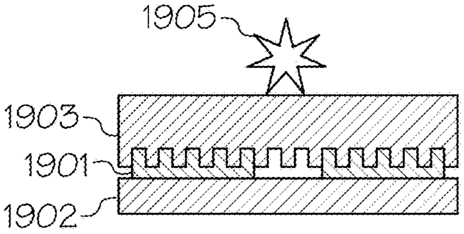

In step 1803, an ultraviolet (UV) flash is applied, such as from a UV lamp 1905, to cure the resist 1901 as shown in FIG. 19C.

Figure 19D:
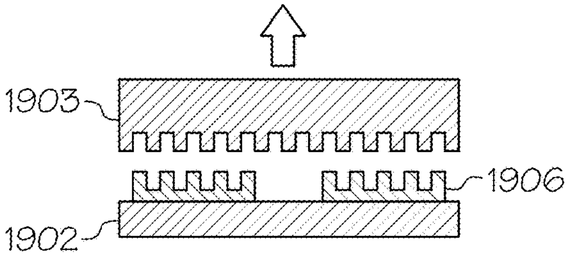

In step 1804, template 1903 is separated from resist 1901 thereby forming a pattern 1906 as shown in FIG. 19D.

Referring now to FIGS. 20A-20C, FIG. 20A illustrates the center of the cross-section scanning electron microscope (SEM) image of the resist pattern after the sparse drops imprint. FIG. 20B illustrates the cross-section SEM image of the resist pattern after the sparse drops imprint. FIG. 20C illustrates the edge of the cross-section scanning electron microscope (SEM) image of the resist pattern after the sparse drops imprint.

In another embodiment, certain regions of catalyst are masked during CICE to reduce total catalyst surface area exposed to CICE etchant. Here "masking" implies covering the catalyst with a material that is resistant to CICE etchant chemistries, and can include materials such as polymers, photoresists, electron-beam resists, carbon, aluminum oxide, chromium, etc. The masked catalyst areas are etched with CICE (first CICE), subsequently, after the first CICE process is complete and the first etched structures are masked or the catalyst removed in those areas, and a second CICE is performed on the catalyst areas that were masked during first CICE. The patterned catalyst in the first CICE and the patterned catalyst in the second CICE steps may or may not be connected to each other. In one embodiment, intentional discontinuities between the catalysts in the first and second CICE are patterned, such as streets with no catalyst. In another embodiment, the CICE etchant is selectively dispensed on local areas of patterned catalyst, with the local areas smaller than the entirety of the patterned catalyst area. In another embodiment, the patterned catalyst is partially covered by a mask material and then subjected to CICE. In another embodiment, the mini-meshes are created as stated above and then the entire substrate is covered with a mask material which is followed by a patterning step to open up the mini-mesh areas and leave the mask on the rest of the wafer surface. This patterning step could optionally cover the boundary regions of the min-mesh thereby having a small overlap between the mini-mesh region and the mask region.

Film stresses: At the catalyst/substrate interface, film stresses and interfacial stresses may affect the CICE reaction rates and porosity. The film and interfacial stresses are optimized to reduce porosity during CICE. In one embodiment, the substrate preparation, substrate surface energy, catalyst deposition method—including deposition process, rate and temperature, catalyst patterning method, catalyst pattern, and post-patterning surface treatments—such as annealing—are used to control film and interface stresses.

Plasma treatment of catalyst: The catalytic activity can be modified using plasma treatment. The plasma recipe and plasma time is experimentally determined based on porosity observed after catalyst influenced chemical etch. In one embodiment, the plasma recipe contains one or more of the following gases: Ar, He, $O_2$, $H_2$, $CF_4$, $SF_6$, $Cl_2$, $CH_xF_y$, $N_2$, CO, $CO_2$, $BCl_3$, $CH_4$, $SiH_4$, $C_4F_8$. The plasma treatment can be performed as a separate step after catalyst patterning. In one embodiment, Ru is used as a catalyst for CICE of Si, and patterned Ru is exposed to an Ar/$CF_4$ plasma. In another embodiment, the plasma treatment is performed as part of an etch step during patterning of the catalyst. In one embodiment, Ru is used as a catalyst for CICE of Si, and etch mask used on top of Ru is etched using an Ar/$CF_4$ plasma, thereby exposing Ru underneath to mask etch plasma. In one embodiment, shown in FIGS. 21A-21D, the effect of plasma treatment of Ru catalyst for CICE of low-doped silicon is shown.

Figure 21A:
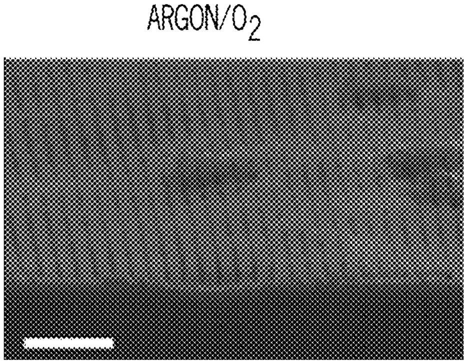
FIGS. 21A-21D illustrate the effect of plasma used in the descum etch on the Ru mini-mesh CICE which causes different results in the whole mini-mesh with relatively effect-free edge areas in accordance with an embodiment of the present invention.
Figure 21B:
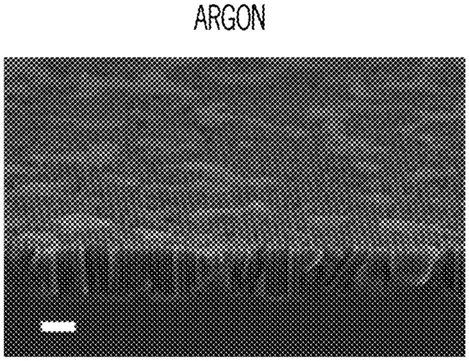
Figure 21C:
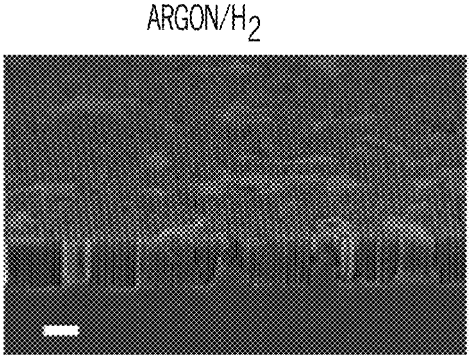
Figure 21D:
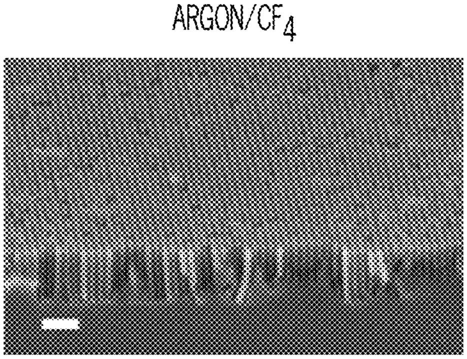

FIGS. 21A-21D illustrate the effect of plasma used in the descum etch on the Ru mini-mesh CICE which causes different results in the whole mini-mesh with relatively effect-free edge areas in accordance with an embodiment of the present invention. All the scale bars are 1 micrometer in length. FIG. 21A illustrates the effect of the plasma used in the descum etch using Argon/$O_2$. FIG. 21B illustrates the effect of the plasma used in the descum etch using Argon. FIG. 21C illustrates the effect of the plasma used in the descum etch using Argon/$H_2$. FIG. 21D illustrates the effect of the plasma used in the descum etch using Argon/$CF_4$.

In another embodiment, plasma treatment of the catalyst can enable reducing defects caused during CICE. In another embodiment, plasma treatment varied across the catalyst, resulting in programmable porosity and/or etch depth in selected regions on the substrate, by exposing selected regions of the catalyst to different plasma treatments. The plasma treatments may be applied by masking certain areas of the catalyst, or using a focused plasma or ion beam. In one embodiment, the time and sequence of processes between plasma treatment of catalyst and CICE are optimized to ensure desired CICE etch properties, such as substrate porosity. In one embodiment, the effect of plasma modification of the catalytic activity changes with time after plasma modification, and CICE is performed at the optimal time after plasma modification. In one embodiment, the optimal time is less than 15 minutes.

UV treatment of catalyst: The catalytic activity can be modified using ion beams, UV, Vacuum UV, IR, X-ray, etc. treatment of the catalyst. In one embodiment, the catalytic activity can be modified using UV treatment of the catalyst surface by itself, or in the presence of catalytic activity modifying materials, such as gaseous or spincoated chemistry. The catalytic activity modifying materials contain one or more of the following: (i) polymers, such as acrylates, UV-curable polymers, fluorinated polymers; (ii) gases, such as oxygen, fluorine, helium, argon, hydrogen, $CF_4$, $SF_6$, formic acid, acetic acid, (iii) chemicals, such as fluorinated surfactants. In one embodiment, the UV light process is performed as a part of a lithography step during patterning of the catalyst. In another embodiment, the catalytic activity modifying materials are deposited on the catalyst prior to exposure to UV. In another embodiment, the catalyst is exposed simultaneously to the catalytic activity modifying materials and UV light, e.g., UV light in the presence of $CF_4$, $H_2$ and Ar. In one embodiment, the UV light process is performed as a separate step before catalyst influenced chemical etching, where the materials in the lithography step are modified to contain catalytic activity modifying materials. In another embodiment, UV treatment is varied across the catalyst, resulting in programmable porosity and/or etch depth in selected regions on the substrate, by exposing selected regions of the catalyst to UV in the presence of catalytic activity modifying materials. The UV treatments may be applied by masking certain areas of the catalyst using lithography or shining UV through a mask.

Catalyst material: The catalyst material can be an alloy of two or more elements to enable CICE to create nanostructures with desired porosity. Combinatorial sputtering or co-sputtering can be used to test various alloy materials and compositions to determine ideal catalyst behavior. In one embodiment, the catalyst is comprised of $Ru_xCr_yC_z$.

Substrate material: The doping type, doping concentration and substrate material can be chosen to reduce porosity, based on application design and material requirements.

Etchant phase: The CICE etchants can be in the following phases: liquid, vapor, gel, plasma. In one embodiment, high aspect ratio non-porous silicon nanostructures are achieved using platinum/platinum silicide with a vapor based CICE process, as discussed in Romano, Lucia, Matias Kagias, Joan Vila-Comamala, Konstantins Jefimovs, Li-Ting Tseng, Vitaliy A. Guzenko, and Marco Stampanoni. "Metal Assisted Chemical Etching of Silicon in the Gas Phase: A Nanofabrication Platform for X-Ray Optics," Nanoscale Horizons, Vol. 5, No. 5, 200, pp. 869-879, which is incorporated by reference herein in its entirety. In one embodiment, Ru is used as a catalyst with vapor phase etchants for CICE. In another embodiment, vapor based CICE is used to etch small closed patterns, such as circular holes, with low or no etch stalling (due to the higher transport rate of the vapor phase etchants compared to liquid phase etchants).

Substrate/catalyst interface: The catalyst/substrate interface can be optimized to enable reduction in porosity. In one embodiment, the catalyst is annealed to create a silicide for CICE. In another embodiment, the catalyst is deposited on an interfacial material. In one embodiment, a native oxide layer is the interfacial material.

Protecting layers during catalyst patterning: Patterning of the catalyst may use UV light or other wavelength light for lithography, and plasma etching for pattern transfer. A protecting layer on the catalyst can be used to avoid undesired changes to catalytic activity during patterning. Protecting layers include C, SiN, SiO2, TiN, Cr, etc. In one embodiment, desired catalytic activity modifying processes can be integrated into the catalyst patterning process. In another embodiment, plasma etching of the catalyst can include desired gases in the etch recipe. Also, a post process step after catalyst patterning can be used to modify the final catalytic activity of the catalyst to desired levels prior to CICE. In another embodiment, the Ru plasma etch is modified to include catalytic activity modifying chemistry. In one embodiment, Ru is protected using SiN or C during the $O_2$ plasma exposure.

Alternating porous/non-porous layers using plasma and CICE: In one cycle, plasma can be used to increase catalytic activity. The catalyst and substrate are then exposed to CICE etchant in vapor form (or liquid form) to form a porous layer of nanostructures. A plasma is then used to decrease catalytic activity. The catalyst and substrate are then exposed to CICE etchant in vapor form (or liquid form) to form a non-porous layer of nanostructures. Repeating these cycles can enable alternating porous/non-porous layered nanostructures.

Catalyst activity modification for etch depth control: In one embodiment, locally varying plasma treatment is used in non-uniform pattern areas to modify catalyst activity and therefore etch rates.

Method of removal of etch mask after catalyst patterning: In one embodiment, the photolithography is used to pattern a trilayer resist layer on a catalyst film. The resist is used as an etch mask to transfer the pattern into the catalyst film using methods, such as plasma etching, atomic layer etching, wet etching, ion milling, etc. In one embodiment, after pattern transfer into the catalyst film, the etch mask is removed using wet processing, such as a piranha solution, or using plasma that does not contain oxygen plasma. In one embodiment, photolithography is used to pattern a Ru catalyst film, and the photoresist and other films used in photolithography are removed using plasma recipes that do not contain oxygen gas.

In one embodiment, these process variables are controlled for low doped p-type silicon with Ruthenium as a catalyst. Ruthenium is already used in semiconductor fabs as a barrier metal for interconnects and is listed in IRDS roadmaps as the next metal for future generation metal interconnects in logic devices, and as a metal electrode for DRAM capacitors. Thus, there is a semiconductor ecosystem already in place for Ruthenium thin film deposition with high yield and low defectivity, and patterning and etch of sub-20 nm features in Ru. In one embodiment, a Ru-CICE process is used that can leverage recent developments for integration of Ru in CMOS devices, thereby resulting in a "drop-in" CICE process in CMOS fabs.

In one embodiment, CICE is utilized to etch a semiconducting material with one or more layers of materials on the semiconducting material. A catalyst layer is one of the said one or more layers. The catalyst could be exposed to a process that modifies the catalytic activity of the catalyst (as described above). The following could also be one of the said one or more layers: Ru, Au, Pt, Pd, Ag, Cu, Ni, W, TiN, Graphene, Carbon, Cr, $SiO_2$, and Ti.

In one embodiment, Ru is patterned using nanoimprint lithography and etched using a wet etch. In one embodiment, undesirable porosity in Ru CICE is reduced by changing the catalytic activity of Ru in the CICE cathodic reaction. The resulting optimal Ru CICE process is shown in FIGS. 22A-22F, and is comprised of the following features: (i) mini-meshes: Local Ru mini-meshes were used, instead of full coverage of the silicon wafer with patterned Ru, to reduce the area of Ru participating in the cathodic reaction, and (ii) Ar/CF4 plasma: The plasma chemistry and etch time during the resist descum step plays a critical role in Ru catalytic activity, with enhanced Ru catalytic activity for oxygen plasma, and reduced activity for Ar/CF4 plasma and other plasma chemistries that do not contain oxygen (yet are able to perform resist descum, such as Ar, Ar/H2). Exposure of Ru to a long (30 s) Ar/CF4 plasma during resist etch resulted in improved Ru CICE thereby creating non-porous, high aspect ratio anisotropic silicon etch with characteristics comparable to Au CICE.

Figure 22A:
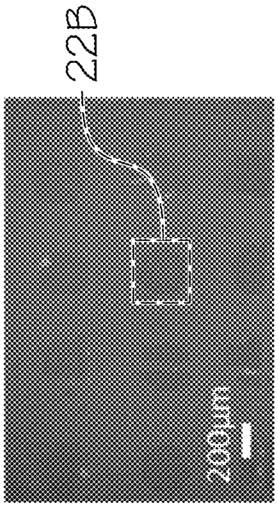
FIGS. 22A-22F illustrates the desired CICE results with the Ru mini-mesh which are obtained using a long Ar/CFr plasma for descum etch in accordance with an embodiment of the present invention.
Figure 22B:
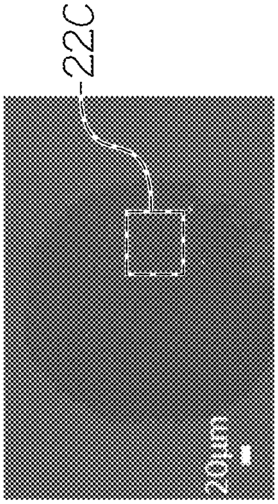
Figure 22C:
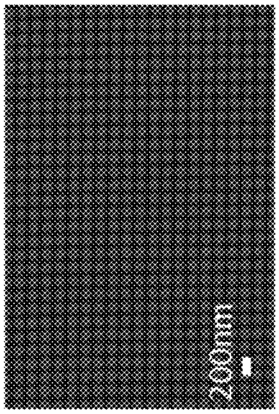
Figure 22D:
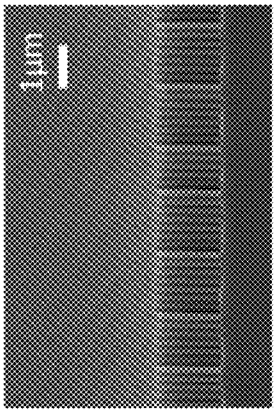
Figure 22E:
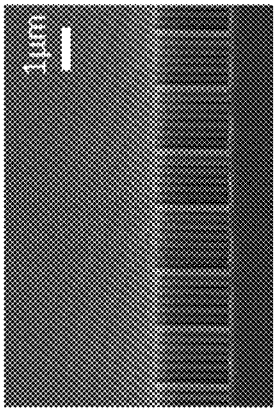
Figure 22F:
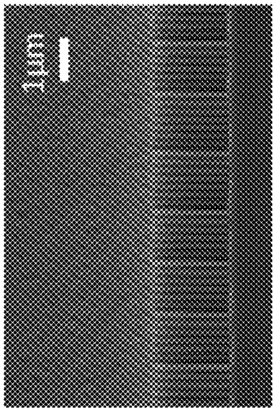

FIGS. 22A-22F illustrates the desired CICE results with the Ru mini-mesh which are obtained using a long Ar/CFr plasma for descum etch in accordance with an embodiment of the present invention. FIG. 22A illustrates a top-down SEM image showing defect free silicon nanowires at the magnification of 200 micrometers. FIG. 22B illustrates a top-down SEM image showing defect free silicon nanowires at the magnification of 20 micrometers. FIG. 22C illustrates a top-down SEM image showing defect free silicon nanowires at the magnification of 200 nanometers. FIGS. 22D-22F illustrate tilted cross-section SEM images at different locations in the mini-meshes showing uniform defect-free Ru CICE.

A discussion regarding the collapse-avoidance in CICE-etched nanostructures is now deemed appropriate.

Details regarding the collapse-avoidance in CICE-etched nanostructures is discussed in A. Mallavarapu, P. Ajay, S. V. Sreenivasan, "Enabling Ultra-High Aspect Ratio Silicon Nanowires Using Precise Experiments for Detecting Onset of Collapse," Nano Letters 2020, 20 (11), 7896-7905, which is incorporated herein in its entirety, as well as Khorasaninejad, M.; Abedzadeh, N.; Singh Jawanda, A.; O, N.; Anantram, M. P.; Singh Saini, S. "Bunching Characteristics of Silicon Nanowire Arrays," Journal of Applied Physics, Vol. 111, No. 4, 2012, 044328, which is incorporated herein in its entirety.

In one embodiment, the collapse of CICE-etched nanostructures can be delayed or eliminated by using "collapse-avoiding caps" or "collapse-avoiding features" on the tips of the nanostructures. In one embodiment, the collapse-avoiding caps prevent collapse by electrostatic repulsion between the nanostructures. In another embodiment, the collapse-avoiding caps are provided on the tips of nanostructures made by plasma etching.

In one embodiment, over-sized nanowires are made with CICE using nanoimprint lithography and gold as a catalyst. For nanowires separated by gaps less than 30 nm, the nanowires stay uncollapsed for much higher heights than predicted by conventional collapse theory as shown in FIGS. 23A-23C.

Figure 23A:
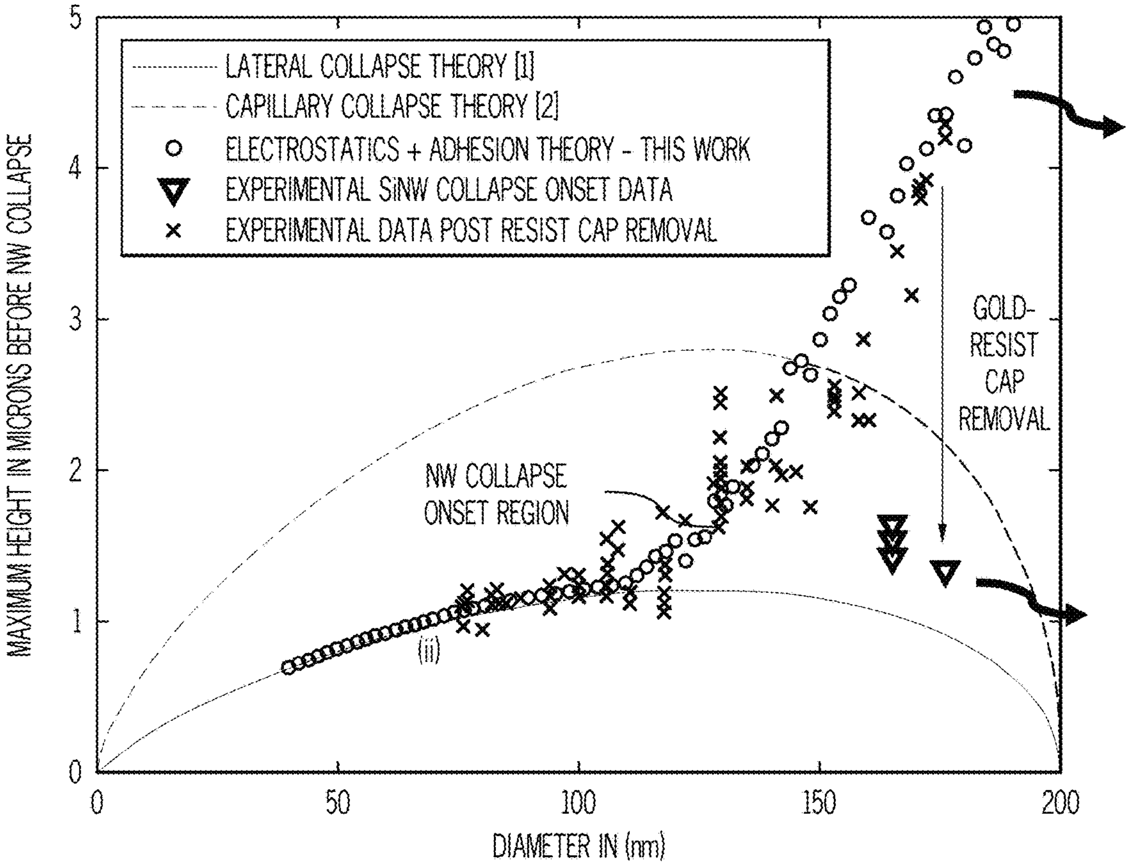
FIG. 23A is a plot of the maximum height in micrometers before nanowire collapse versus the diameter in nanometers in accordance with an embodiment of the present invention.
Figure 23B:
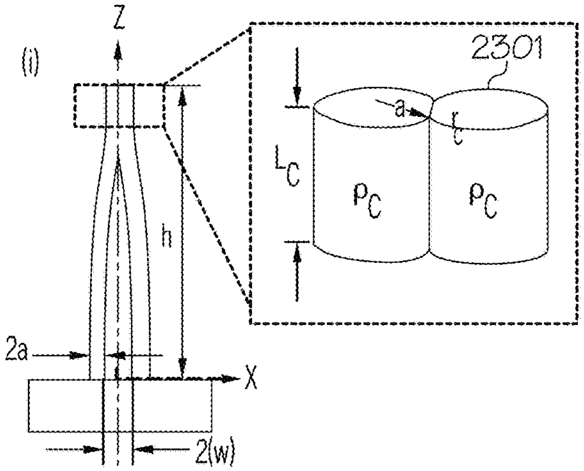
FIG. 23B is a schematic illustration of a pair of collapsed charged nanowires in accordance with an embodiment of the present invention.
Figure 23C:
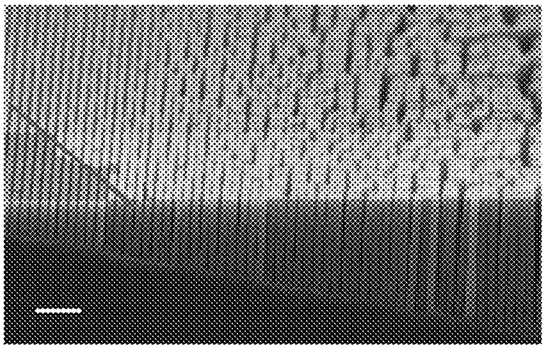
FIG. 23C illustrates a titled cross-section SEM image of oversized silicon nanowires after removal of gold-resist caps in accordance with an embodiment of the present invention.

FIG. 23A is a plot of the maximum height in micrometers before nanowire collapse versus the diameter in nanometers in accordance with an embodiment of the present invention. In particular, FIG. 23A is a plot with modifications to the lateral collapse theory model to include electrostatic repulsion and the effect of the removal of gold-resist caps on oversized nanowire collapse. FIG. 23B is a schematic illustration of a pair of collapsed charged nanowires in accordance with an embodiment of the present invention. FIG. 23C illustrates a titled cross-section SEM image of oversized silicon nanowires after removal of gold-resist caps in accordance with an embodiment of the present invention. The scale bar is 1 micrometer.

The data suggests that there might be additional repulsive forces, not accounted for in the models, for small gaps between the wires, that cause the observed anomalous high critical heights. In one embodiment, these repulsive forces between nanowires could likely be due to electrostatic effects, arising from charges that are present in the resist-gold caps of the nanowires, or within the silicon nanowires and nanowire surfaces. When the collapse-avoiding caps were removed, the critical collapse height drops to values close to the adhesion theory predictions as shown in FIGS. 23A-23C. The observed trend with oversized nanowire collapse disagrees with the trend predicted by lateral collapse theory (nanowire collapse height increases instead of decreasing with increase in NW diameter). In one embodiment, a theoretical collapse model including electrostatic forces was used to predict and design structures to maximize non-collapse. In this model, the lateral collapse model (which is discussed in Glassmaker, N J, A Jagota, C-Y Hui, and J Kim. "Design of Biomimetic Fibrillar Interfaces: 1. Making Contact." J. R. Soc. Interface 1, No. 1, Nov. 22, 2004, pp. 23-33, which is incorporated herein in its entirety) was modified to include charges near the top of the nanowires. Consider the nanowires shown in FIG. 23B, where the nanowires 2301 have collapsed and have a contact length of L. In one embodiment, it is assumed that nanowires 2301 each carry an average volumetric charge density $\rho_{c,avg}$ that resides near the top of nanowires 2301 (within and up to $L_c$ in the current analysis). In the lateral collapse model, the estimation of adhesion energy and elastic deformation of the region of contact between the nanowires requires calculating the contact width. Johnson-Kendall-Roberts (JKR) theory of adhesion is used to predict the equilibrium contact width for two identical cylinders subject to no external force. In one embodiment, this model was modified to include coulombic repulsion due to electrostatics as an external force P per unit length, leading to an updated JKR model in Equation (1):

$$P = \frac{\pi E^* r_c^2}{4n} - \sqrt{2 r_c \pi E^* \gamma_s} \tag{1}$$

$$\text{where, } P \cong -k_e \frac{(\pi a^2 L_c \rho_{c,avg})(\pi a^2 L_c \rho_{c,avg})}{(2a)^2} * \frac{1}{L_c}$$

with P as the external force per unit length Lc, contact length $r_c$, diameter 2a, $E^*=E/(1-v^2)$, elastic modulus E, Poisson's ratio v, spacing 2w, surface energy $\gamma_s$, and $\rho_c$ as charge density. The expression for P is approximate and is adequate to capture the trend seen in the experiments performed using embodiments of the present invention.

Equation (1) is solved numerically for $r_c$, and then substituted into the lateral collapse theory to derive the collapse height. In one embodiment, stochastic variation between charge densities in the oversized nanowires with gold-resist caps is included using a normal distribution. Based on this new model, we achieve a plot with the same trends as observed experimentally in FIG. 23A.

In one embodiment, silicon nanowires with a diameter to pitch ratio >0.6, separated by gaps <30 nm, are used with collapse avoiding caps made of gold and resist that do not collapse for unexpectedly large nanowire heights.

The principles of the present invention provide two important contributions: (1) a process to achieve ultra-high aspect ratio un-collapsed silicon nanowires that enables ~4.5× improvement in maximum aspect ratio than predicted by known models, and (2) a modified lateral collapse model that includes an electrostatic repulsion component that matches the observed experimental results.

In one embodiment, the collapse avoiding caps contain one or more of the following: insulating, semiconducting, and conducting material. The collapse avoiding cap material and thickness are optimized to maximize repulsion and enable highest uncollapsed aspect ratios achievable.

FIGS. 24, 25A-25D, 26A-26D, 27, 28A-28B, 29A-29B, 30, 30A-30D, and 31A-31D show the processes for fabricating arbitrary free-standing high aspect ratio nanostructures having collapse-avoiding caps in accordance with an embodiment of the present invention.

Figure 24:
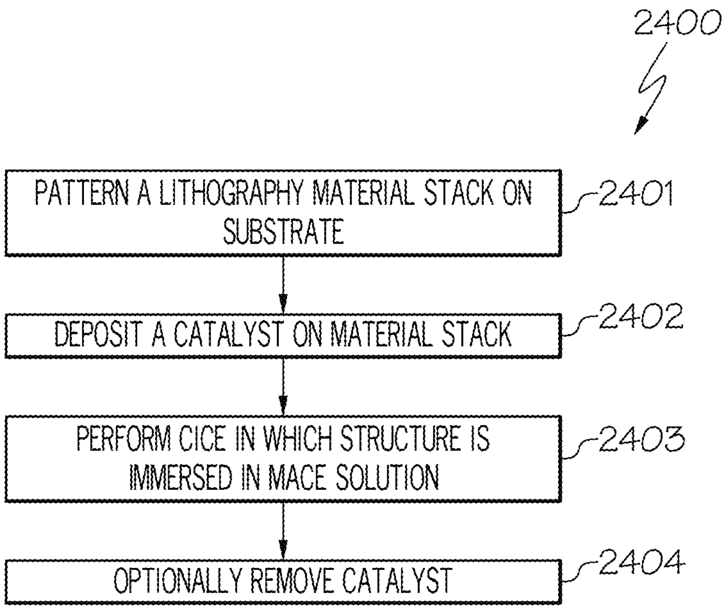
FIG. 24 is a flowchart of a method for fabricating arbitrary free-standing high aspect ratio nanostructures having collapse-avoiding caps in accordance with an embodiment of the present invention.

Referring now to FIG. 24, FIG. 24 is a flowchart of a method 2400 for fabricating arbitrary free-standing high aspect ratio nanostructures having collapse-avoiding caps in accordance with an embodiment of the present invention. FIGS. 25A-25D depict top-down views for fabricating arbitrary free-standing high aspect ratio nanostructures having collapse-avoiding caps using the steps described in FIG. 24 in accordance with an embodiment of the present invention. FIGS. 26A-26D depict cross-sectional views for fabricating arbitrary free-standing high aspect ratio nanostructures having collapse-avoiding caps using the steps described in FIG. 24 in accordance with an embodiment of the present invention.

Figure 25A:
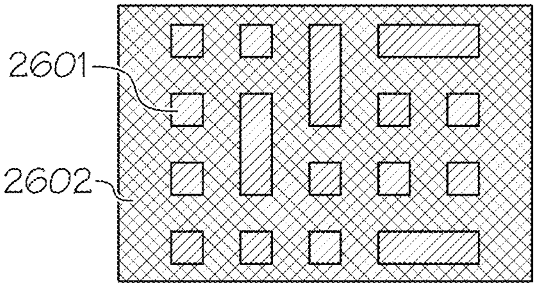
FIGS. 25A-25D depict top-down views for fabricating arbitrary free-standing high aspect ratio nanostructures having collapse-avoiding caps using the steps described in FIG. 24 in accordance with an embodiment of the present invention.
Figure 26A:
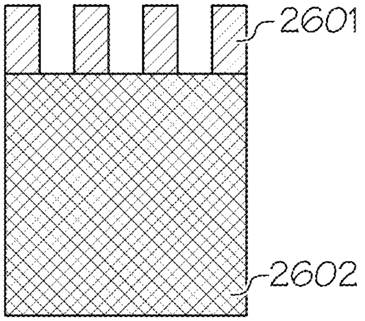
FIGS. 26A-26D depict cross-sectional views for fabricating arbitrary free-standing high aspect ratio nanostructures having collapse-avoiding caps using the steps described in FIG. 24 in accordance with an embodiment of the present invention.

Referring to FIG. 24, in conjunction with FIGS. 25A-25D and 26A-26D, in step 2401, a lithography material stack 2601 is patterned on a substrate 2602 as shown in FIGS. 25A and 26A. In one embodiment, lithography material stack 2601 includes collapse avoiding materials.

Figure 25B:
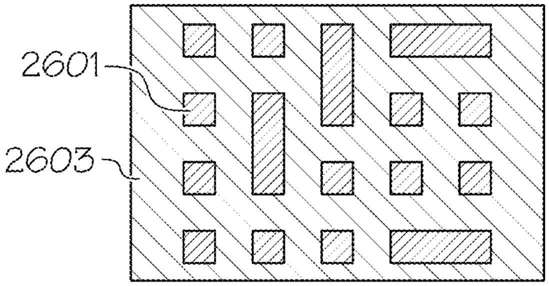
Figure 26B:
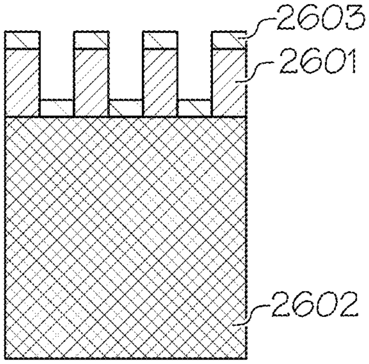

In step 2402, a catalyst 2603 is deposited on material stack 2601, such as shown in FIGS. 25B and 26B.

Figure 25C:
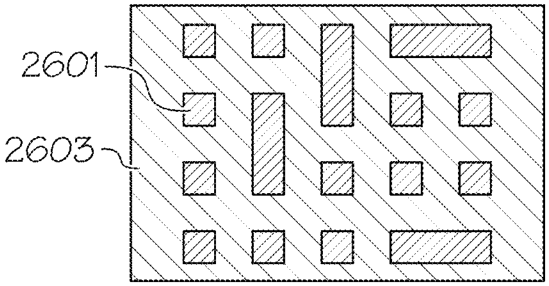
Figure 26C:
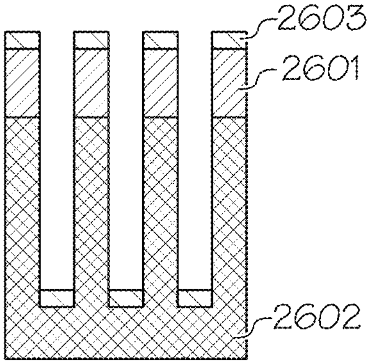

In step 2403, CICE is performed in which the structure of FIGS. 25B and 26B is immersed in a MACE solution resulting in a structure as shown in FIGS. 25C and 26C. In one embodiment, the patterned wafer is immersed in a MAC solution of 12.5 moles HF and 1 mole of $H_2O_2$. In one embodiment, the etch can be quenched in a wafer and subsequently rinsed with water and dried with an air gun supplying clean dry air (CDA).

Figure 25D:
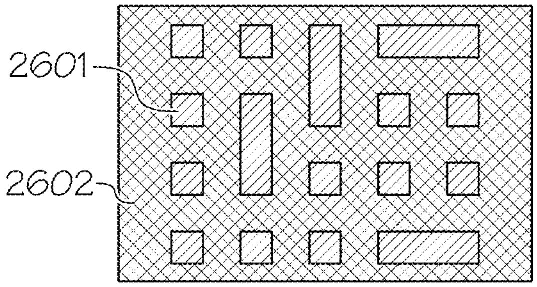
Figure 26D:
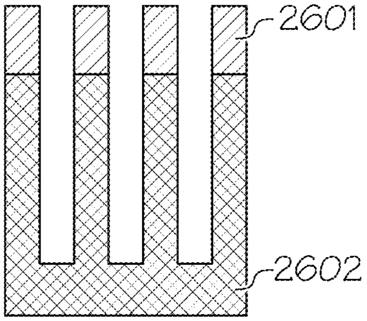

In step 2404, catalyst 2603 is optionally removed as shown in FIGS. 25D and 26D. In one embodiment, catalyst 2603 (e.g., gold catalyst) can be optionally removed using a Transene™ potassium iodide-based gold etchant. The remaining resist can be optionally removed using a short oxygen plasma.

Figure 27:
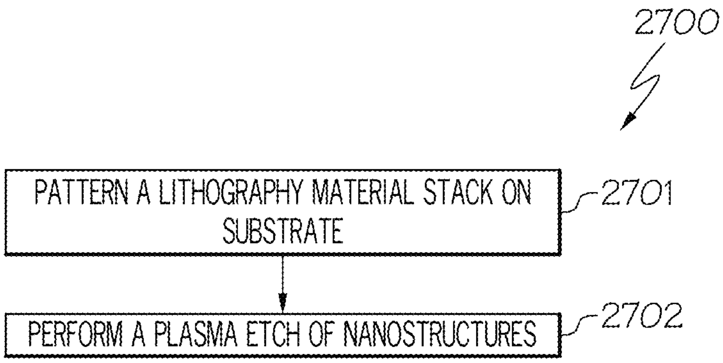
FIG. 27 is a flowchart of an alternative method for fabricating arbitrary free-standing high aspect ratio nanostructures having collapse-avoiding caps in accordance with an embodiment of the present invention.

Referring now to FIG. 27, FIG. 27 is a flowchart of an alternative method 2700 for fabricating arbitrary free-standing high aspect ratio nanostructures having collapse-avoiding caps in accordance with an embodiment of the present invention. FIGS. 28A-28D depict top-down views for fabricating arbitrary free-standing high aspect ratio nanostructures having collapse-avoiding caps using the steps described in FIG. 27 in accordance with an embodiment of the present invention. FIGS. 29A-29D depict cross-sectional views for fabricating arbitrary free-standing high aspect ratio nanostructures having collapse-avoiding caps using the steps described in FIG. 27 in accordance with an embodiment of the present invention.

Figure 28A:
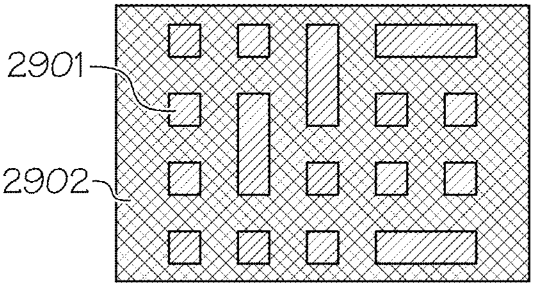
FIGS. 28A-28B depict top-down views for fabricating arbitrary free-standing high aspect ratio nanostructures having collapse-avoiding caps using the steps described in FIG. 27 in accordance with an embodiment of the present invention.
Figure 29A:
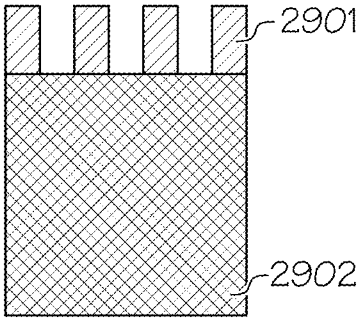
FIGS. 29A-29B depict cross-sectional views for fabricating arbitrary free-standing high aspect ratio nanostructures having collapse-avoiding caps using the steps described in FIG. 27 in accordance with an embodiment of the present invention.

Referring to FIG. 27, in conjunction with FIGS. 28A-28B and 29A-29B, in step 2701, a lithography material stack 2901 is patterned on a substrate 2902 as shown in FIGS. 28A and 29A. In one embodiment, lithography material stack 2901 includes collapse avoiding materials.

Figure 28B:
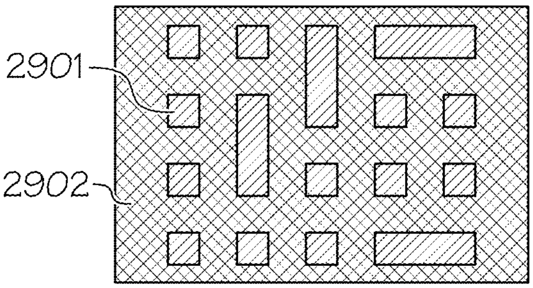
Figure 29B:
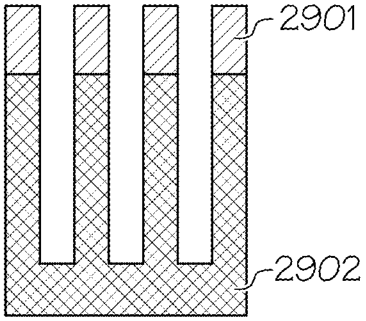

In step 2702, a plasma etch is performed of the nanostructures as shown in FIGS. 28B and 29B resulting in the structure of FIGS. 28B and 29B.

Figure 30:
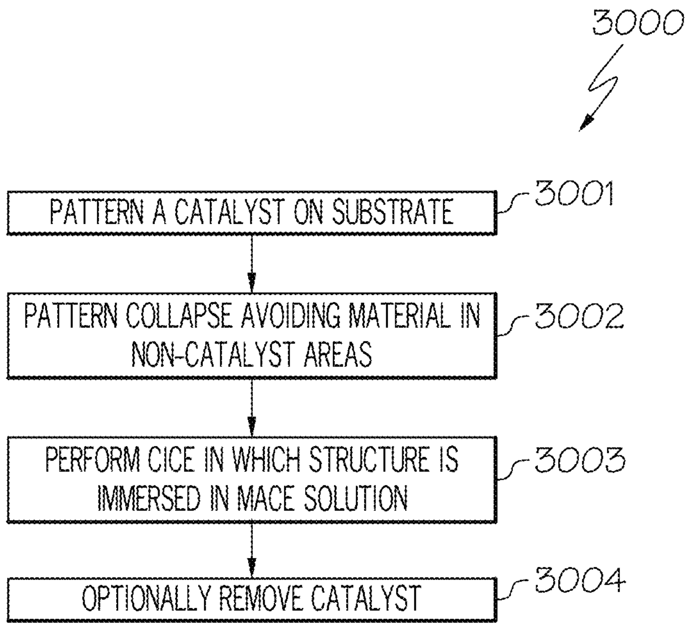
FIG. 30 is a flowchart of an alternative method for fabricating arbitrary free-standing high aspect ratio nanostructures having collapse-avoiding caps in accordance with an embodiment of the present invention.

Referring now to FIG. 30, FIG. 30 is a flowchart of an alternative method 3000 for fabricating arbitrary free-standing high aspect ratio nanostructures having collapse-avoiding caps in accordance with an embodiment of the present invention. FIGS. 31A-31D depict top-down views for fabricating arbitrary free-standing high aspect ratio nanostructures having collapse-avoiding caps using the steps described in FIG. 30 in accordance with an embodiment of the present invention. FIGS. 32A-32D depict cross-sectional views for fabricating arbitrary free-standing high aspect ratio nanostructures having collapse-avoiding caps using the steps described in FIG. 30 in accordance with an embodiment of the present invention.

Figure 31A:
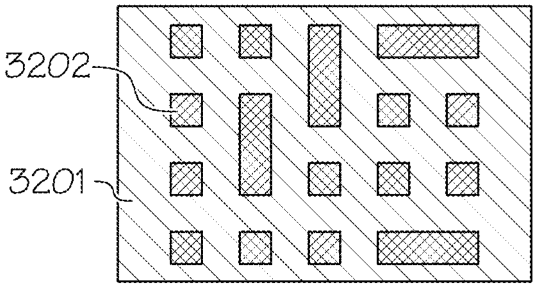
FIGS. 31A-31D depict top-down views for fabricating arbitrary free-standing high aspect ratio nanostructures having collapse-avoiding caps using the steps described in FIG. 30 in accordance with an embodiment of the present invention.
Figure 32A:
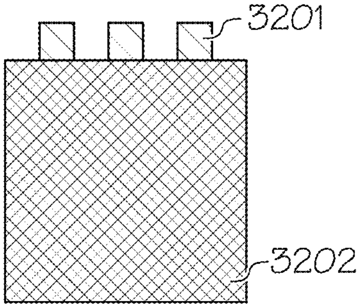
FIGS. 32A-32D depict cross-sectional views for fabricating arbitrary free-standing high aspect ratio nanostructures having collapse-avoiding caps using the steps described in FIG. 30 in accordance with an embodiment of the present invention.

Referring to FIG. 30, in conjunction with FIGS. 31A-31D and 32A-32D, in step 3001, a catalyst 3201 is patterned on a substrate 3202 as shown in FIGS. 31A and 32A.

Figure 31B:
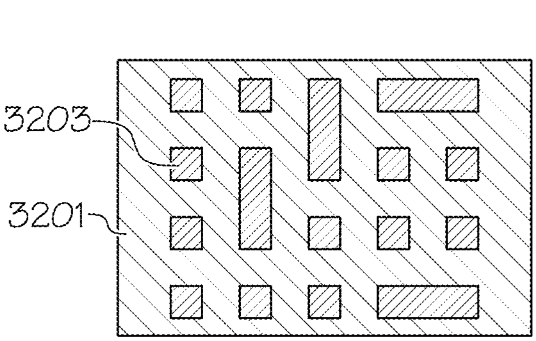
Figure 32B:
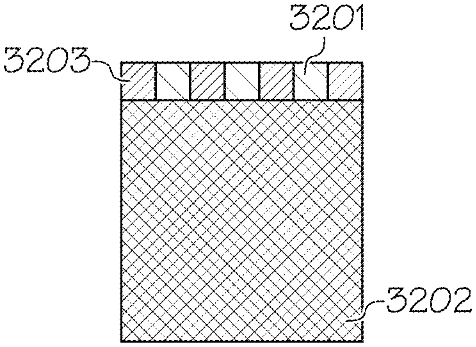

In step 3002, collapse avoiding material 3203 is patterned in the non-catalyst areas as shown in FIGS. 31B and 32B.

Figure 31C:
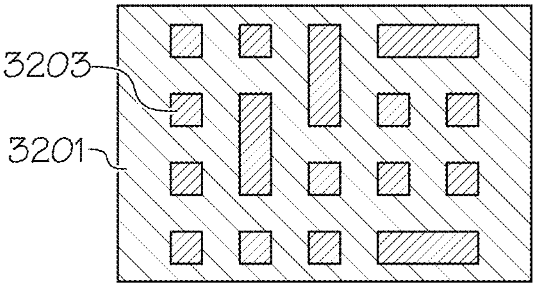
Figure 32C:
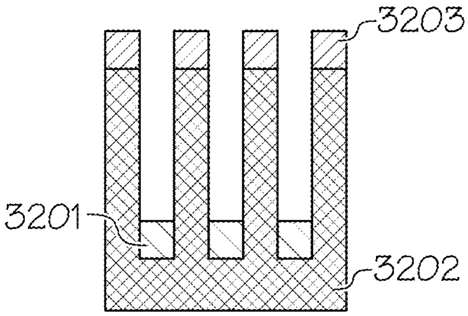

In step 3003, CICE is performed in which the structure of FIGS. 31B and 32B is immersed in a MACE solution resulting in a structure as shown in FIGS. 31C and 31C. In one embodiment, the patterned wafer is immersed in a MAC solution of 12.5 moles HF and 1 mole of $H_2O_2$. In one embodiment, the etch can be quenched in a wafer and subsequently rinsed with water and dried with an air gun supplying clean dry air (CDA).

Figure 31D:
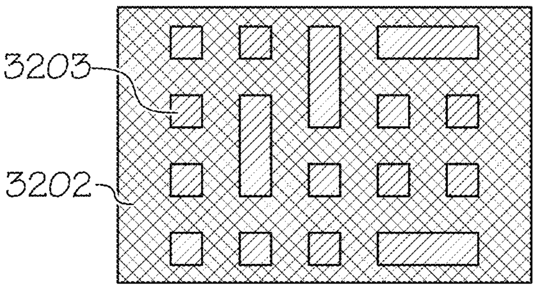
Figure 32D:
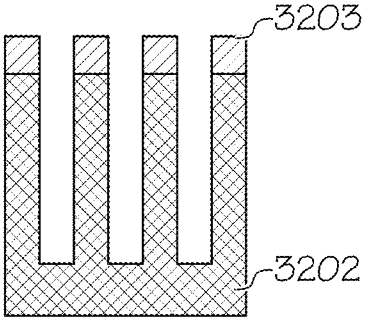

In step 3004, catalyst 3201 is optionally removed as shown in FIGS. 31D and 32D. In one embodiment, catalyst 3201 (e.g., gold catalyst) can be optionally removed using a Transene™ potassium iodide-based gold etchant. The remaining resist can be optionally removed using a short oxygen plasma.

With respect to FIGS. 24, 25A-25D, 26A-26D, 27, 28A-28B, 29A-29B, 30, 30A-30D, and 31A-31D, the spacing between the high aspect ratio nanostructures in one or more regions of the patterned area is less than 200 nm. In another embodiment, the spacing is less than 50 nm.

Process integration with collapse avoidance will not be discussed.

In one embodiment, the collapse avoiding caps can enable ultra-high aspect ratio nanostructures, such as silicon fins in transistors, stacked nanopillars for DRAM capacitors, silicon nanowires for nano-DLD, silicon nanostructures for metalenses, multilayer alternating stacks for 3D flash and memristors, etc. In one embodiment, these nanostructures (of any material) can be etched using plasma etching with the collapse avoiding caps as etch masks. In another embodiment, the nanostructures are made of semiconducting materials and etched with CICE, and the collapse avoiding caps are placed in areas not occupied by the patterned catalyst.

Removal of the collapse avoiding caps may result in collapse of the ultra-high aspect ratio nanostructures. In one embodiment, the integration of subsequent process steps to stabilize the high aspect ratio nanostructures prior to removal of the collapse avoiding caps is performed.

In one embodiment, material is deposited in regions around the nanostructures prior to the collapse avoiding cap removal.

With respect to CMOS devices, CMOS scaling has been employed in the semiconductor industry to improve chip performance, reduce power consumption and enhance functionality, typically by increasing the transistor density. This scaling occurs by releasing a new technology node every 18 months to 2 years. Transistor density is increased by reducing the dimensions of the transistors, such as gate lengths, gate oxide thickness, spacer thickness, etc. As the feature sizes decreased, new technologies, such as high-k dielectrics, metal gates, strain engineering and low-k spacer dielectrics have been employed with planar or recessed transistors. However, to improve electrostatics despite reduce area per transistor, 3D scaling in the form of FinFETs was introduced. The process of making tall, thin fins with minimal sidewall damage and no collapse has been challenging as the dimensions reduced to sub-20 nm. For sub-10 nm nodes, innovative methods of improving electrostatics using horizontal nanosheets and nanowires has been proposed.

Taller fins and/or increased number of stacked nanosheets and nanowires can improve the performance of chips and enable scaling for many nodes, for instance. Use of collapse-avoiding caps during fabrication of CMOS devices—using plasma etching or CICE, can enable making ultra-high aspect ratio nanostructures while preventing substantial collapse. Removal of the collapse avoiding caps may result in collapse of the ultra-high aspect ratio nanostructures. In one embodiment, integration of subsequent process steps to stabilize the high aspect ratio nanostructures prior to removal of the collapse avoiding caps is performed. An exemplar process flow for the integration of collapse avoiding caps and their removal for making finFETs using CICE is discussed below in connection with FIGS. 33 and 34A-34G.

Figure 33:
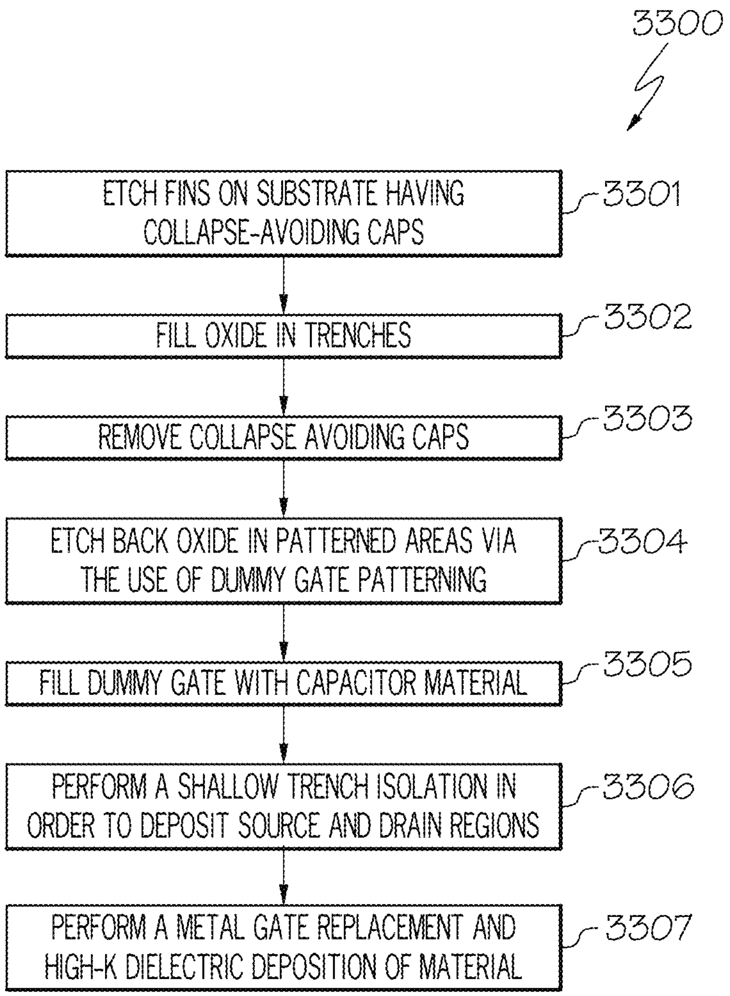
FIG. 33 is a flowchart of a method for fabricating finFETs with collapse-avoiding caps using CICE in accordance with an embodiment of the present invention.

FIG. 33 is a flowchart of a method 3300 for fabricating finFETs with collapse-avoiding caps using CICE in accordance with an embodiment of the present invention. FIGS. 34A-34G, 35A-35G and 36A-36G depict different views for fabricating finFETs with collapse-avoiding caps using CICE using the steps described in FIG. 33 in accordance with an embodiment of the present invention.

Figure 34A:
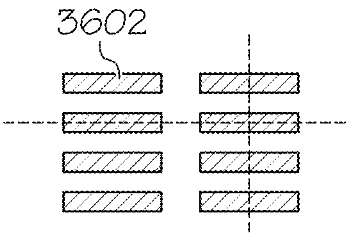
FIGS. 34A-34G, 35A-35G and 36A-36G depict different views for fabricating finFETs with collapse-avoiding caps using CICE using the steps described in FIG. 33 in accordance with an embodiment of the present invention.
Figure 35A:
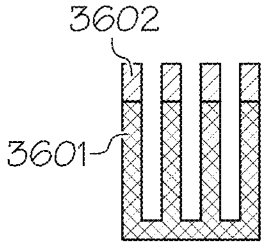
Figure 36A:
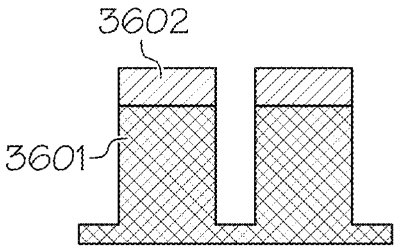

Referring to FIG. 33, in conjunction with FIGS. 34A-34G, 35A-35G and 36A-36G, in step 3301, fins 3601 are etched on substrate 3603 having collapse-avoiding caps 3602 as illustrated in FIGS. 34A, 35A and 36A.

Figure 34B:
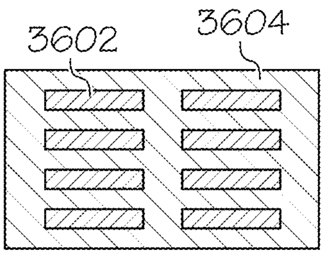
Figure 35B:
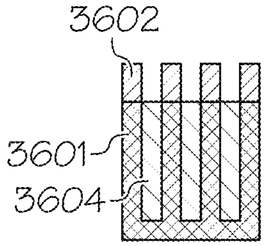
Figure 36B:
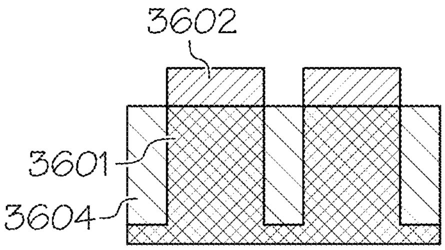

In step 3302, oxide 3604 is filled in the trenches (opposite sides of fins 3601), which is then etched back as shown in FIGS. 34B, 35B and 36B.

Figure 34C:
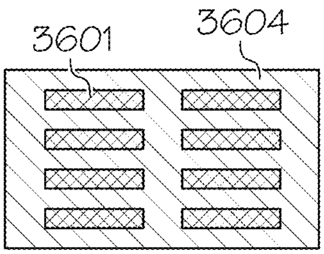
Figure 35C:
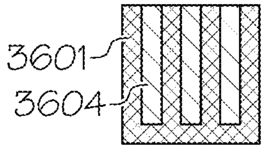
Figure 36C:
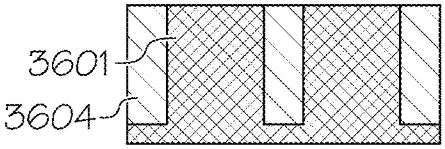

In step 3303, collapse avoiding caps 3602 are removed, such as shown in FIGS. 34C, 35C and 36C.

Figure 34D:
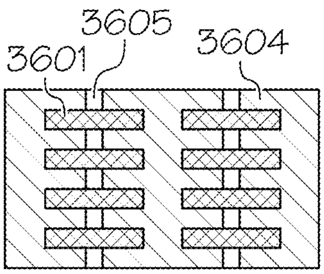
Figure 35D:
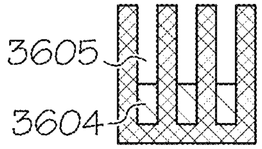
Figure 36D:
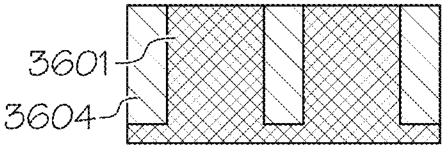

In step 3304, oxide 3604 is etched back in the patterned areas, such as via the use of a dummy gate patterning 3605, as shown in FIGS. 34D, 35D and 36D.

Figure 34E:
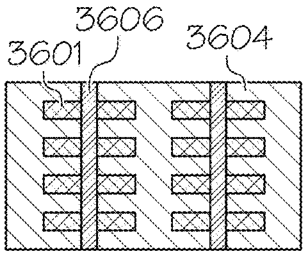
Figure 35E:
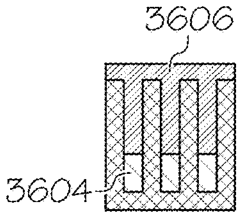
Figure 36E:
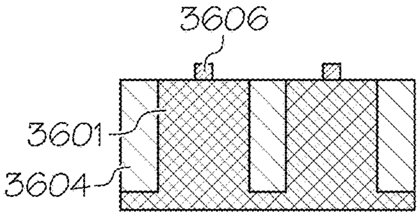
Figure 35F:
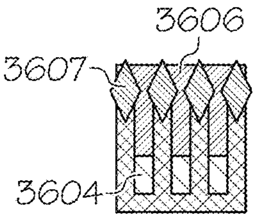
Figure 36F:
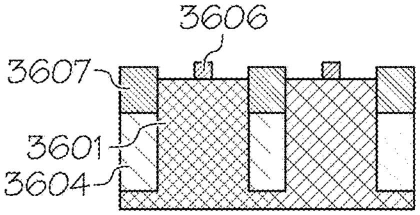

In step 3305, dummy gate 3605 is filled, such as with capacitor material 3606, as shown in FIGS. 34E, 35E and 36E.

Figure 34F:
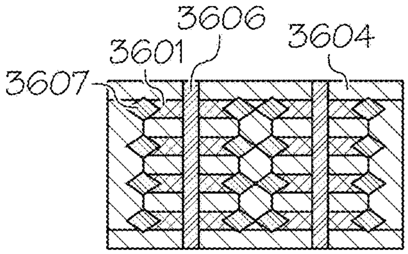
Figure 34G:
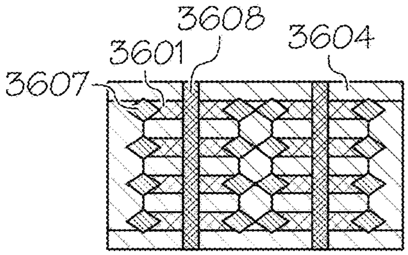
Figure 35G:
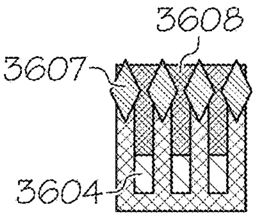
Figure 36G:
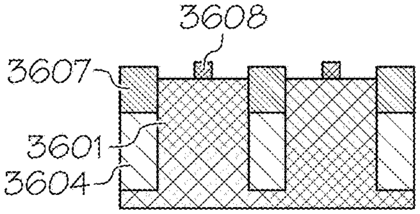

In step 3306, a shallow trench isolation is performed, such as in particular areas of oxide 3604, in order to deposit source and drain regions 3607 as shown in FIGS. 34G, 35G and 36G.

In step 3307, a metal gate replacement and high-k dielectric deposition of material 3608 is performed as shown in FIGS. 34H, 35H and 36H.

A further discussion of these and other steps of method 3300 is provided below.

In one embodiment, the fins are made of alternating layers of material for making nanosheet FETs. In another embodiment, the high aspect ratio nanostructures with collapse avoiding caps are used to prevent stacked capacitor geometries in DRAM architectures from collapsing, where capacitor material or dummy material is deposited around regions of high aspect ratio structures prior to removal of collapse-avoiding caps.

In one embodiment, the etching of the shallow trench isolation (STI) oxide is performed using vapor HF. Etching of deposited oxides using HF is temperature dependent as discussed in Wong, Man, Mehrdad M. Moslehi, and Robert A. Bowling. "Wafer Temperature Dependence of the Vapor-Phase HF Oxide Etch." Journal of the Electrochemical Society, Vol. 140, No. 1, 1993, page 205, which is incorporated by reference herein in its entirety. In one embodiment, wafer temperature is used as a knob to control the spatial variation in the STI oxide etch rate. The spatial variation control of the etch could be implemented using an in-situ real-time or offline functional metrology system, such as one based on spectrophotometry, and thermal actuators, such as thermoelectric coolers or digital micromirror devices.

With respect to nano-deterministic lateral displacement (DLD) devices, in one embodiment, a polymer is used to deposit material around the high aspect ratio nanostructures with collapse-avoiding caps, prior to removal of the collapse-avoiding caps. A cover plate is bonded anodically to the tips of the nanostructures, and then the material is removed from around the high aspect ratio nanostructures. Embodiments showing bonding of the cover plate are shown in FIGS. 37, 38A-38B, 39, 40A-40C, 41 and 42A-42E.

Figure 37:
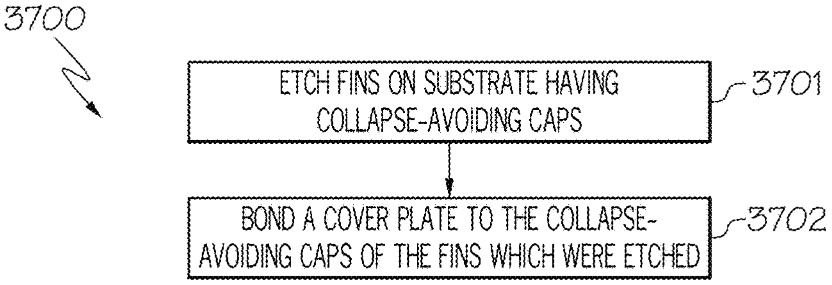
FIG. 37 is a flowchart of a method for bonding of the cover plate in accordance with an embodiment of the present invention.
Figure 38A:
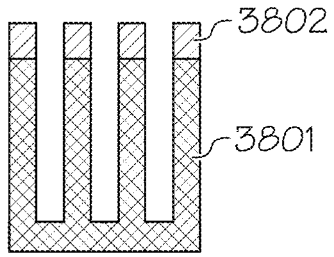
FIGS. 38A-38B depict cross-sectional views for bonding of the cover plate using the steps described in FIG. 37 in accordance with an embodiment of the present invention.
Figure 38B:
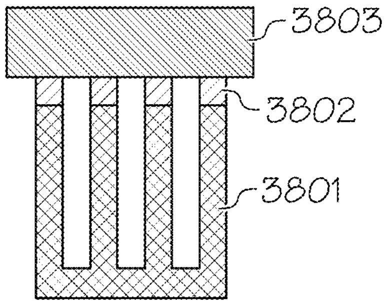

FIG. 37 is a flowchart of a method 3700 for bonding of the cover plate in accordance with an embodiment of the present invention. FIGS. 38A-38B depict cross-sectional views for bonding of the cover plate using the steps described in FIG. 37 in accordance with an embodiment of the present invention.

Referring to FIG. 37, in conjunction with FIGS. 38A-38B, in step 3701, fins 3801 are etched on substrate 3803 having collapse-avoiding caps 3802 as illustrated in FIG. 38A.

In step 3702, a cover plate 3804 is bonded to the collapse-avoiding caps 3802 as illustrated in FIG. 38B. In one embodiment, cover plate 3804 is bonded to high aspect ratio nanostructures with a collapse-avoiding cap 3802, where the bonding is performed using anodic bonding.

Figure 39:
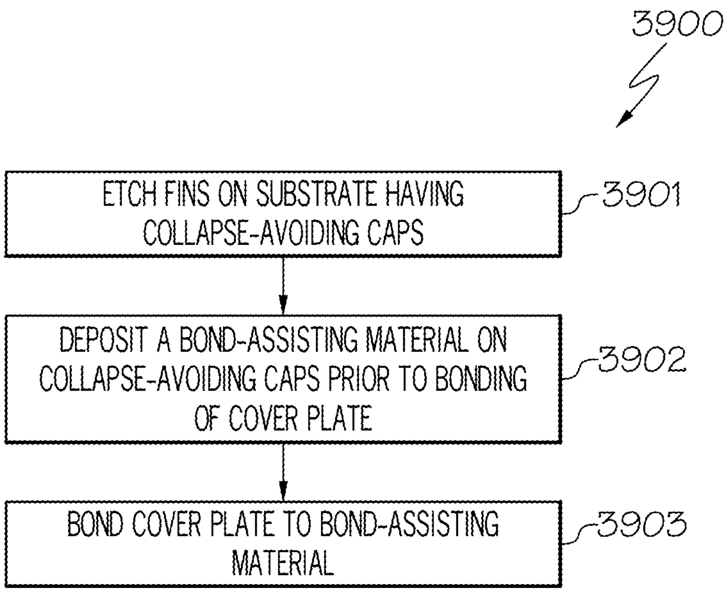
FIG. 39 is a flowchart of an alternative method for bonding of the cover plate in accordance with an embodiment of the present invention.
Figure 40A:
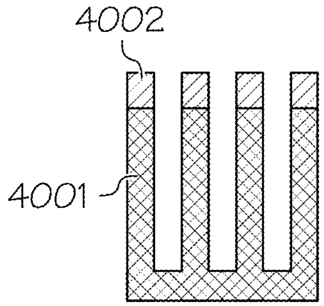
FIGS. 40A-40C depict cross-sectional views for bonding of the cover plate using the steps described in FIG. 39 in accordance with an embodiment of the present invention.
Figure 40B:
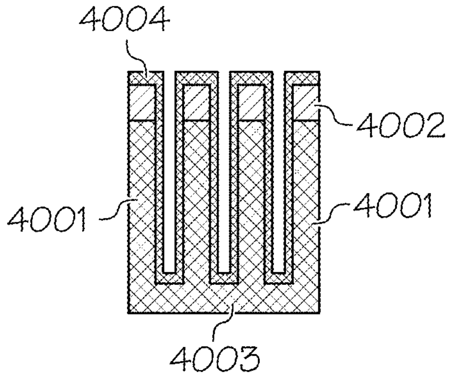
Figure 40C:
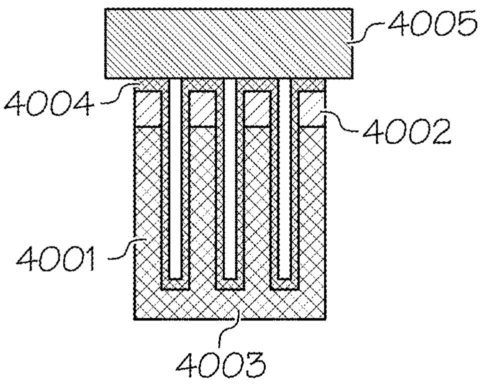

FIG. 39 is a flowchart of an alternative method 3900 for bonding of the cover plate in accordance with an embodiment of the present invention. FIGS. 40A-40C depict cross-sectional views for bonding of the cover plate using the steps described in FIG. 39 in accordance with an embodiment of the present invention.

Referring to FIG. 39, in conjunction with FIGS. 40A-40C, in step 3901, fins 4001 are etched on substrate 4003 having collapse-avoiding caps 4002 as illustrated in FIG. 40A.

In step 3902, a bond-assisting material 4004 (e.g., silicon oxide) is deposited on collapse-avoiding caps 4002 prior to bonding of the cover plate as shown in FIG. 40B.

In step 3903, a cover plate 4005 is bonded to the bond-assisting material 4004 as illustrated in FIG. 40C. In one embodiment, cover plate 4005 is bonded to high aspect ratio nanostructures with a collapse-avoiding cap 4002 via bond-assisting material 4004.

Figure 41:
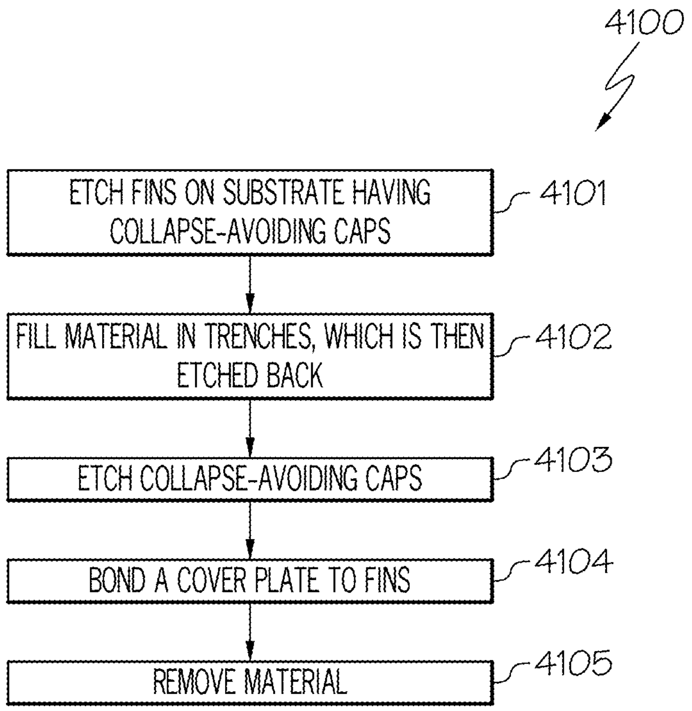
FIG. 41 is a flowchart of a further alternative method for bonding of the cover plate in accordance with an embodiment of the present invention.

FIG. 41 is a flowchart of a further alternative method 4100 for bonding of the cover plate in accordance with an embodiment of the present invention. FIGS. 42A-42E depict cross-sectional views for bonding of the cover plate using the steps described in FIG. 41 in accordance with an embodiment of the present invention.

Figure 42A:
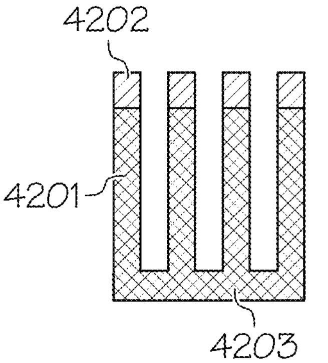
FIGS. 42A-42E depict cross-sectional views for bonding of the cover plate using the steps described in FIG. 41 in accordance with an embodiment of the present invention.

Referring to FIG. 41, in conjunction with FIGS. 42A-42E, in step 4101, fins 4201 are etched on substrate 4203 having collapse-avoiding caps 4202 as illustrated in FIG. 42A.

Figure 42B:
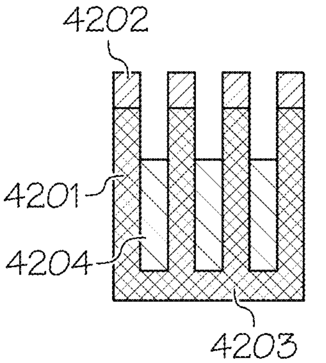

In step 4102, material 4204 is filled in the trenches (opposite sides of fins 4201), which is then etched back as shown in FIG. 42B.

Figure 42C:
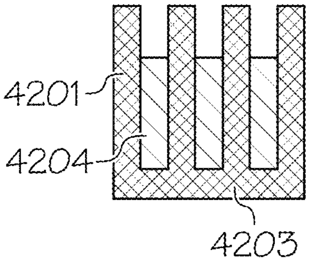

In step 4103, collapse-avoiding caps 4202 are etched back as shown in FIG. 42C.

Figure 42D:
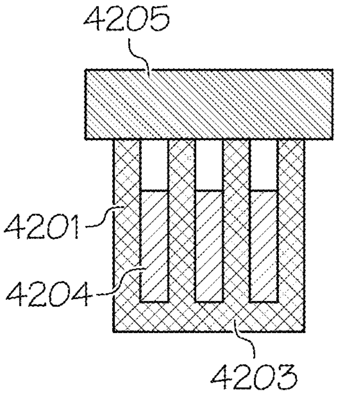

In step 4104, a cover plate 4205 is bonded to fins 4201 as illustrated in FIG. 42D. In one embodiment, cover plate 4205 is bonded to high aspect ratio nanostructures, where the collapse avoiding caps 4202 are removed (see step 4103) after providing material 4204 between the nanostructures (see step 4102).

Figure 42E:
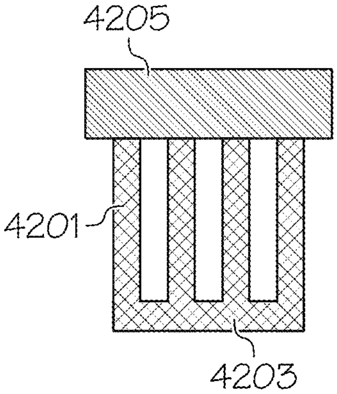

In step 4105, material 4204 is removed as shown in FIG. 42E. In one embodiment, material 4204 is poly vinyl alcohol (PVA) and is removed using water.

With respect to other devices, such as MEMS, metalenses and optical devices, use of collapse-avoiding caps can enable ultrahigh aspect ratio uncollapsed free-standing nanostructures for metalenses, MEMS devices, vertically aligned nanowire sensors, nanowires for SERS substrates, etc. For applications where features collapse during feature release steps in MEMS devices, the sidewalls where the features will make contact after collapsing can be provided with collapse-avoiding material to prevent collapse during the feature release step.

With respect to process integration with CICE, in one embodiment, the catalyst is not removed after CICE. In one embodiment, silicon fins are made by CICE using Ru as a catalyst. The Ru is not removed after CICE—it is instead covered by an insulating material, such as silicon oxide used in a shallow trench isolation (STI) layer in the finFET device, and further processes for finFETs are continued. In another embodiment, catalysts are not removed after CICE for DRAM trench capacitors.

For nano-DLD devices, silicon nanopillar arrays made using CICE with gold as a catalyst—the gold is not removed after CICE. The gold at the bottom of the nanopillar arrays may be covered by a desired material if required.

A discussion regarding the tunable etch depth CICE process is now deemed appropriate.

In one embodiment of the tunable etch depth process described herein, the process involves several steps as outlined below:

The catalyst patterning process is completed first (step 1), this patterning can be done in several ways including:

(a) Using the catalyst break process shown in FIGS. 43, 44A-44C, 45, 46A-46C, 47, 48A-48C, 49, 50A-50D, 51A-51B and 52A-52B.

(b) Using the catalyst etch process as shown in FIGS. 53 and 54A-54H.

(c) Using catalyst lift-off process as discussed in the following references, Romano, Lucia, Matias Kagias, Joan Vila-Comamala, Konstantins Jefimovs, Li-Ting Tseng, Vitaliy A. Guzenko, and Marco Stampanoni. "Metal Assisted Chemical Etching of Silicon in the Gas Phase: A Nanofabrication Platform for X-Ray Optics." Nanoscale Horizons 5, No. 5, 2020, pp. 869-879, and Kim, Jeong Dong, Parsian K Mohseni, Karthik Balasundaram, Srikanth Ranganathan, Jayavel Pachamuthu, James J Coleman, and Xiuling Li. "Scaling the Aspect Ratio of Nanoscale Closely Packed Silicon Vias by MacEtch: Kinetics of Carrier Generation and Mass Transport." Adv. Funct. Mater., Feb. 1, 2017, which are hereby incorporated by reference herein in their entirety.

Next (step 2) the CICE process is either not initiated right away or the CICE process is initiated to create a partial etch with a target of achieving uniform etch depth of a pre-determined value.

Next (step 3), a pre-determined pattern of openings in a layer of CICE etchant-resistant material is created that is deployed on top of the patterned CICE catalyst that is either not yet CICE etched or partially etched using CICE. The predetermined pattern of opening in a layer of CICE etchant-resistant material can be created in one of the following ways:

(a) Spin coat a photoresist such as g-line resist, i-line resist, KrF resist, ArF resist, ArF immersion resist or an EUV resist and pattern this photoresist using an associated photolithography process.

(b) Spin coat an electron beam resist such as poly methyl methacrylate (PMMA) and pattern it using an electron beam lithography step.

(c) Spin coat a polymer material such as poly methyl methacrylate (PMMA) or spin-on carbon (SOC) material and use the above photoresist or electron beam resist materials as an imaging layer to etch into PMMA or SOC.

(d) Vacuum deposit Carbon or aluminum oxide (by for example using chemical vapor deposition or atomic layer deposition or physical vapor deposition) and subsequently patterned this layer using the above disclosed photoresists or electron beam resists to create a pre-determined set of openings in the said carbon layer.

(e) Inkjet regions of polymers or carbon-based materials (such as graphene flakes) or plasma jet polymers or carbon-based materials to create partially covered regions on a wafer thereby creating a pre-determined set of openings in these CICE etchant-resistant material.

Next an optional step (step 4) can include removing catalyst material regions that are exposed after the pre-determined pattern has been created in Step 3 which includes using wet etchants for catalysts, such as Au, Ru, Pd, Pt, etc. as discussed in International Publication No. WO 2020/176425, which is incorporated herein in its entirety.

These pre-determined patterns are chosen to allow controlled flow of CICE etchant materials onto the pre-patterned catalyst structure discussed in step 1, and optionally partially etched structure discussed in Step 2.

Figure 43:
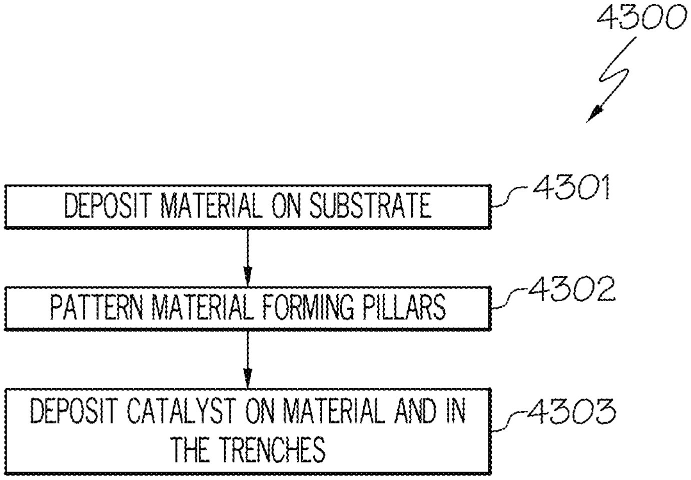
FIG. 43 is a flowchart of a method for creating a metal-break in gold using photolithography in accordance with an embodiment of the present invention.
Figure 44A:
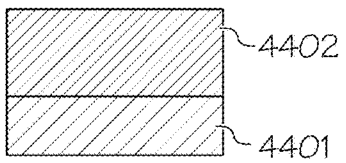
FIGS. 44A-44C depict cross-sectional views of creating a metal-break in gold using the steps described in FIG. 43 in accordance with an embodiment of the present invention.
Figure 44B:
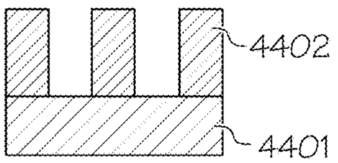
Figure 44C:
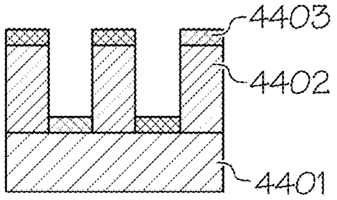

Referring to FIG. 43, FIG. 43 is a flowchart of a method 4300 for creating a metal-break in gold using photolithography in accordance with an embodiment of the present invention. FIGS. 44A-44C depict cross-sectional views of creating a metal-break in gold using the steps described in FIG. 43 in accordance with an embodiment of the present invention.

Referring to FIG. 43, in conjunction with FIGS. 44A-44C, in step 4301, a material 4402 is deposited on substrate 4401 as shown in FIG. 44A.

In step 4302, material 4402 is patterned forming pillars as shown in FIG. 44B.

In step 4303, catalyst 4403 is deposited on material 4402 and in the trenches (openings between pillars) as shown in FIG. 44C.

Figure 45:
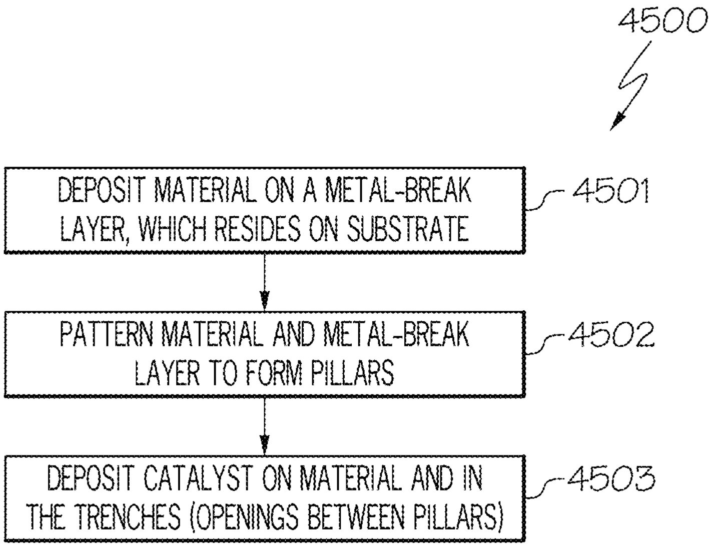
FIG. 45 is a flowchart of a method for creating a metal-break in gold using photo/e-beam lithography with a metal-break layer in accordance with an embodiment of the present invention.
Figure 46A:
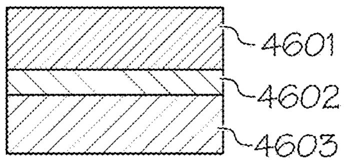
FIGS. 46A-46C depict cross-sectional views of creating a metal-break in gold using the steps described in FIG. 45 in accordance with an embodiment of the present invention.
Figure 46B:
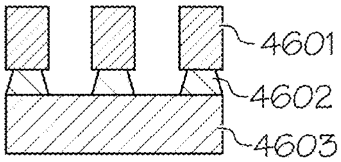
Figure 46C:
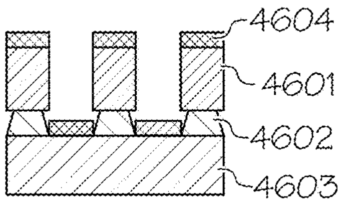

Referring to FIG. 45, FIG. 45 is a flowchart of a method 4500 for creating a metal-break in gold using photo/e-beam lithography with a metal-break layer in accordance with an embodiment of the present invention. FIGS. 46A-46C depict cross-sectional views of creating a metal-break in gold using the steps described in FIG. 45 in accordance with an embodiment of the present invention.

Referring to FIG. 45, in conjunction with FIGS. 46A-46C, in step 4501, a material 4601 is deposited on a metal-break layer 4602, which resides on substrate 4603 as shown in FIG. 46A.

In step 4502, material 4601 and metal-break layer 4602 are patterned forming pillars as shown in FIG. 46B.

In step 4503, catalyst 4604 is deposited on material 4601 and in the trenches (openings between pillars) as shown in FIG. 46C.

Figure 47:
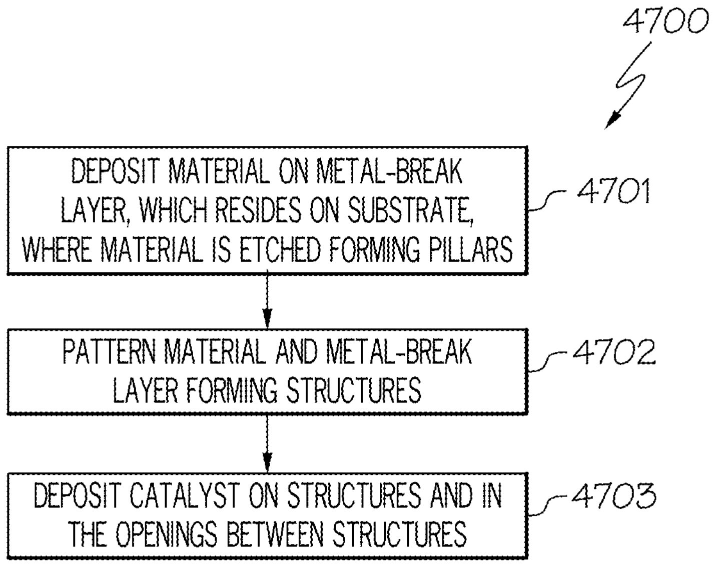
FIG. 47 is a flowchart of a method for creating a metal-break in gold using nanoimprint lithography with a metal-break layer in accordance with an embodiment of the present invention.
Figure 48A:
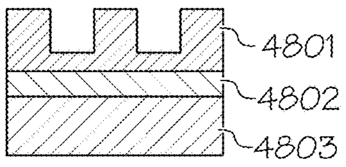
FIGS. 48A-48C depict cross-sectional views of creating a metal-break in gold using the steps described in FIG. 47 in accordance with an embodiment of the present invention.
Figure 48B:
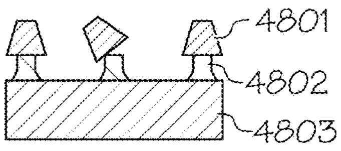
Figure 48C:
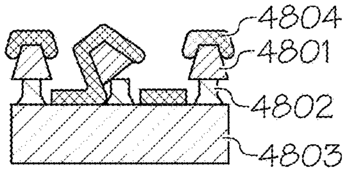

Referring to FIG. 47, FIG. 47 is a flowchart of a method 4700 for creating a metal-break in gold using nanoimprint lithography with a metal-break layer in accordance with an embodiment of the present invention. FIGS. 48A-48C depict cross-sectional views of creating a metal-break in gold using the steps described in FIG. 47 in accordance with an embodiment of the present invention.

Referring to FIG. 47, in conjunction with FIGS. 48A-48C, in step 4701, a material 4801 is deposited on a metal-break layer 4802, which resides on substrate 4803 as shown in FIG. 48A. As also shown in FIG. 48A, material 4801 is etched in the manner forming pillars as shown in FIG. 48A.

In step 4702, material 4801 and metal-break layer 4802 are patterned forming structures 4804 as shown in FIG. 48B.

In step 4703, catalyst 4805 is deposited on structures 4804 and in the openings between structures 4804 as shown in FIG. 48C.

Figure 49:
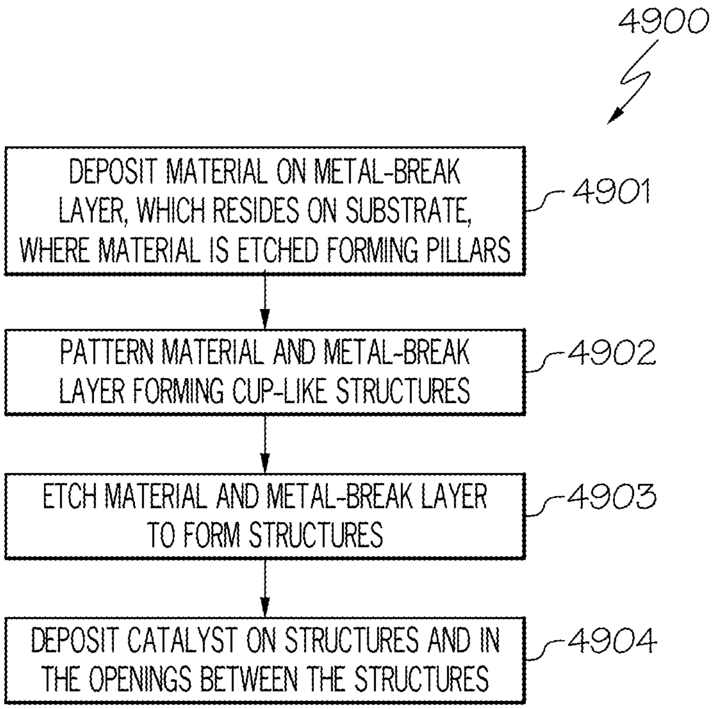
FIG. 49 is a flowchart of an alternative method for creating a metal-break in gold using nanoimprint lithography with a metal-break layer in accordance with an embodiment of the present invention.

Referring to FIG. 49, FIG. 49 is a flowchart of an alternative method 4900 for creating a metal-break in gold using nanoimprint lithography with a metal-break layer in accordance with an embodiment of the present invention. FIGS. 50A-50D depict cross-sectional views of creating a metal-break in gold using the steps described in FIG. 49 in accordance with an embodiment of the present invention.

Figure 50A:
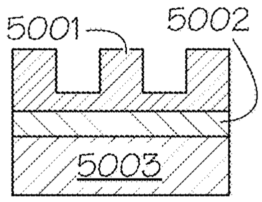
FIGS. 50A-50D depict cross-sectional views of creating a metal-break in gold using the steps described in FIG. 49 in accordance with an embodiment of the present invention.

Referring to FIG. 49, in conjunction with FIGS. 50A-50D, in step 4901, a material 5001 is deposited on a metal-break layer 5002, which resides on substrate 5003 as shown in FIG. 50A. As also shown in FIG. 50A, material 5001 is etched in the manner forming pillars as shown in FIG. 50A.

Figure 50B:
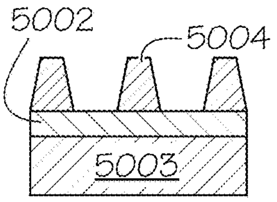

In step 4902, material 5001 and metal-break layer 5002 are patterned forming cup-like structures 5004 as shown in FIG. 50B.

Figure 50C:
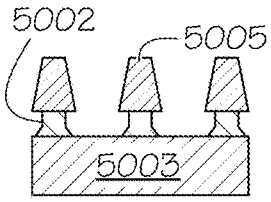
Figure 51A:
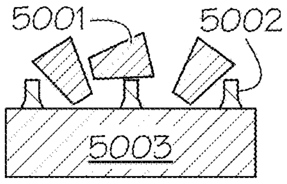
FIG. 51A illustrates the resulting structure formed in accordance with an embodiment of the present invention.
Figure 51B:
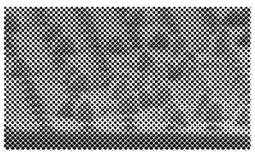
FIG. 51B illustrates a SEM image of the metal-break layer after performing an etch in accordance with an embodiment of the present invention.
Figure 52A:
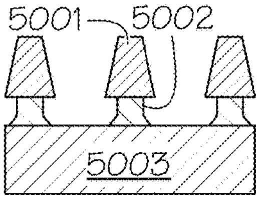
FIG. 52A illustrates the resulting structure formed in accordance with an embodiment of the present invention.
Figure 52B:
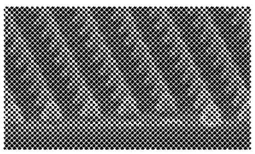
FIG. 52B illustrates a SEM image of the metal-break layer after performing an etch in accordance with an embodiment of the present invention.

In step 4903, material 5001 and metal-break layer 5002 are etched to form structures 5005 as shown in FIG. 50C. In one embodiment, a longer etch of metal-break layer 5002 is performed as illustrated in FIGS. 51A-51B, where FIG. 51A illustrates the resulting structure formed in accordance with an embodiment of the present invention and FIG. 51B illustrates a SEM image of metal-break layer 5002 after performing such an etch in accordance with an embodiment of the present invention. In one embodiment, an optimized etch of metal-break layer 5002 is performed as illustrated in FIGS. 52A-52B, where FIG. 52A illustrates the resulting structure formed in accordance with an embodiment of the present invention and FIG. 52B illustrates a SEM image of metal-break layer 5002 after performing such an etch in accordance with an embodiment of the present invention.

Figure 50D:
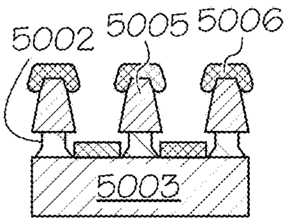

Returning to FIG. 49, in conjunction with FIGS. 50A-50D, in step 4904, catalyst 5006 is deposited on structures 5005 and in the openings between structures 5005 as shown in FIG. 50D.

Figure 53:
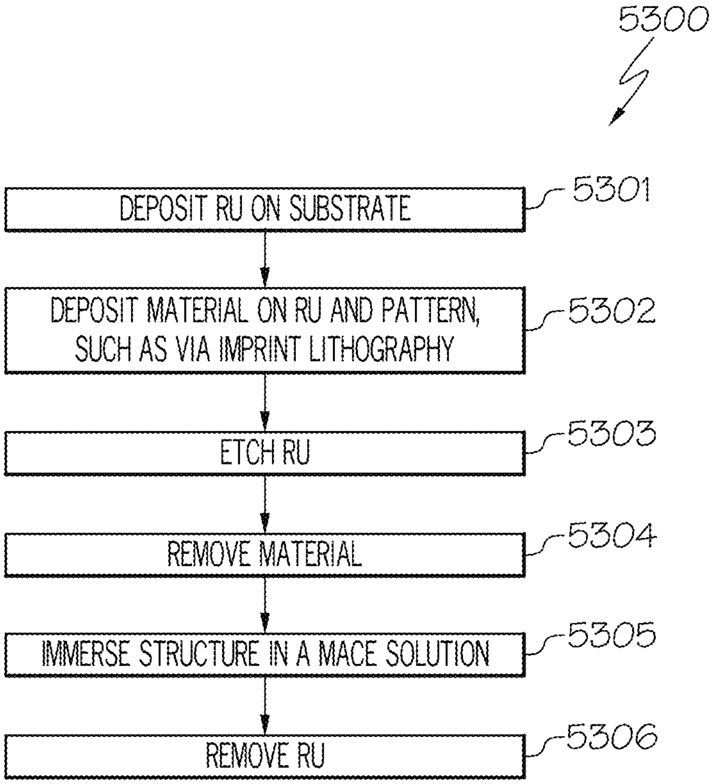
FIG. 53 is a flowchart of a method for patterning and MACE with ruthenium in accordance with an embodiment of the present invention.

Referring to FIG. 53, FIG. 53 is a flowchart of a method 5300 for patterning and MACE with ruthenium in accordance with an embodiment of the present invention. FIGS. 54A-54H depict cross-sectional views for patterning and MACE with ruthenium using the steps described in FIG. 53 in accordance with an embodiment of the present invention in accordance with an embodiment of the present invention.

Figure 54A:
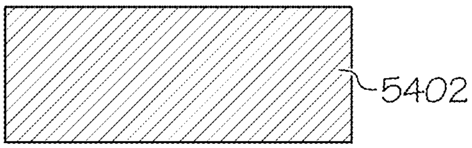
FIGS. 54A-54H depict cross-sectional views for patterning and MACE with ruthenium using the steps described in FIG. 53 in accordance with an embodiment of the present invention in accordance with an embodiment of the present invention.
Figure 54B:
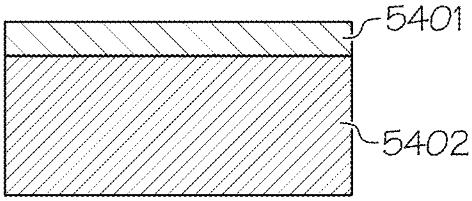

Referring to FIG. 53, in conjunction with FIGS. 54A-54H, in step 5301, Ru 5401 is deposited on a substrate 5401 (e.g., silicon substrate) as shown in FIGS. 54A-54B.

Figure 54C:
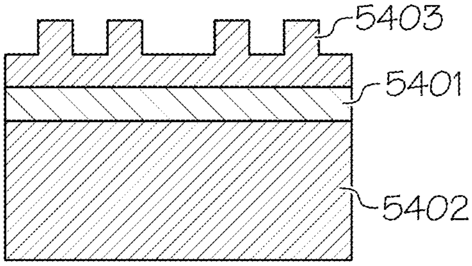

In step 5302, material 5403 is deposited on Ru 5401 and patterned, such as via imprint lithography, forming the structures as shown in FIG. 54C.

Figure 54D:
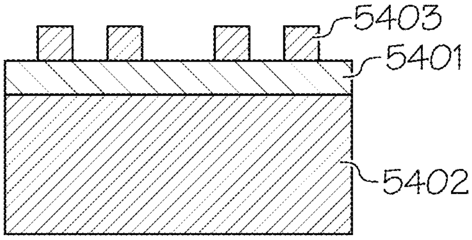

In step 5303, a residual layer etch (descum) of material 5403 is performed forming pillars as shown in FIG. 54D.

Figure 54E:
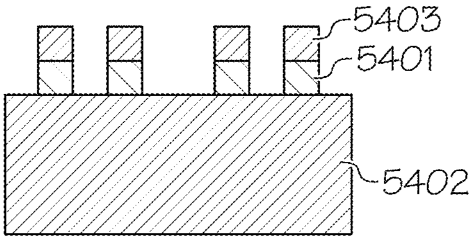

In step 5304, Ru 5401 is etched in the manner as shown in FIG. 54E, where Ru 5401 located in the openings between the pillars of material 5403 is etched.

Figure 54F:
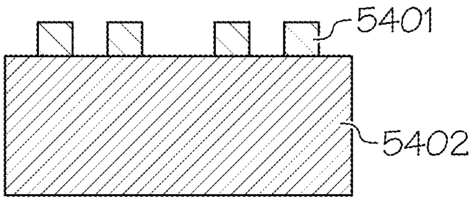

In step 5305, material 5403 (e.g., resist) is removed as shown in FIG. 54F.

Figure 54G:
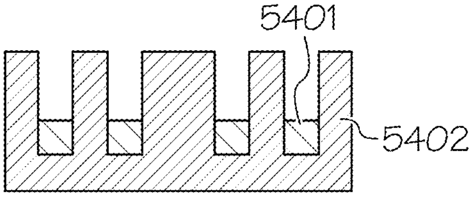

In step 5306, the structure of FIG. 54F is immersed in a MACE solution resulting in a structure as shown in FIG. 54G.

Figure 54H:
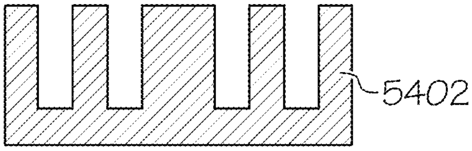

In step 5307, Ru 5401 is removed resulting in the structure as shown in FIG. 54H.

Figure 55A:
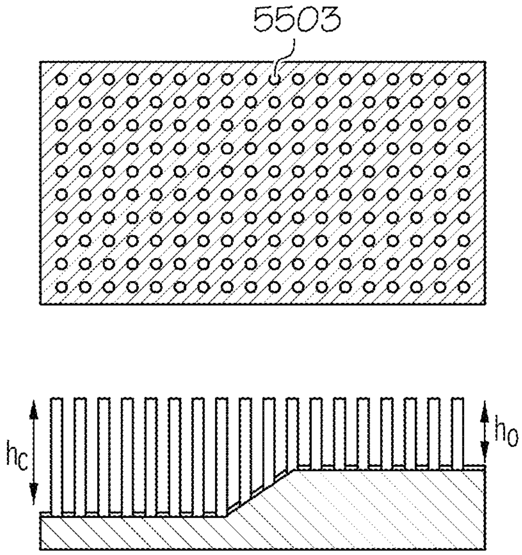
FIGS. 55A-55D show an exemplar device with regions of varying fin heights in accordance with an embodiment of the present invention.
Figure 55B:
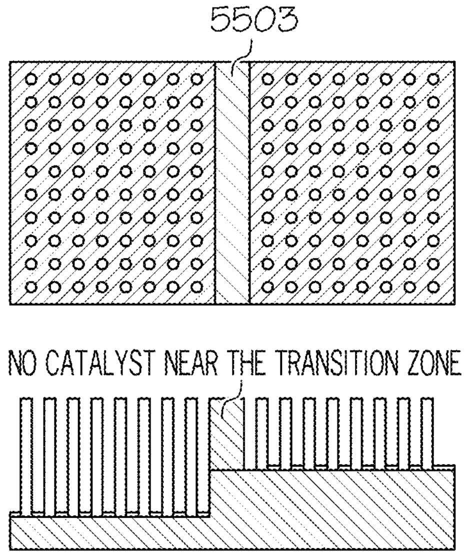
Figure 55C:
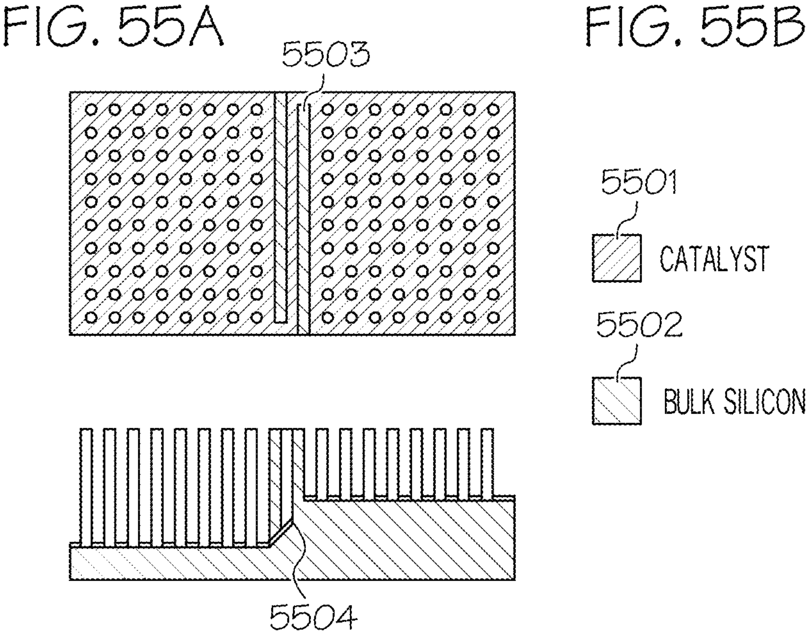

FIGS. 55A-55C show an exemplar device with regions of varying fin heights in accordance with an embodiment of the present invention. In one embodiment (FIG. 55A), the catalyst film 5501 is continuous across the transition zone 5503 of bulk silicon 5502. In another embodiment (FIG. 55B), catalyst film 5501 is not present near transition zone 5503. This effectively creates moats across the varying height regions. In another embodiment (FIG. 55C), catalyst film 5501 is patterned to be in the form of a stretchable structure, such as a serpentine pattern 5504, near the transition zone 5503. In such a structure (serpentine pattern 5504), deformation is reduced near transition zone 5503.

Figure 55D:
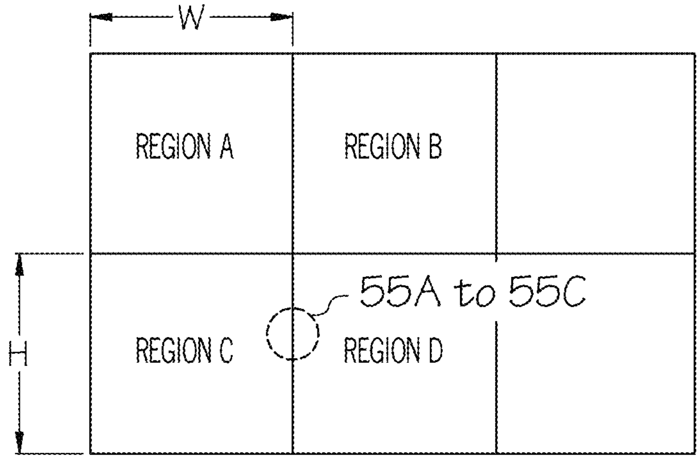

In one embodiment, FIG. 55D illustrates the width (W) and height (H) of the varying height regions of the fins of FIGS. 55A-55C in accordance with an embodiment of the present invention. In one embodiment, the width (W) and height (H) of the varying height regions of the fins are both sub-100 μm. In one embodiment, the process above is utilized to etch a region A adjacent to region B, where region B has all features larger than 1-micrometer in size. In one embodiment, the process above is utilized to etch a region A adjacent to region B, where region B has all features larger than 0.5-micrometer in size.

The tunable etch depth control is achieved by one or more of the following control parameters as discussed in International Publication No. WO 2020/176425, which is incorporated herein in its entirety 1. the above pre-determined pattern,
2. a pre-determined CICE etchant composition that influences the etch rate into the semiconductor substrate,
3. a pre-determined variation in catalyst composition across the wafer,
4. the global and local temperature of the substrate,
5. the global and local electric field applied to the substrate, while optionally using local and global optical metrology signal to sense the level of etching achieved in real-time or in an off-line sensing manner.

Applications of the tunable etch depth structure include, but not limited to, variable-etch-depth nanostructures needed to achieve cascading micro- and nanofluidic devices, such as a micro- and nano-DLD devices; variable-etch-height fins in transistor structures thereby having different regions of an integrated circuit having different height fins; and variable-etch-height while creating nanosheets thereby having different regions of an integrated circuit having different numbers of discrete nanosheets.

Figure 56:
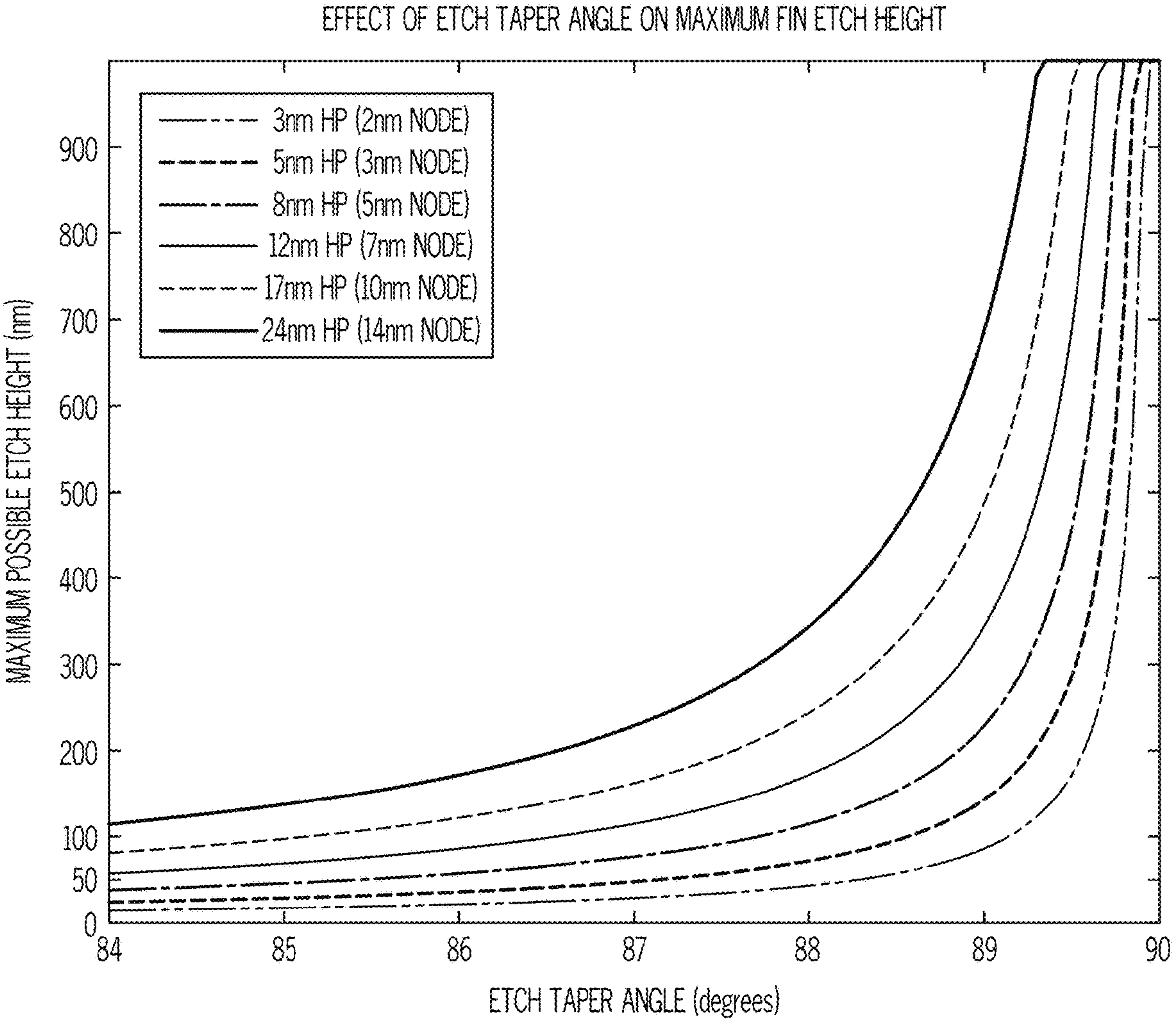
FIG. 56 illustrates the effect of the etch taper angle on the maximum achievable fin height for different technology nodes in accordance with an embodiment of the present invention.

High-aspect ratio rectangular silicon fins made by plasma etch are used in transistor fabrication. Due to the nature of plasma etching, the fin sidewalls are tapered creating a trapezoidal prism structure as opposed to a rectangular cuboid. This taper limits the ability to shrink the fin width and fin pitch while maintaining or increasing fin height. For instance, FinFETs in the "14 nm" technology node have a taper angle of ~85°, and a physical Half Pitch (HP) of 24 nm and pitch of 48 nm. Using this ratio of technology node to physical half pitch, the maximum fin height possible for different taper angles is plotted in FIG. 56, where the critical height is calculated by Maximum fin height=0.5 HP*tan (TaperAngle). 100 nm of the fin height is used for Shallow Trench Isolation (STI) and is thus not a part of the active finFETs. FIG. 56 is a graph 5600 of the effect of the etch taper angel on the maximum fin etch height in accordance with an embodiment of the present invention.

FIG. 56 illustrates the effect of the etch taper angle on the maximum achievable fin height for different technology nodes in accordance with an embodiment of the present invention. As shown in FIG. 56, no etch taper (900 taper angle) allows for fins with arbitrarily tall heights.

Furthermore, FIG. 56 shows the scaling potential of a vertical taper-free etch (e.g., MACE) to increase aspect ratios of fins. Fabrication of rectangular fins by CMOS-compatible Ru MACE as well as methods of ultra-high aspect ratio fin collapse management are described below.

Figure 57A:
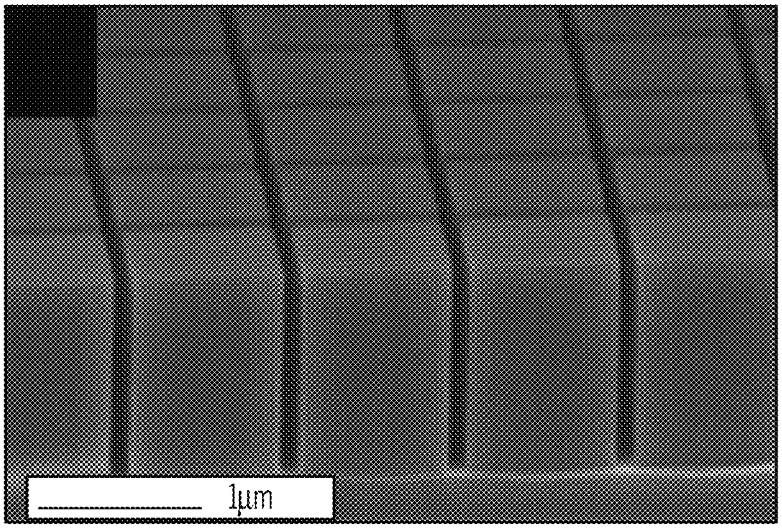
FIGS. 57A-57B illustrate the effect of the mini-mesh spatial density of Ru MACE etch quality for Ar/$CF_4$ descum and 20 s MacEtch with 12.5M HF and 1M $H_2O_2$ in accordance with an embodiment of the present invention.
Figure 57B:
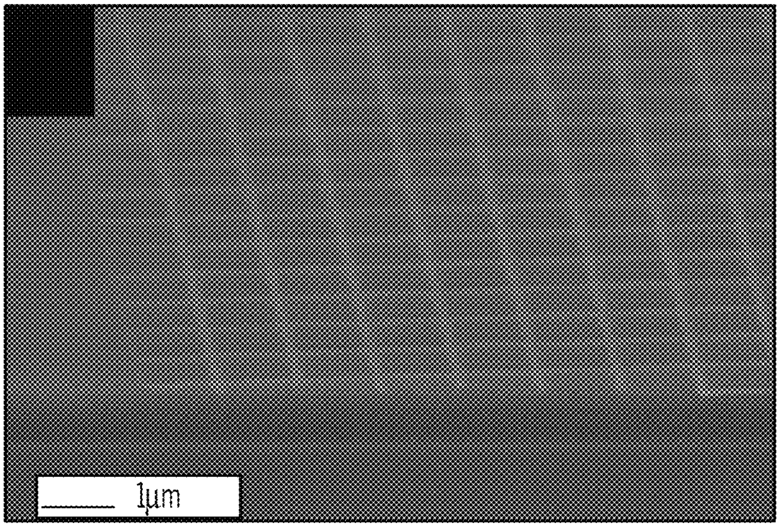
Figure 58A:
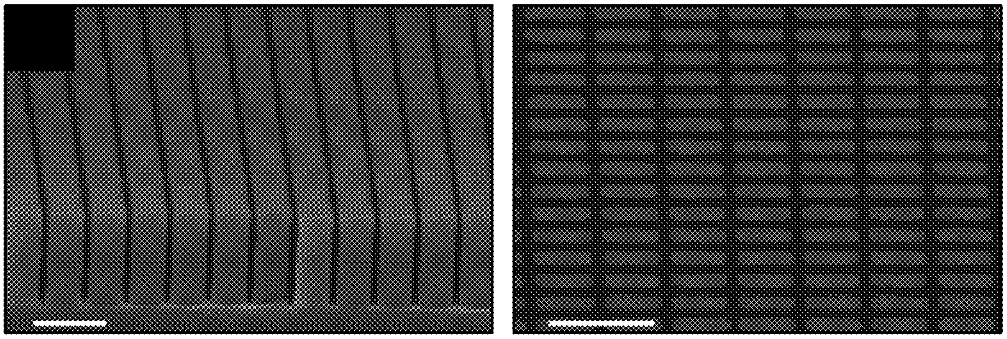
FIGS. 58A-58D illustrate ruthenium MACE for fabrication of silicon rectangular pillar arrays with different geometries in accordance with an embodiment of the present invention.
Figure 58B:
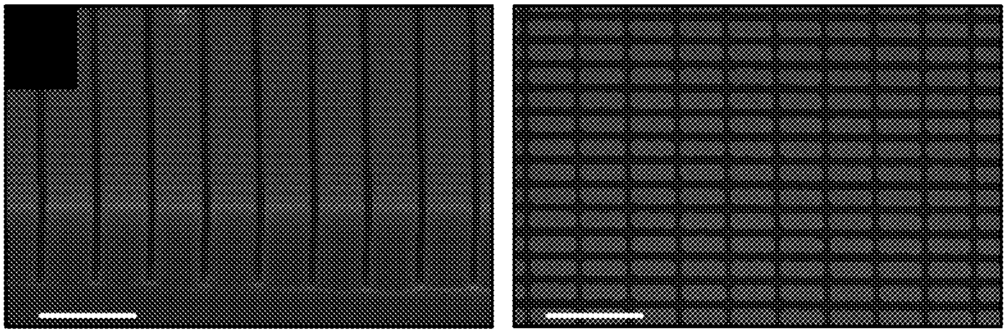
Figure 58C:
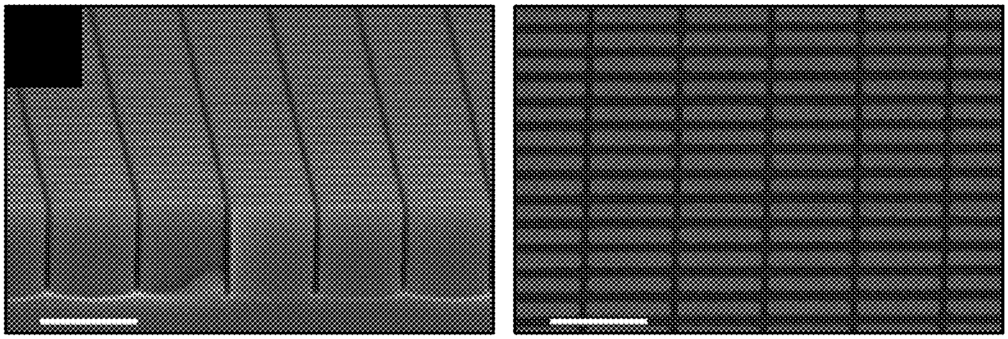
Figure 58D:
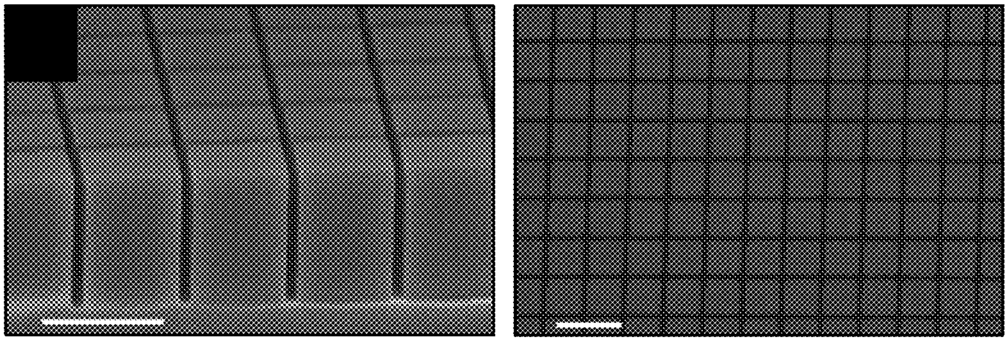

Optimized CMOS-compatible Ru mini-mesh MACE can be extended to application-specific geometries, such as rectangular nanofins for transistors This is demonstrated for rectangular cross-sections pillars, where, similar to results obtained for circular nanopillars, mini-meshes and catalyst plasma modification are required to achieve desired non-porous silicon etch with Ru MACE. The effect of Ru surface coverage is critical, as shown in FIGS. 57A-57B. FIGS. 57A-57B illustrate the effect of the mini-mesh spatial density of Ru MACE etch quality for Ar/$CF_4$ descum and 20 s MacEtch with 12.5M HF and 1M $H_2O_2$ in accordance with an embodiment of the present invention.

FIG. 57A illustrates the spatial density of 0.192, whereas, FIG. 57B illustrates the spatial density of 0.264. Standard Ru patterns have a spatial density of 1, i.e., the entire silicon surface is covered by patterned Ru.

For Ru MACE on samples processed with Ar/$CF_4$ descum, an increase in the Ru surface coverage (or mini-mesh spatial density) causes porosity in features etched. Standard Ru MACE without mini-meshes has a surface coverage of 1, i.e., the entire silicon wafer is covered by patterned Ru—these samples show porous silicon after etch. Mini-meshes with a spatial density of 0.192 (diameter of 256 μm and a pitch of 585 μm) show high aspect ratio nanostructure etch, while those with a spatial density of 0.264 (diameter of 256 μm and a pitch of 507 μm) show porous silicon. The pitch is varied by changing the inkjet drop pattern during Jet and Flash Imprint Lithography.

Regular arrays of silicon fins with different rectangular cross-sections are etched to determine the effect of fin geometries on Ru MACE etch rates. A high level of etch uniformity across fin geometries is obtained, as shown in FIGS. 58A-58D.

FIGS. 58A-58D illustrate ruthenium MACE for fabrication of silicon rectangular pillar arrays with different geometries in accordance with an embodiment of the present invention. All samples are etched using optimized Ru MACE (Ar/$CF_4$ descum and 20 s MacEtch with 12.5M HF and 1M $H_2O_2$.) All scale bars are 1 μm in length.

Figure 59:
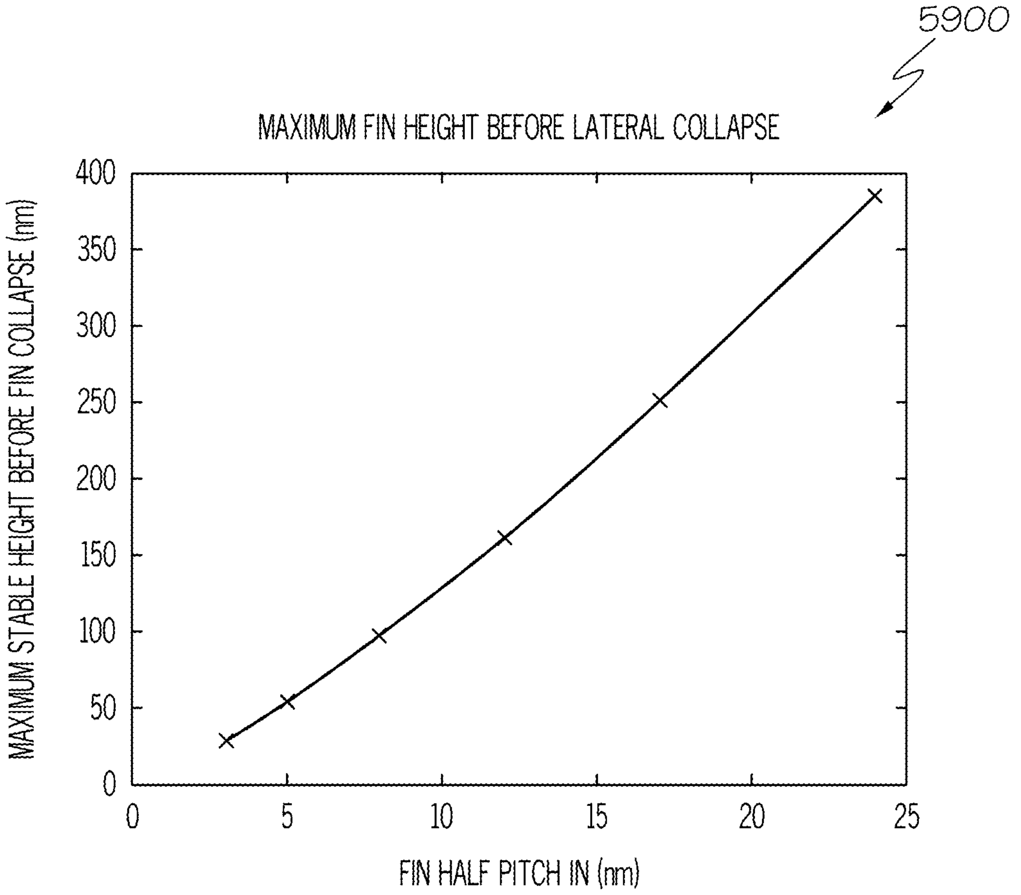
FIG. 59 is a graph illustrating the maximum height of a fin with no taper before lateral collapse along the length of the fin (50 nm in this case), as a function of the fin half-pitch (or fin width) in accordance with an embodiment of the present invention.

While Ru MACE can enable ultra-high aspect ratio fins for transistors, a major limitation to scaling to smaller fin widths is their structural instability. For FinFETs made with bulk silicon, a major portion of their length is utilized for shallow trench isolation (STI). Assuming the minimum height required for STI is 100 nm, only fins of width 10 nm and above can be used. Further, the active portion of the fins are much shorter than the initial fin height. FIG. 59 shows the maximum achievable fin heights for a given half pitch using the lateral collapse models described in Glassmaker et al., with the structural parameters for rectangular fins. This is calculated by equating the bending energy of the fin due to collapse with the surface energy required to separate the fins.

$$h_{cr\_lengthwise} = \left(\frac{18EI_x w^3}{\gamma_{sv} b}\right)^{1/4}$$

$$h_{cr\_widthwise} = \left(\frac{18EI_y w^3}{\gamma_{sv} a}\right)^{1/4}$$

where E is the elastic modulus of the fin, I is the moment of inertia about the bending axis, w is the deflection of the fin, i.e., half the distance between the collapsing fins, $\gamma_{sv}$ is the surface energy of the fin material, and a and b are the lengths of the fin perpendicular to the direction of collapse. For nanosheet layers comprising Si and SiGe, the new critical height depends on the modified elastic modulus of the multilayer stacked fins. Considering the thickness of each nanosheet to be 5 nm, and the lower region of the fin that is covered by STI to be Si, the new elastic modulus can be calculated by the "slab" model using the inverse rule of mixtures in composites literature. For a volume fraction of Si ~75%-95%, the resulting effective elastic modulus is ~100-150 GPa, and the critical heights for nanosheet fins are similar to those of finFET fins.

Referring to FIG. 59 is a graph 5900 illustrating the maximum height of a fin with no taper before lateral collapse along the length of the fin (50 nm in this case), as a function of the fin half-pitch (or fin width) in accordance with an embodiment of the present invention.

In one embodiment, the methods of improving the structural stability of fins beyond the heights include: (1) use of repelling "caps"; and (2) use of stabilizing structures to avoid fin collapse.

An alternate process flow for fin fabrication that avoids collapse is by using connecting links, as described in Chang and Sakdinawat, between fins to stabilize the fins during etch. After further processing of the device—including deposition of material between the fins—the stabilizing structures can be removed. For instance, fins connected on both ends create rectangular holes that would not collapse. MACE of holes, however, require isolated catalyst features which tend to wander during MACE and cause defects, as described in the next section.

During the MACE process, isolated metal catalysts may wander and create non-vertical undesired etch paths. Discontinuous catalyst features tend to wander during the MACE process and cause defects. Hildreth et al. utilized this property to make 3D spiral microscale structures with gold as a catalyst, and calculated the effect of the catalyst stiffness and geometric constraints on its motion. MACE of rectangular holes with isolated rectangular catalysts wander due to van der Waals forces on the catalyst as well as stochastic variations in forces applied due to local etchant concentration or etch rate variations. FIGS. 60A-60D show the effects of catalyst material and geometry on catalyst wandering behavior, with lower wandering for ruthenium compared to gold catalyst materials and larger catalyst sizes in accordance with an embodiment of the present invention. Catalyst wandering with gold is larger than ruthenium, likely due to lower bending and torsional stiffness of Au, shown below.

| | Young's modulus | Shear modulus |
|---|---|---|
| Gold | 76-81 GPa | 26-30 GPa |
| Ruthenium | 424-450 GPa | 168-182 GPa |

As shown in FIGS. 60A-60D, wandering of isolated catalyst structures causes poor MACE of holes. Catalyst wandering can be reduced by modifying the etchant concentrations and optimizing the recipe, however, as the size of holes to be etched is reduced, catalyst wandering increases. Kim et al. demonstrate etch of 200 nm-400 nm diameter holes with Au MACE, but observe etch stalling and low etch rates for smaller 100 nm geometries.

Figure 60A:
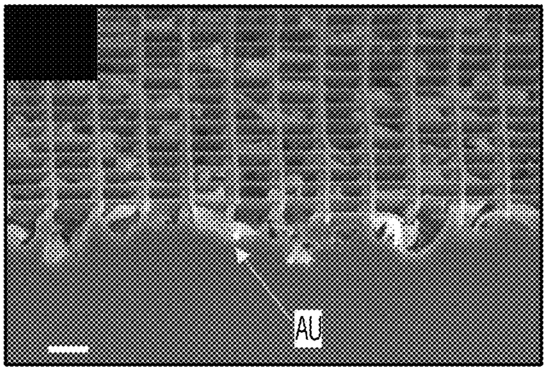
FIGS. 60A-60D show the effects of catalyst material and geometry on catalyst wandering behavior, with lower wandering for ruthenium compared to gold catalyst materials and larger catalyst sizes in accordance with an embodiment of the present invention.
Figure 60B:
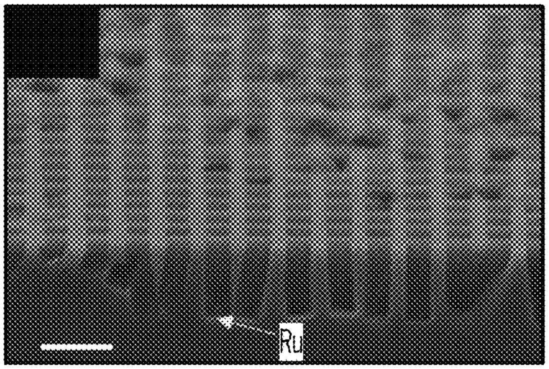
Figure 60C:
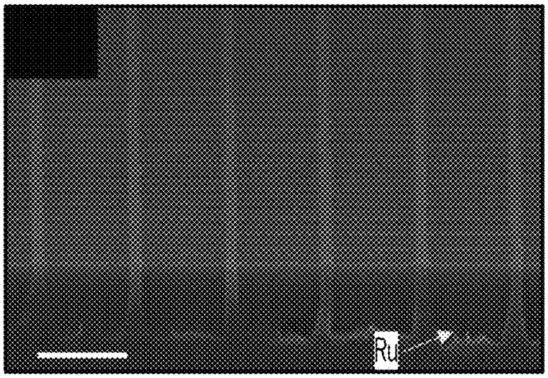
Figure 60D:
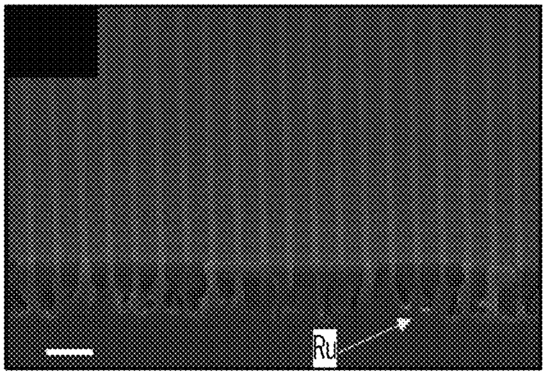

Referring to FIG. 60A-60D, FIGS. 60A-60D illustrate the effect of the catalyst material and geometry on the wandering of holes during MACE. FIGS. 60A-60B illustrate the Au and Ru MACE of rectangular holes. FIGS. 60C-60D illustrate the effect of the catalyst geometry on the wandering for Ru MACE of rectangular holes.

For CMOS applications, such as ultrahigh aspect ratio DRAM capacitors, the typical cell size is <50 nm. An alternate approach to making deep holes for DRAM is presented herein, which combines the atomic precision of feature dimension and overlay of lithography, vertical etch of MACE, and atomic layer deposition. Fabrication of fins with defined DRAM-cell-like geometries is followed by ALD to fill desired gaps, thereby enabling deep holes.

Figure 61A:
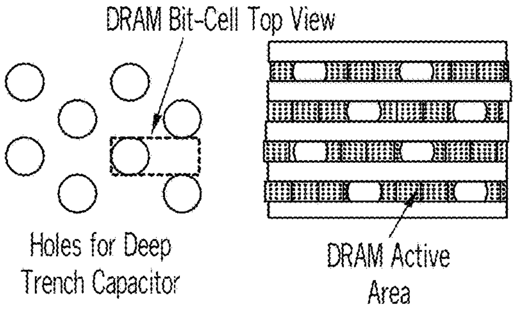
FIGS. 61A-61C illustrate the high aspect ratio holes for DRAM deep trench capacitors using MACE+ALD in accordance with an embodiment of the present invention.
Figure 61B:
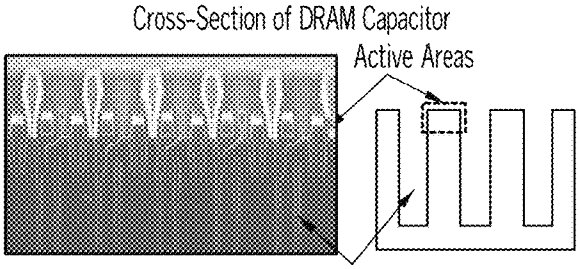
Figure 61C:
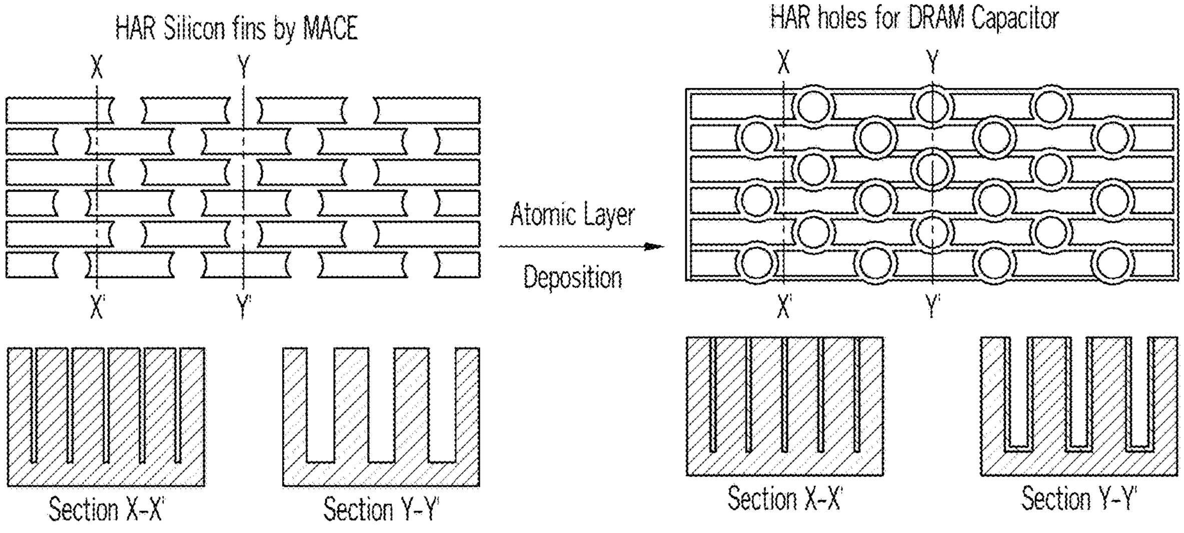
Figure 62A:
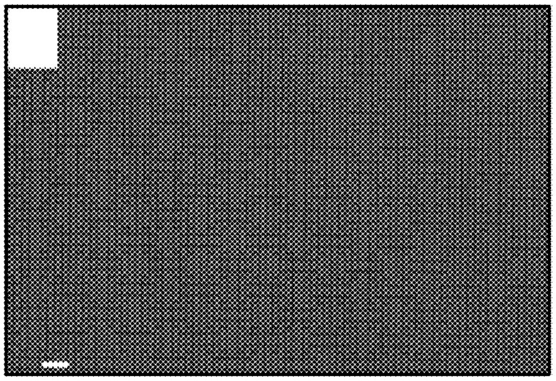
FIGS. 62A-62D illustrate ruthenium MACE for fabrication of silicon rectangular pillars with different geometries tilted cross-section SEMs and top-down SEMs at different magnifications in accordance with an embodiment of the present invention.
Figure 62B:
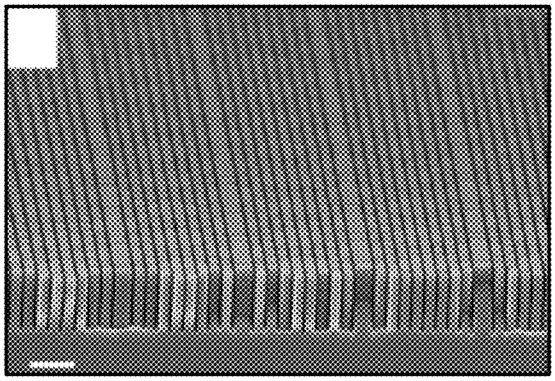
Figure 62C:
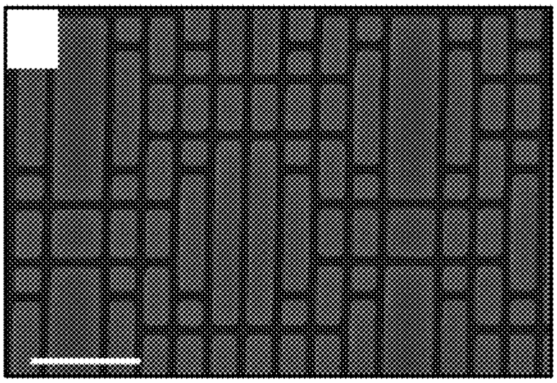
Figure 62D:
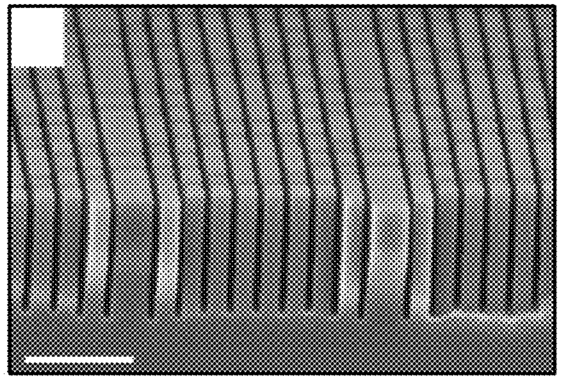

FIGS. 61A-61C illustrate the high aspect ratio holes for DRAM deep trench capacitors using MACE+ALD in accordance with an embodiment of the present invention. FIGS. 61A-61B illustrate DRAM cells design and SEM showing capacitor placement. FIG. 61C illustrates the MACE+ALD process flow showing fin geometries made by MACE and high aspect ratio holes made by filling designed gaps with ALD.

The MACE+ALD methodology of fabricating fins with precise geometries and placement, combined with conformal material deposition, can enable new design rules for 3D device design with arbitrary geometries. Additionally, design specifications do not need to be constrained to regular periodic geometries shown above. For instance, typical transistor architectures have fins of multiple dimensions and/or spacing determined by the desired circuit design. Arbitrary varying geometric patterns with rectangular fins are etched to confirm etch uniformity and independence of etch rates from aspect ratios for Ru MACE. FIGS. 62A-62D confirms etch uniformity for fin-like geometries beyond regular arrays for Ru MACE, thereby providing freedom of MACE geometry design in applications in logic, memory, optic and photonic devices.

FIGS. 62A-62D illustrate ruthenium MACE for fabrication of silicon rectangular pillars with different geometries tilted cross-section SEMs and top-down SEMs at different magnifications in accordance with an embodiment of the present invention. All scale bars are 1 μm in length.

The porosity in features after optimized etch is characterized using TEM and EDS mapping as shown in FIGS. 63A-63H, which shows ~15 nm thick sidewall porosity at the top of the features, and no porosity at the bottom of the features. HRTEM and EDS show that the porous silicon at the top of the features is oxidized, and the oxidized porous silicon is amorphous while the rest of the silicon fins are crystalline. The cause of this porosity may be due to diffusion of holes from the Ru/Si interface to the tops and sidewalls of the nanofins, as well as prolonged exposure of the top parts of the fins in the etching solution.

Figure 63A:
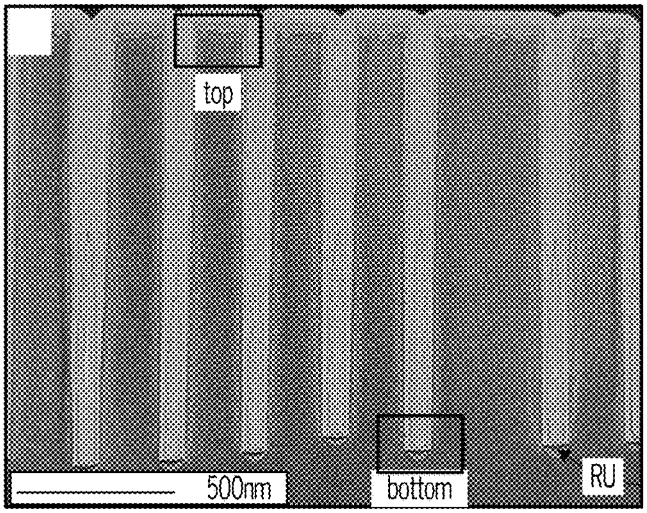
FIGS. 63A-63H illustrate high resolution TEM and EDS mapping of silicon fins in accordance with an embodiment of the present invention.
Figure 63B:
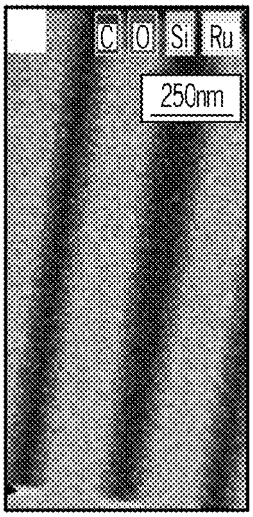
Figure 63C:
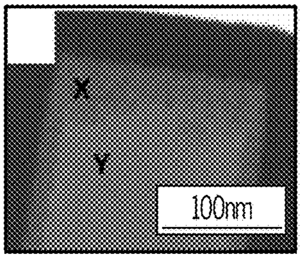
Figure 63D:
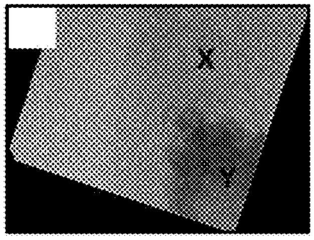
Figure 63E:
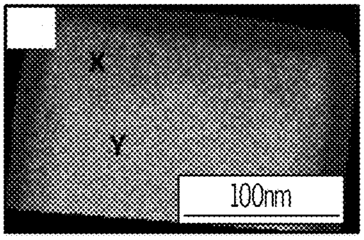
Figure 63F:
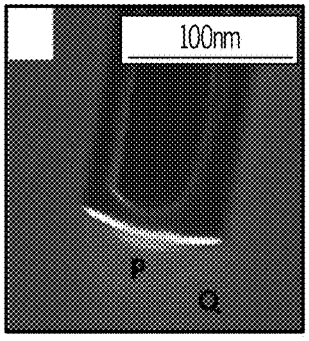
Figure 63G:
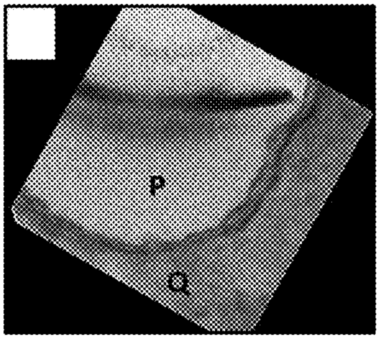
Figure 63H:
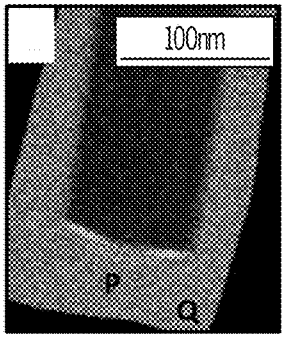

FIGS. 63A-63H illustrate high resolution TEM and EDS mapping of silicon fins in accordance with an embodiment of the present invention. FIG. 63A illustrates TEM mapping of the silicon fins. FIG. 63B illustrates the EDS mapping of the silicon fins along the fin length. The top portion of the fins shown by (FIG. 63C) cross-section SEM, (FIG. 63D) HRTEM, and (FIG. 63E) EDS mapping shows ~15 nm sidewall porosity and oxidation (X) as opposed to the rest of the silicon fins (Y). The bottom portion of the fins shown by (FIG. 63F) cross-section SEM, (FIG. 63G) HRTEM, and (FIG. 63H) EDS mapping shows Ru catalyst and etch front. The etch front (P) shows amorphous silicon, and the surrounding silicon (Q) is crystalline.

The images also show the MACE front below the Ru catalyst at the bottom of the fins—amorphous Si is observed at the etch front locally underneath the silicon. It should be noted that the amorphous silicon is not oxidized, thereby suggesting that the mechanism of the anodic Si dissolution reaction proceeds by direct dissolution of silicon, as opposed to via silicon oxide formation followed by dissolution. The silicon underneath the etch front in likely amorphous as opposed to porous crystalline Si, as no clusters of crystalline structures are seen in the HR-TEM, unlike other work on TEMs of MACE porous Si nanowires.

Transistor and memory architectures with ultra-high aspect ratio nanostructures can thus be made using CMOS-compatible MACE. In one embodiment, silicon fins are used in FinFETs, while fins made of alternating Si/SiGe are used for nanosheet FETs and complementary FETs. Si/SiGe layers deposited using epitaxial growth are plasma etched to create tapered fins for nanosheet FETs and CFETs. MACE can create fins without etch taper, and MACE of SiGe and Si/Ge superlattices has been demonstrated in literature for sub-20 nm nanowires. Alternatively, such superlattices can be made with bulk silicon by utilizing morphology control during MACE. The morphology of silicon nanostructures includes the porosity, pore size, pore orientation, and any variations in porosity along the length of the nanostructures. MACE can be used to tune the porosity as the catalyst etches into the silicon by taking advantage of the electrochemical nature of the etch. Silicon superlattice etching uses the catalyst to etch silicon while simultaneously creating a superlattice with alternating layers where one of the layers is porous. Similar to selective removal of SiGe layers in Si/SiGe superlattice fins in nanosheet FET fabrication, porous silicon layers can be selectively removed in non-porous Si/porous Si superlattice fins made MACE.

The alternating layers can be formed by electric field parameter modulation, etching through layers with alternating doping characteristics, or by alternating the MACE etchant concentrations. Higher current density, higher doping concentration, and higher oxidant-to-HF ratios respectively increase silicon porosity. Weisse et al. and Chiappini et al. demonstrated alternating porous silicon superlattice nanostructures using electric fields and etchant concentration modulations. Electric fields, however, do not produce non-porous layers, and result in superlattices with layers having alternating porosities. Alternating etchant concentrations can produce non-porous/porous layers, but is a timed etch and requires constant change of etchants, reducing yield and throughput.

Studies have demonstrated the effects of silicon substrate doping concentration on resulting porosity after MACE, with heavily doped wafers producing highly porous silicon, and lightly doped wafers producing non-porous silicon nanostructures. Multilayers with varying doping concentrations separated by Ge barrier layers have also demonstrated doping level-dependent porosity. The Ge barrier layers are used to prevent dopant diffusion, but result in increased cost of deposition and loss of throughput due to switching of gases during epitaxial growth of the films. This section builds on previous literature and demonstrates a process for making porous silicon superlattices with sharp non-porous/porous silicon interfaces in nanostructures without the use of barrier layers between differently doped films.

MACE can etch into silicon while simultaneously changing the morphology depending on tailorable material properties such as doping concentration and dopant type of deposited alternating layers. The method employed for deposition of the alternating layers or "superlattice" depends on commercial availability, cost, throughput, growth rate, thermal budget, number of layers and thicknesses of layers. Polycrystalline silicon layers can also be used, but they may not have reliable vertical MACE due to grain boundaries, and they tend to reduce the size of the structures being etched. Epitaxial (epi) growth of silicon produces crystalline silicon films using Chemical Vapor Deposition (CVD), a process whereby a thin solid film is synthesized from the gaseous phase by a chemical reaction.

Temperature, pressure, gas flow rates, substrate preparation, surface treatment and oxidation prevention are the main parameters that determine the epi superlattice quality and crystallinity. The partial pressure of the gas used for doping, such as $B_2H_6$ or $PH_3$, determines the doping concentration in the epi layer. A low total pressure during growth allows for better junctions due to decreased contamination from gases of the previous layer—however, this is not a concern when growing alternating epitaxial silicon films of the same doping type and different doping concentrations.

When epitaxial layers with alternate high and low doping concentrations are deposited at sub-micron thickness per layer, the concentration gradient across the interface of the two layers is shallow due to limitations of the deposition process at high deposition rates, as well as due to diffusion of dopants across the interface. This gives a non-abrupt change of doping across the thickness of the stack, such as a shallow gradient across the interface. MACE of epitaxial layers of differently doped silicon is demonstrated in FIGS. 64A-64B to create porous/non-porous layers of silicon nanostructures, where the porous layer results from highly B-doped epitaxial silicon with a doping of 1E18 $cm^{-3}$, and the non-porous layer results from B-doping of 1E15 $cm^{-3}$. The epitaxial silicon wafers are obtained from Lawrence Semiconductor Research Lab (LSRL).

Figure 64A:
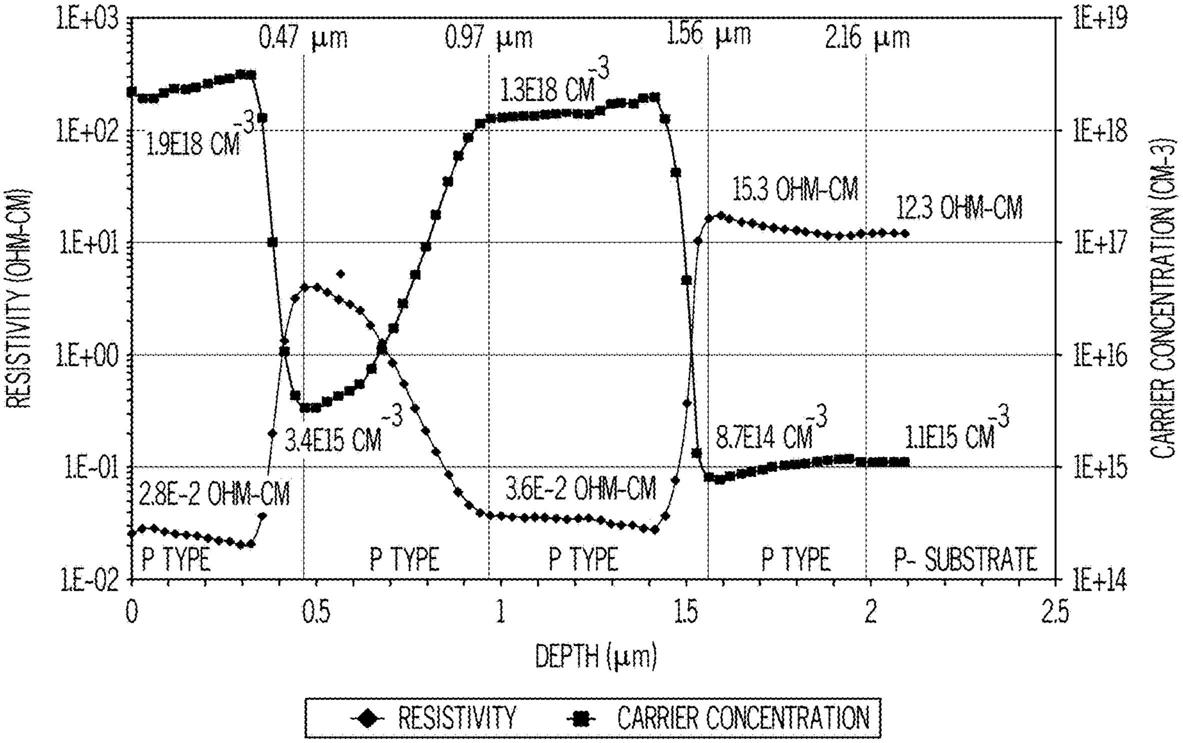
FIGS. 64A-64B illustrate the silicon superlattice etch with epitaxial silicon layers of alternating doping concentrations in accordance with an embodiment of the present invention.
Figure 64B:
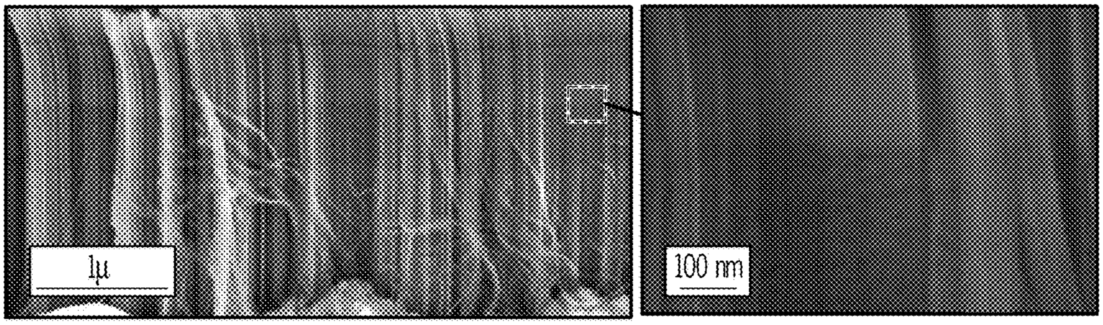

FIGS. 64A-64B illustrate the silicon superlattice etch with epitaxial Si layers of alternating doping concentrations in accordance with an embodiment of the present invention. FIG. 64A illustrates doping concentration profiles for custom epitaxial wafers from Lawrence Semiconductor Research Laboratory (LSRL) with P++/P doped alternating epitaxial silicon layers, showing shallow (>100 nm thick) transitions between high doping (~1E18 $cm^{-3}$) and low doping (~1E15 $cm^{-3}$). FIG. 64B illustrates the cross-section SEM of porous/non-porous interface made by MACE of differently doped epitaxial silicon layers.

With MACE of multilayer epitaxial layers, the etch is tuned to ensure that the morphology changes from porous to non-porous at a specific doping concentration, thereby changing the shallow doping concentration gradient into an abrupt step function of porous/non-porous interfaces. As MACE progresses through the epitaxial layers, the catalyst mesh etches the silicon stack to reveal high aspect ratio nanostructures with tuned porosity.

Thus, MACE can enable fabrication of ultra-high aspect ratio silicon nanostructures as well as nanostructures with porous silicon superlattices. Methods of preventing process excursions such as nanostructure collapse and catalyst wandering due to isolated features in the catalyst and nanostructure design are described. These methods can be incorporated into application-specific design algorithms to create a MACE-based design for manufacturing framework.

Figure 65A:
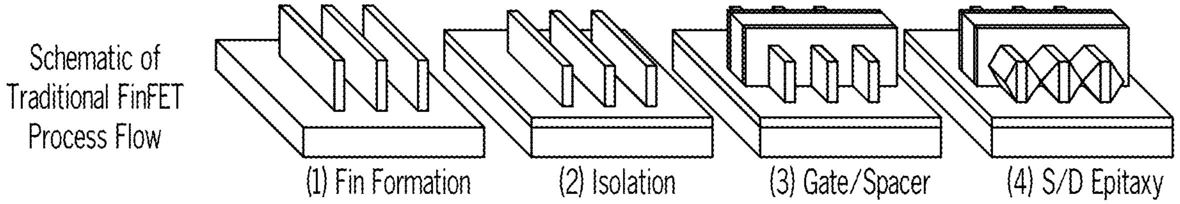
FIG. 65A is a schematic of traditional finFET fabrication flow showing the essential processes in accordance with an embodiment of the present invention.
Figure 65B:
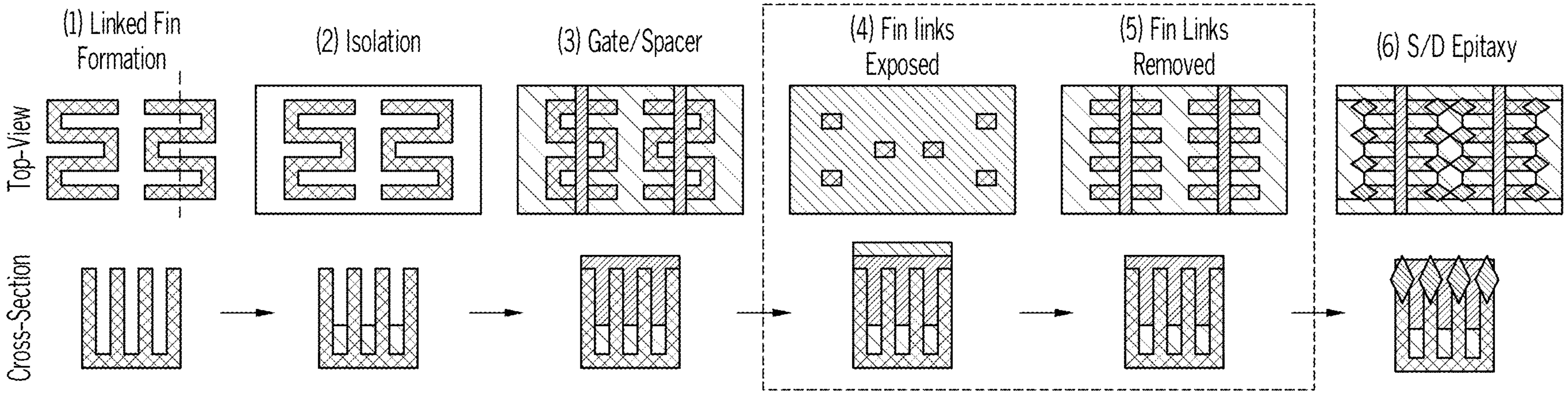
FIG. 65B is a modified finFET process flow where linked fins are formed to enable collapse-free ultrahigh aspect ratio fins in accordance with an embodiment of the present invention.

Integration schemes for exemplar finFETs are shown in FIGS. 65A-65B, where linked fins are etched with MACE to prevent fin collapse and catalyst wandering, thereby providing a new direction for transistor design with ultra-high aspect ratio fins.

FIG. 65A is a schematic of traditional finFET fabrication flow showing the essential processes in accordance with an embodiment of the present invention. FIG. 65B is a modified finFET process flow where linked fins are formed to enable collapse-free ultrahigh aspect ratio fins in accordance with an embodiment of the present invention. Steps (4-5) are added to the traditional finFET flow to remove fin links.

As a result of the foregoing, the principles of the present invention provide a means for utilizing the CICE process to effectively fabricate features in semiconductors using the equipment and process technologies for catalyst influenced chemical etching of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for preventing substantial collapse of high aspect ratio semiconducting structures by catalyst influenced chemical etching, the method comprising:

providing a semiconducting material;

patterning a catalyst layer on a surface of said semiconducting material, wherein said catalyst layer comprises a plurality of features, wherein unetched regions of a pattern adjacent to said plurality of features comprises collapse-avoiding features;

modifying catalytic activity of said patterned catalyst layer; and exposing said modified patterned catalyst layer and said collapse-avoiding features to an etchant, wherein said patterned catalyst layer and said etchant cause etching of said semiconducting material to form fabricated structures corresponding to said plurality of features, wherein said collapse-avoiding features prevent substantial collapse of etched semiconducting material.

2. A method for preventing substantial collapse of high aspect ratio nanostructures, the method comprising:

providing a substrate with material to be etched;

providing a patterned etch mask on said substrate; and etching said material to be etched using said patterned etch mask, wherein a portion of said patterned etch mask prevents substantial collapse of said etched material;

wherein said etching is performed using catalyst influenced chemical etching using an activity-modified catalyst layer deposited on top of said patterned etch mask.

3. A method for preventing substantial collapse of high aspect ratio nanostructures, the method comprising:

providing high aspect ratio nanostructures with collapse-avoiding caps;

depositing stabilizing material around a portion of said high aspect ratio nanostructures to bond with said collapse-avoiding caps forming a continuous ceiling of stabilizing material regions; and removing said collapse-avoiding caps from regions other than said stabilizing material regions to expose said high aspect ratio nanostructures while said continuous ceiling remains supported by said stabilizing material regions.

4. A method for preventing substantial collapse of high aspect ratio nanostructures, the method comprising:

providing high aspect ratio nanostructures with collapse-avoiding caps; and bonding a pre-formed cover plate to said collapse-avoiding caps to create a continuous ceiling spanning across and supported by said high aspect ratio nanostructures, wherein said continuous ceiling and said high aspect ratio nanostructures define a plurality of enclosed or partially enclosed internal volumes.

* * * * *